US008962376B2

(12) United States Patent
Atanackovic et al.

(10) Patent No.: US 8,962,376 B2
(45) Date of Patent: Feb. 24, 2015

(54) OPTOELECTRONIC DEVICE WITH LATERAL PIN OR PIN JUNCTION

(75) Inventors: Petar Branko Atanackovic, Henley Beach (AU); Steven Grant Duvall, Milsons Point (AU)

(73) Assignee: The Silanna Group Pty Ltd, Eight Mile Plains, Queensland (AU)

( * ) Notice: Subject to any disclaimer, the term of this patent is extended or adjusted under 35 U.S.C. 154(b) by 398 days.

(21) Appl. No.: 13/265,850

(22) PCT Filed: Apr. 21, 2010

(86) PCT No.: PCT/AU2010/000453
§ 371 (c)(1),
(2), (4) Date: Nov. 14, 2011

(87) PCT Pub. No.: WO2010/121309
PCT Pub. Date: Oct. 28, 2010

(65) Prior Publication Data
US 2012/0049242 A1    Mar. 1, 2012

Related U.S. Application Data

(60) Provisional application No. 61/214,305, filed on Apr. 21, 2009, provisional application No. 61/218,862, filed on Jun. 19, 2009.

(51) Int. Cl.
| | |
|---|---|
| *H01L 21/00* | (2006.01) |
| *H01L 31/0224* | (2006.01) |
| *H01L 31/042* | (2014.01) |
| *H01L 31/028* | (2006.01) |
| *H01L 27/142* | (2014.01) |

(Continued)

(52) U.S. Cl.
CPC ...... *H01L 31/022441* (2013.01); *H01L 31/042* (2013.01); *H01L 31/028* (2013.01);

(Continued)

(58) Field of Classification Search
CPC . H01L 31/1804; H01L 31/028; H01L 31/075; H01L 31/035272; H01L 31/042
USPC .......... 257/184, 431, 458, 461, 465, E31.011, 257/E31.093; 438/73
See application file for complete search history.

(56) References Cited

U.S. PATENT DOCUMENTS 4,177,084 A * 12/1979 Lau et al. .......................... 117/8
4,509,990 A *  4/1985 Vasudev ....................... 438/155

(Continued)

FOREIGN PATENT DOCUMENTS

JP         05-175536 A      7/1993

OTHER PUBLICATIONS

International Search Report for PCT/AU2010/000453 dated Jun. 16, 2010.

*Primary Examiner* — Joseph C Nicely
(74) *Attorney, Agent, or Firm* — Nixon Peabody LLP; Joseph Bach, Esq.

(57) ABSTRACT

An optoelectronic device, including a semiconductor body having a surface to receive photons and a plurality of doped regions of opposite doping polarities, the doped regions extending substantially from the surface of the semiconductor body and into the semiconductor body, and being arranged in one or more pairs of opposite doping polarities such that each pair of doped regions forms a corresponding space charge region having a corresponding electric field therein, the space charge region extending substantially from the surface of the semiconductor body and into the semiconductor body such that photons entering the semiconductor body through the surface and travelling along paths within the space charge region generate electron-hole pairs in the space charge region that are separated in opposing directions substantially orthogonal to the photon paths by the electric field and collected by the corresponding pair of doped regions, thereby providing an electrical current to be conducted from the device.

31 Claims, 62 Drawing Sheets

(51) Int. Cl.
*H01L 31/052* (2014.01)
*H01L 31/068* (2012.01)
*H01L 31/075* (2012.01)
*H01L 31/18* (2006.01)

(52) U.S. Cl.
CPC ........ *H01L27/1428* (2013.01); *H01L 31/0527* (2013.01); *H01L 31/0682* (2013.01); *H01L 31/075* (2013.01); *H01L 31/1804* (2013.01); *Y02E 10/548* (2013.01); *Y02E 10/52* (2013.01); *Y02E 10/547* (2013.01)
USPC ............. 438/73; 257/184; 257/431; 257/461; 257/E31.093

(56) References Cited

U.S. PATENT DOCUMENTS

| | | | | |
|---|---|---|---|---|
| H948 H | * | 8/1991 | Aklufi | 428/448 |
| 5,600,169 A | * | 2/1997 | Burgener et al. | 257/352 |
| 5,735,949 A | * | 4/1998 | Mantl et al. | 117/8 |
| 6,168,968 B1 | * | 1/2001 | Umemoto et al. | 438/96 |
| 6,538,299 B1 | * | 3/2003 | Kwark et al. | 257/458 |
| 6,583,445 B1 | * | 6/2003 | Reedy et al. | 257/82 |
| 6,954,235 B1 | * | 10/2005 | Russell et al. | 349/38 |
| 7,799,651 B2 | * | 9/2010 | Mazure et al. | 438/311 |
| 2007/0105335 A1 | * | 5/2007 | Fitzgerald | 438/405 |
| 2008/0078444 A1 | * | 4/2008 | Atanackovic | 136/256 |
| 2008/0237763 A1 | * | 10/2008 | Miura et al. | 257/432 |
| 2009/0038669 A1 | * | 2/2009 | Atanackovic | 136/244 |
| 2009/0124065 A1 | * | 5/2009 | England et al. | 438/486 |
| 2009/0183774 A1 | * | 7/2009 | Atanackovic | 136/261 |
| 2009/0200631 A1 | * | 8/2009 | Tai et al. | 257/435 |
| 2009/0242935 A1 | * | 10/2009 | Fitzgerald | 257/187 |
| 2009/0309132 A1 | * | 12/2009 | Cai | 257/147 |
| 2010/0102204 A1 | * | 4/2010 | Hoffman | 250/208.1 |
| 2011/0039034 A1 | * | 2/2011 | Maynard et al. | 427/527 |
| 2011/0042769 A1 | * | 2/2011 | Miura et al. | 257/432 |
| 2011/0309410 A1 | * | 12/2011 | Maimon | 257/184 |
| 2012/0012166 A1 | * | 1/2012 | Atanackovic | 136/252 |

* cited by examiner

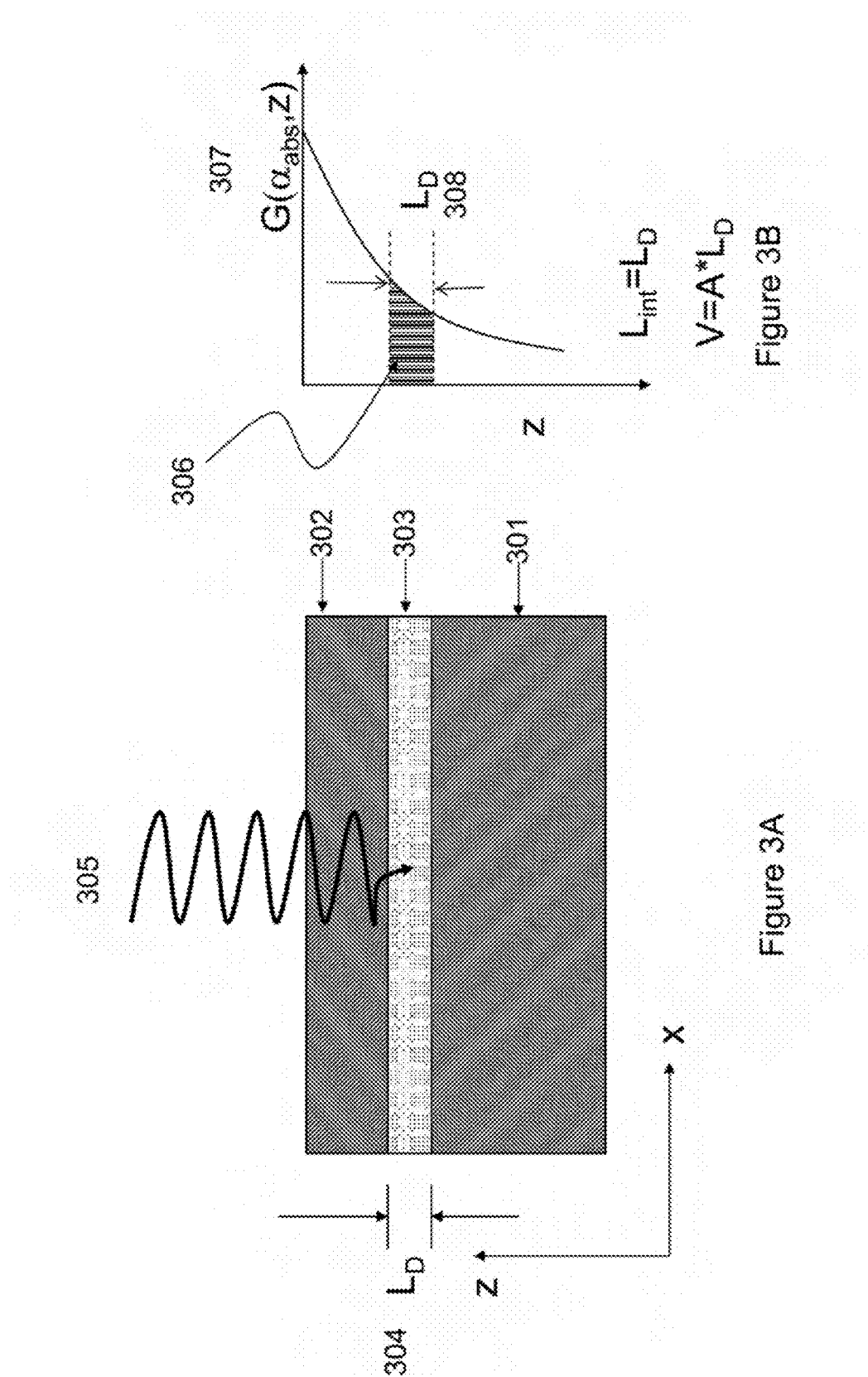

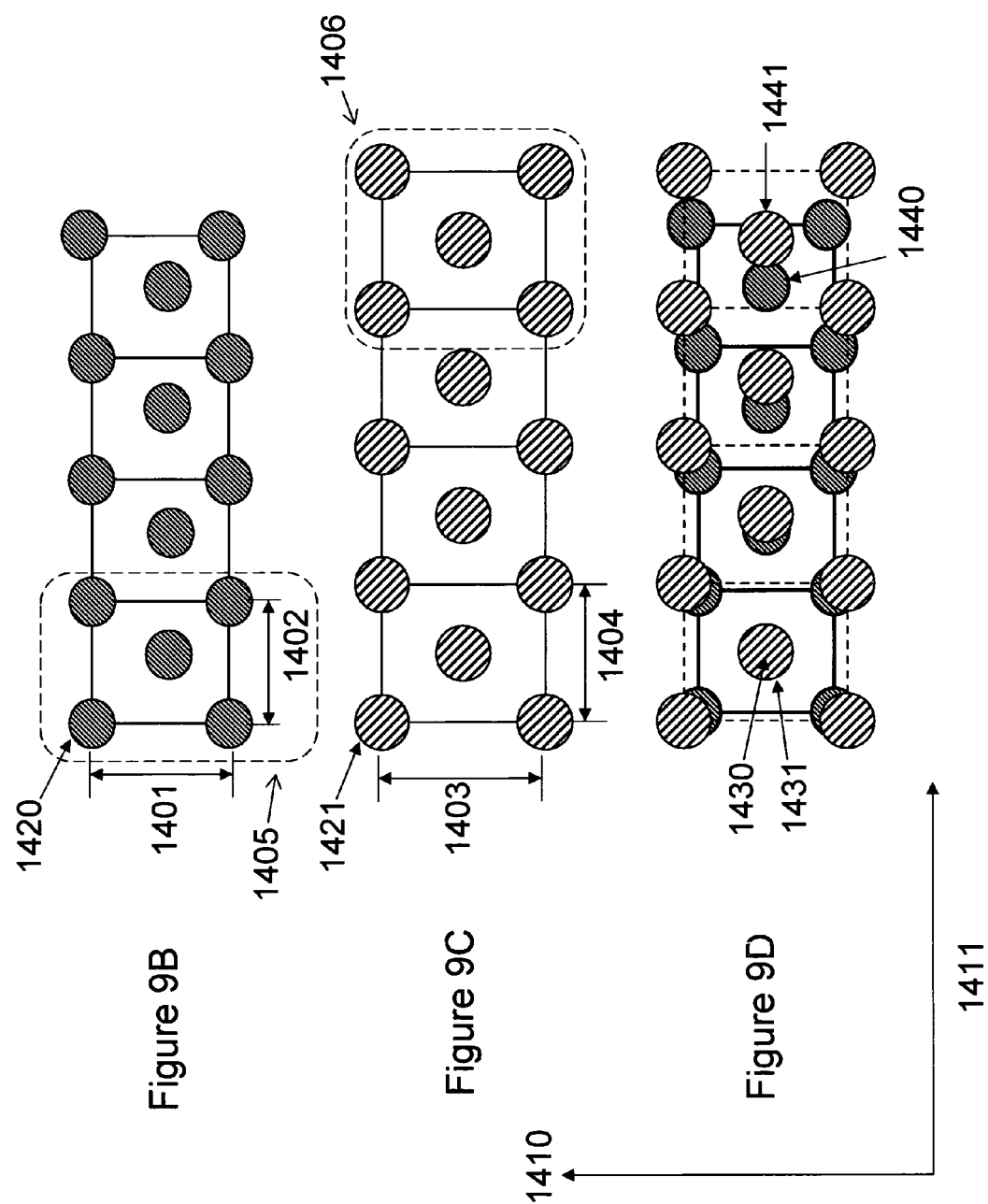

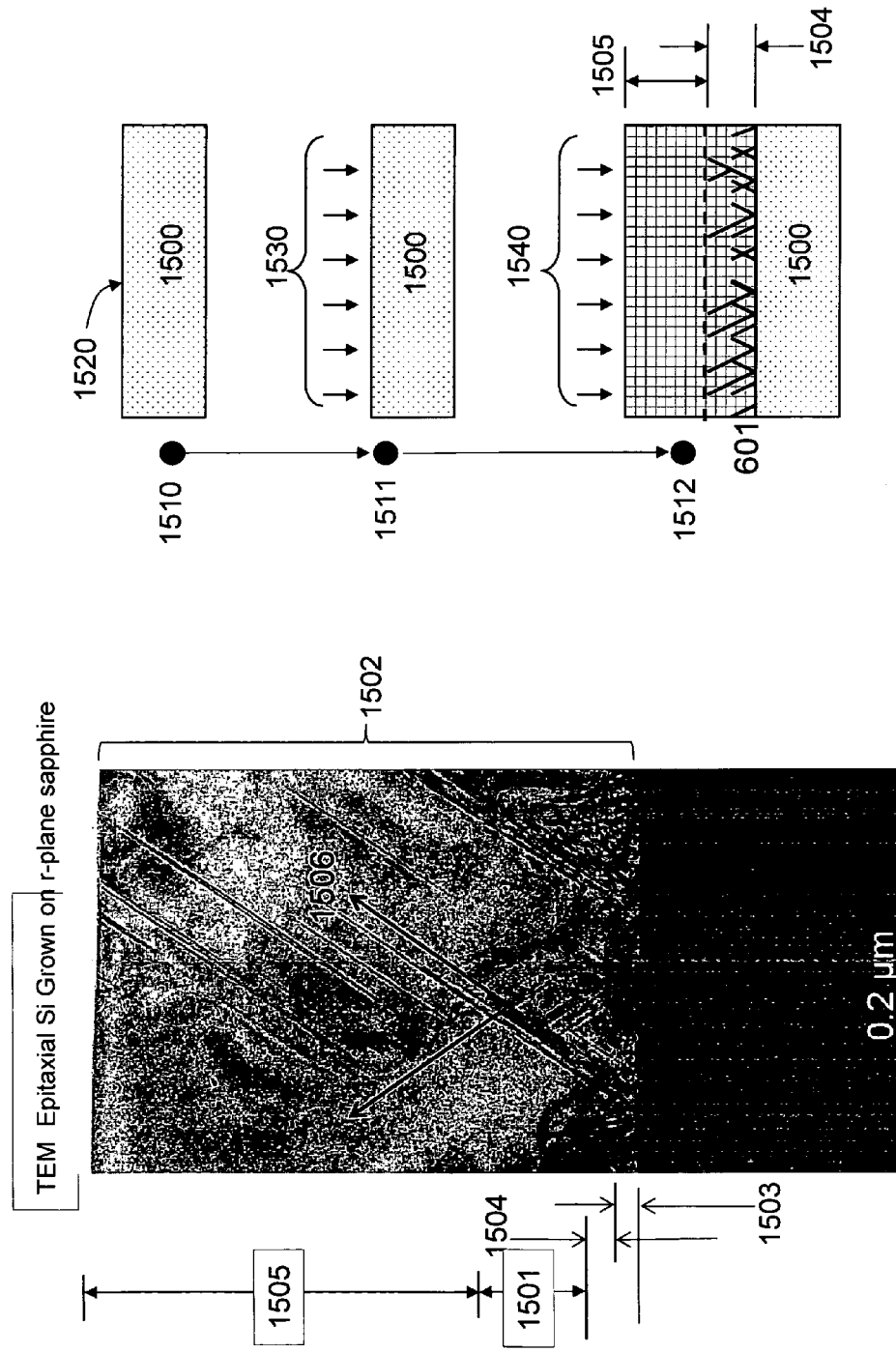

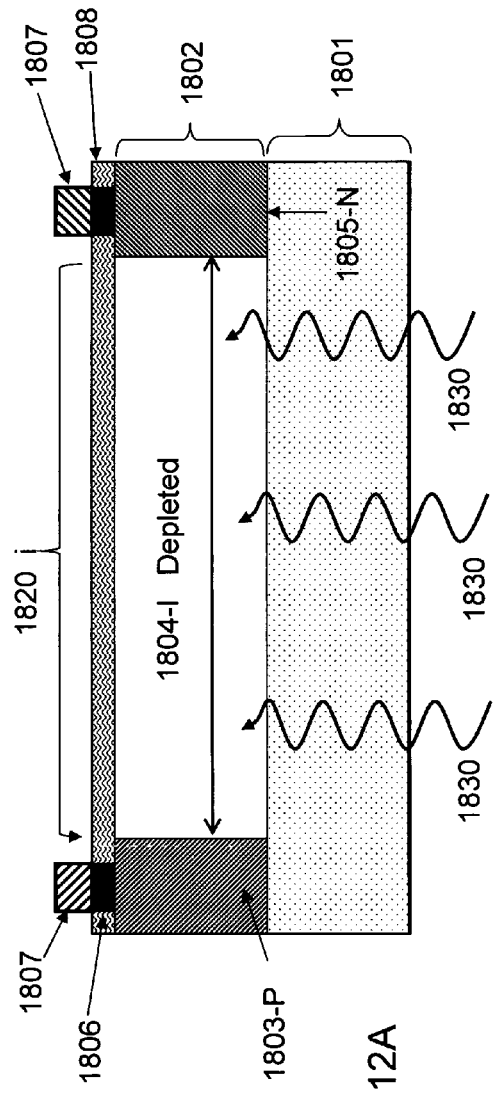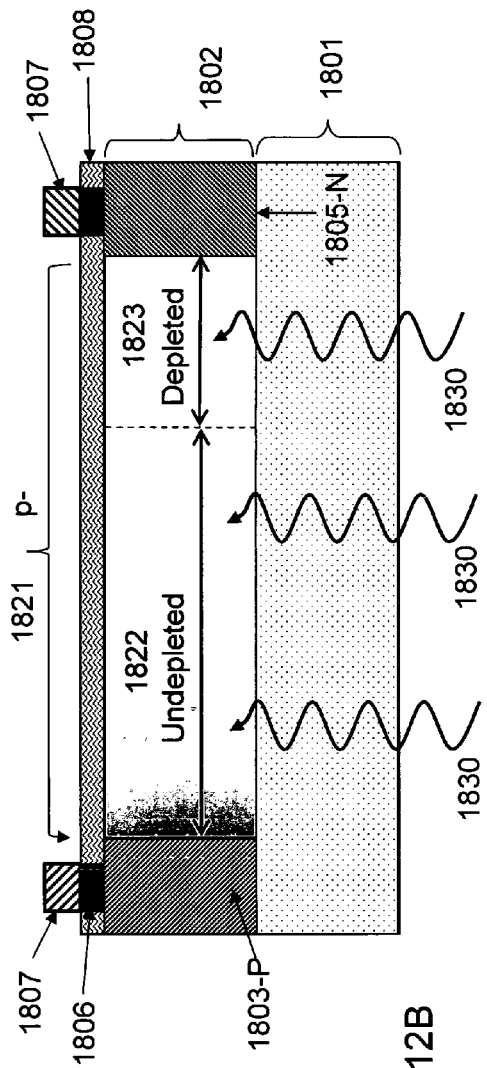
Figure 12A
Figure 12B

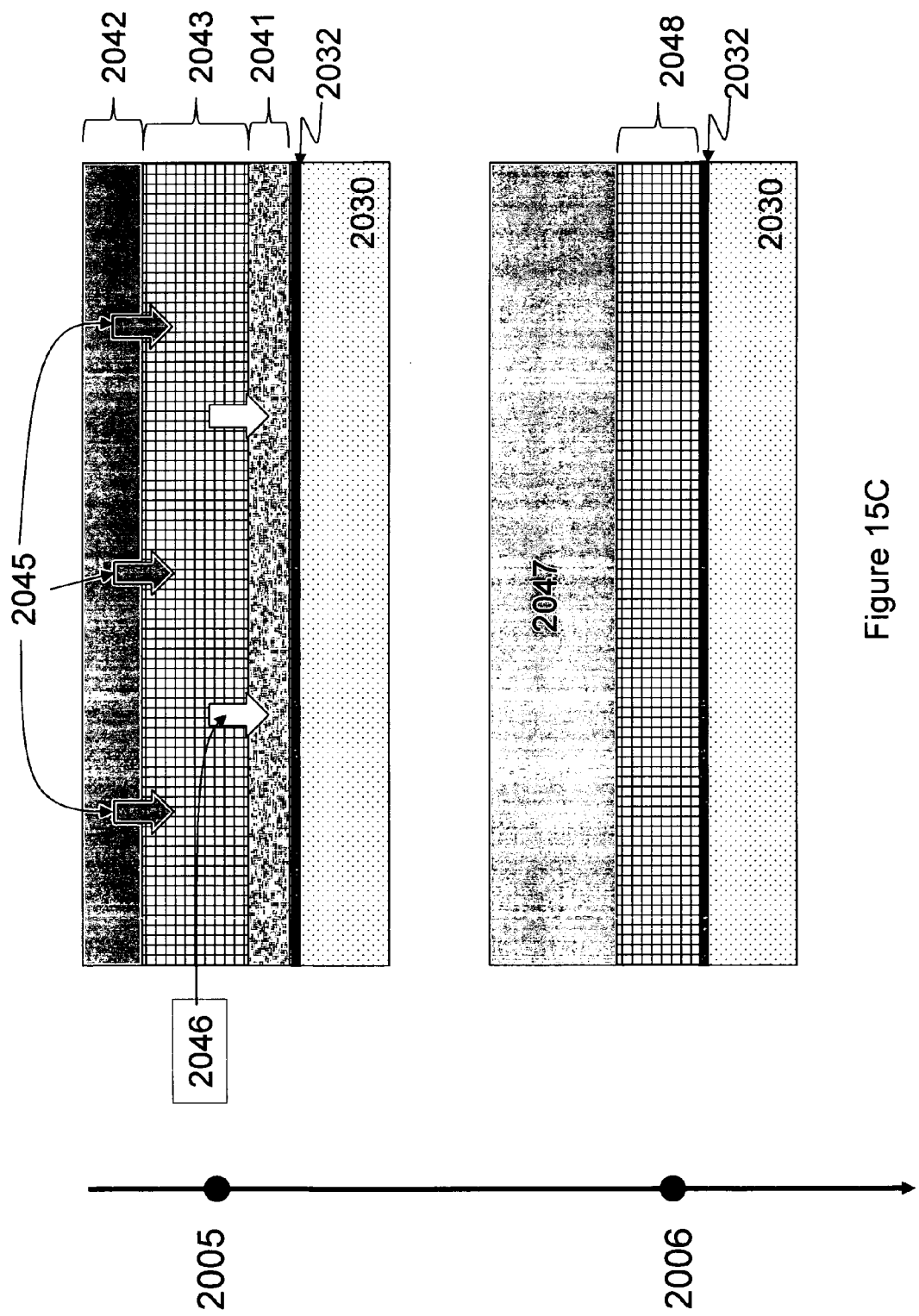

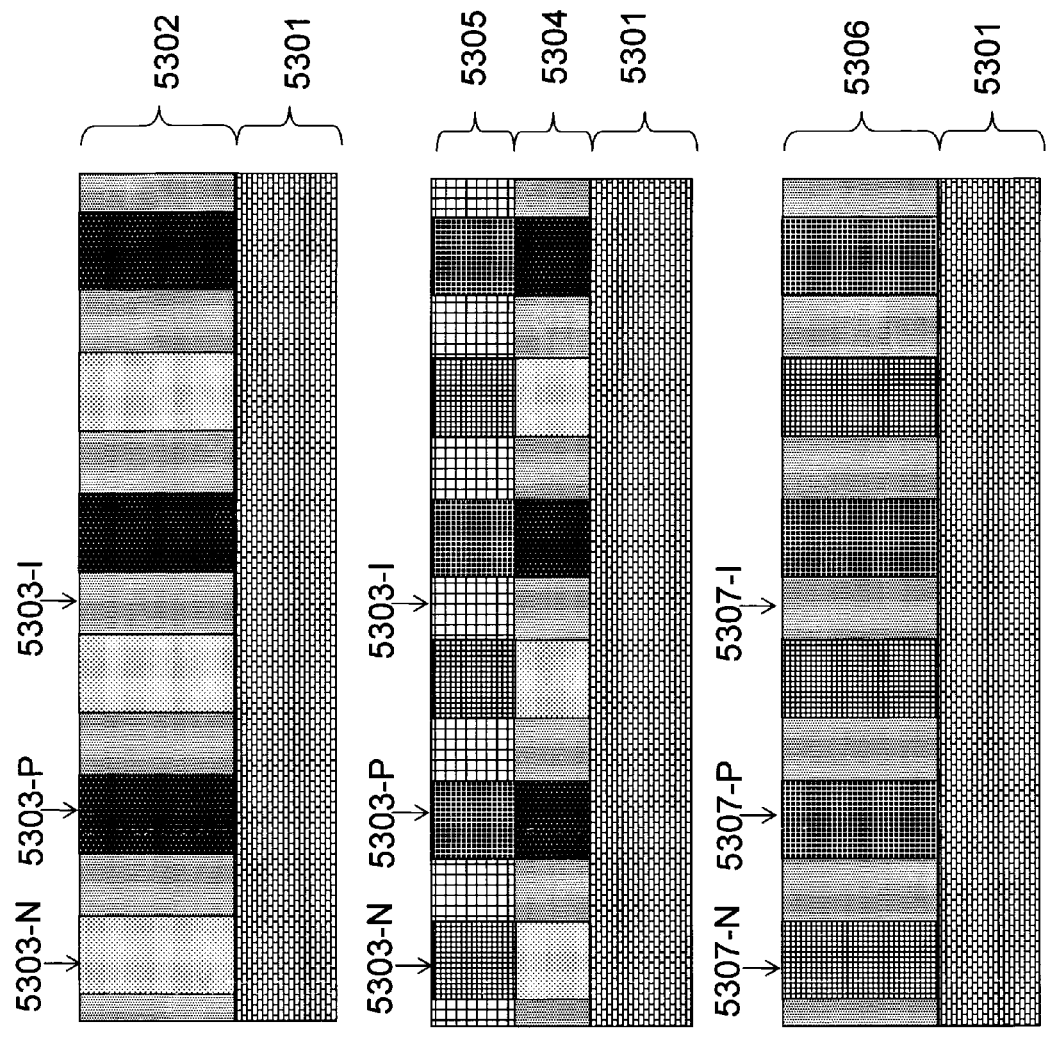

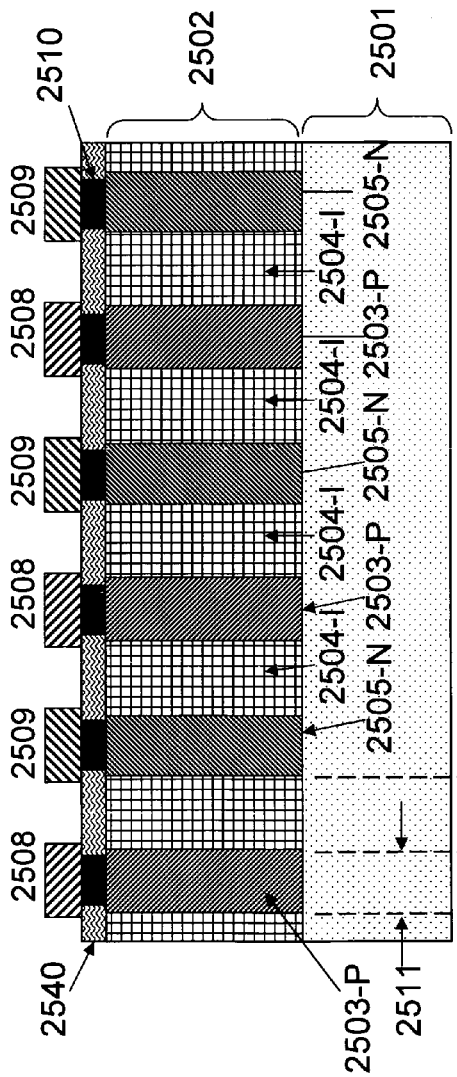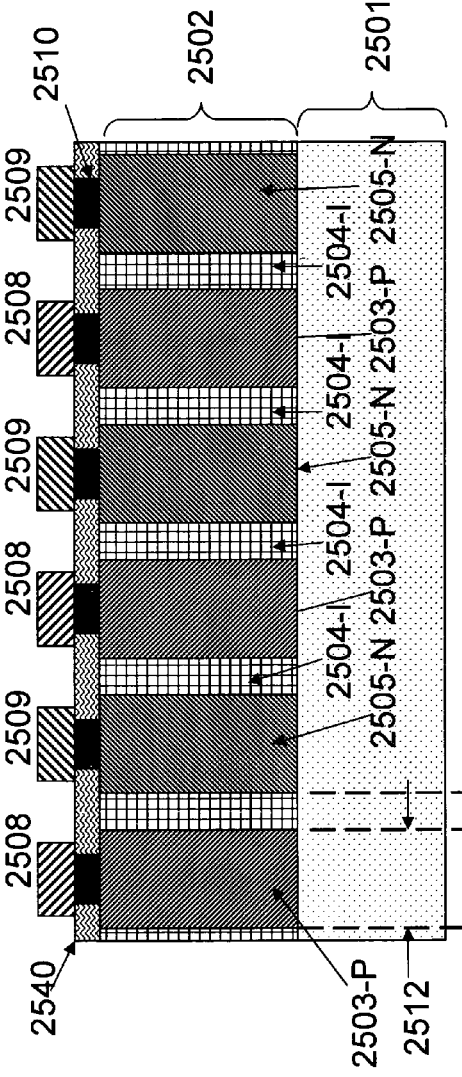
Figure 20A
Figure 20B

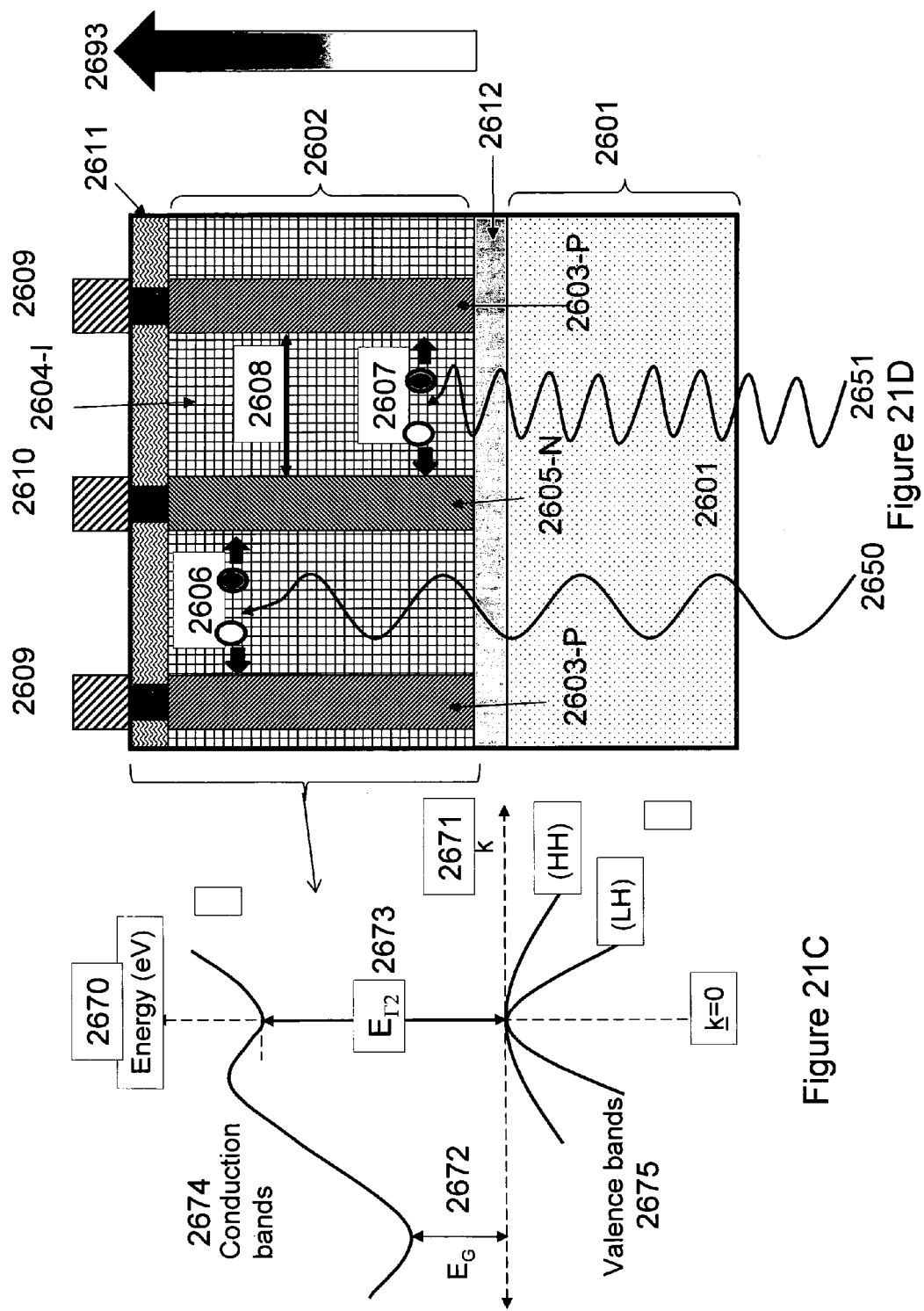

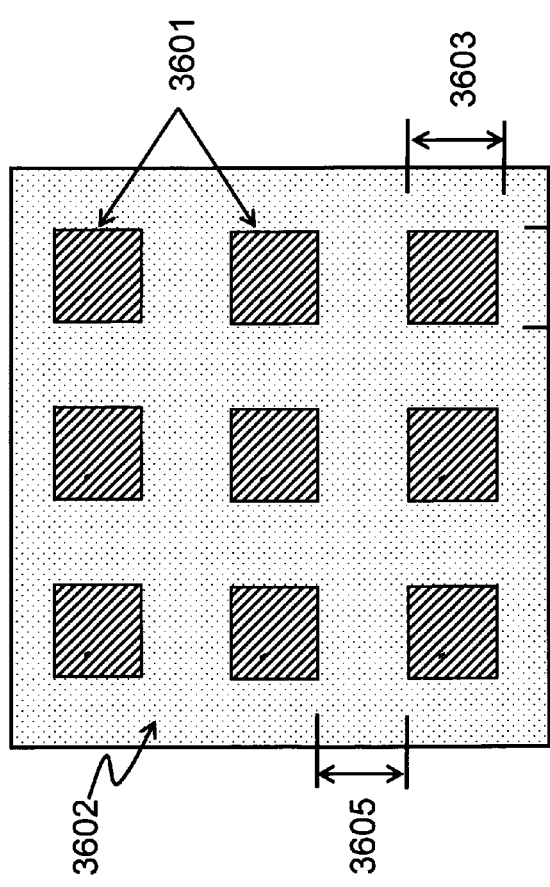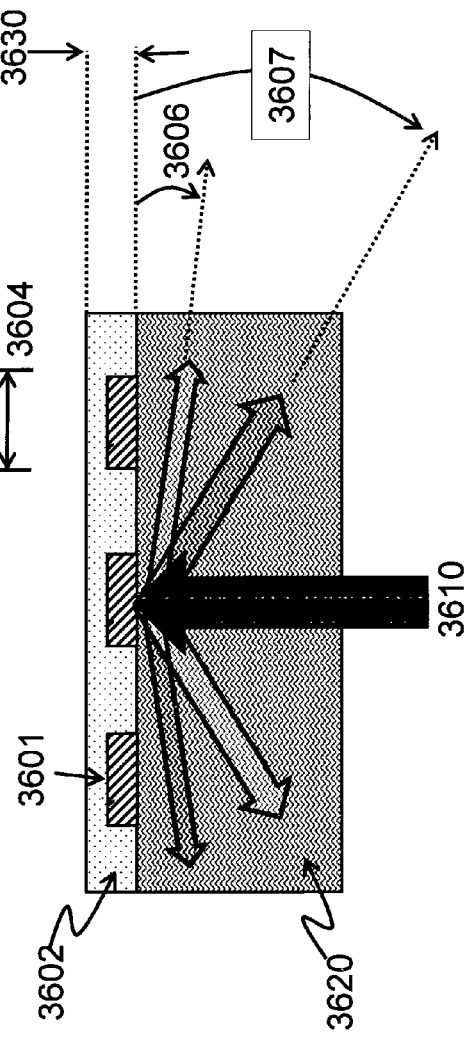
Figure 27A
Figure 27B

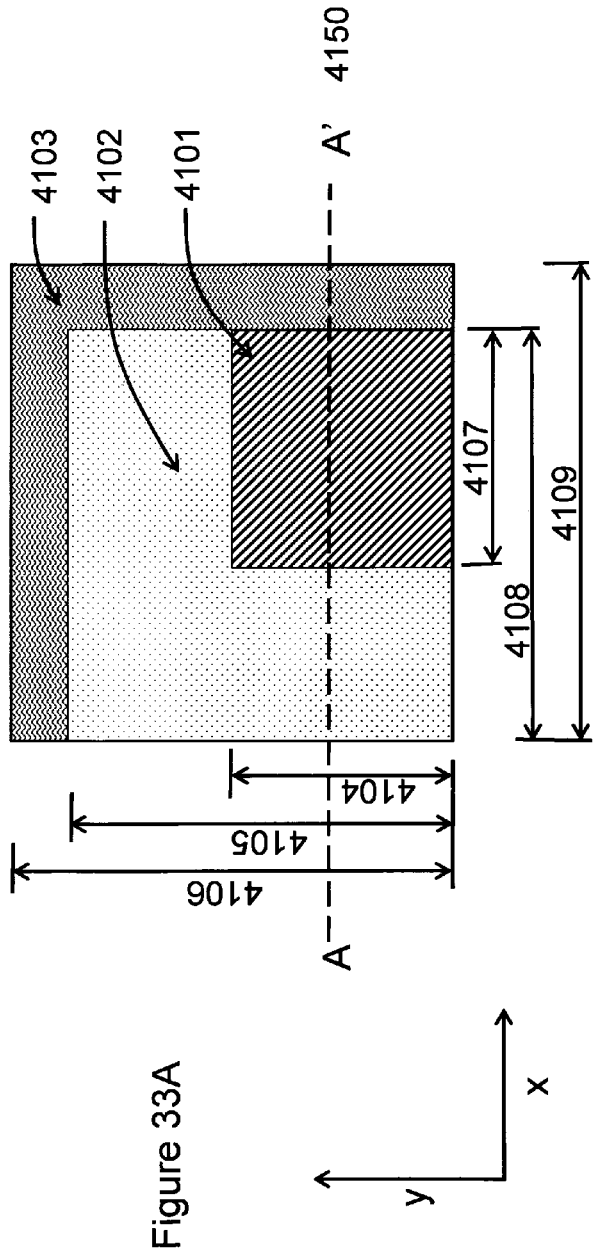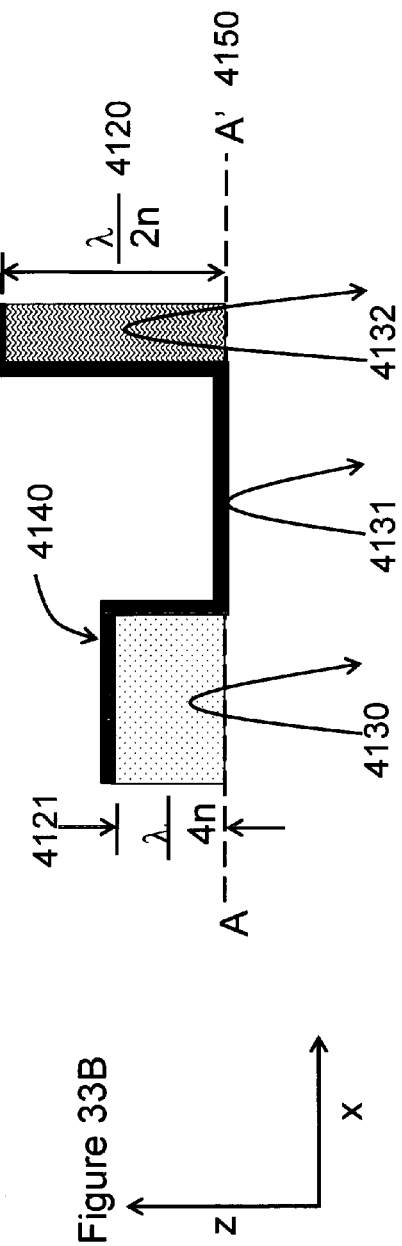
Figure 33A
Figure 33B

Fully-Depleted Si-on-Sapphire lateral *p-i-n* photovoltaic interdigitated cells

OPTOELECTRONIC DEVICE WITH LATERAL PIN OR PIN JUNCTION

CROSS-REFERENCE TO RELATED APPLICATIONS

This application is a National Phase of International Application No. PCT/AU2010/000453, which was filed on Apr. 21, 2010, and which claims priority to and the benefit of U.S. Provisional Application No. 61/214,305, filed on Apr. 21, 2009, and U.S. Provisional Application No. 61/218,862, filed on Jun. 19, 2009, and the disclosures of which are hereby incorporated herein by reference in their entireties.

TECHNICAL FIELD

The present invention relates to optoelectronic devices and processes for manufacturing optoelectronic devices, including semiconductor devices suitable for electronic and optoelectronic applications, photodiodes, and photonic energy conversion devices, including photovoltaic or solar cell devices.

BACKGROUND

Recently, it has become generally accepted that the non-renewable energy resources of our planet are becoming exhausted. In particular, the term 'peak oil' is now commonly used as shorthand to represent the observation that global oil production has already peaked and is now in decline, while the global demand for energy continues to grow. Moreover, scientific and popular debate about the existence and extent of climate change caused by human activities (also referred to as 'global warming') has become largely settled, bolstered by unprecedented changes and extremes in both global and local climactic conditions, with often disastrous consequences for humans and other living species, including great loss of life in many instances.

The general acceptance of global warming as a threat to our quality of, life and perhaps even our very existence has greatly intensified the search for renewable energy sources with low or zero emissions of greenhouse gases (often referred to for convenience as 'low carbon' or 'non-carbon-based' energy resources). Of the many different forms of renewable energy available, many consider that solar energy holds the greatest hope. For example, simple calculations indicate that the solar energy impinging upon even a relatively small area of unoccupied land in Australia is equal to the world's current energy needs, suggesting that photovoltaic energy conversion devices may be the best way to generate electrical power for the foreseeable future whilst minimising further contributions to global warming.

These considerations have given rise to an intense focus on research and development of photovoltaic devices globally. Although photovoltaic devices per se are far from new and have been commercially available for many decades, the major barrier that has prevented their uptake on a large scale has been their substantial cost relative to conventional non-renewable sources of energy, and in particular to fossil fuels such as coal, oil, and gas. Consequently, a major goal of current research efforts in photovoltaics is to produce low cost, high efficiency photovoltaic devices that can generate electrical energy at an overall cost (per Watt) that is equal to or less than the cost of energy produced from non-renewable energy sources, the situation of equal cost being referred to as 'grid parity'.

To this end, a wide range of new photovoltaic devices are being developed, based on a wide range of materials, including not only elemental and compound semiconductors (predominantly amorphous, multi-crystalline, and micro-crystalline silicon), but also polymers, and photo-sensitive dyes. However, a dominant theme of these efforts is to simplify and refine the manufacturing process as far as possible to minimise the total cost per device, a strategy that has been extremely successful for the US-based company First Solar, Inc., whose business model is now being widely copied by other manufacturers. Thus large-scale, simple manufacturing processes are widely accepted as the solution to the global need for low-cost renewable energy with minimal generation of greenhouse gases.

It is desired to provide an optoelectronic device and an optoelectronic device manufacturing process that alleviate one or more difficulties of the prior art, or that at least provide a useful alternative.

SUMMARY

In accordance with the present invention, there is provided an optoelectronic device, including a semiconductor body having a surface to receive photons and a plurality of doped regions of opposite doping polarities, the doped regions extending substantially from the surface of the semiconductor body and into the semiconductor body, and being arranged in one or more pairs of opposite doping polarities such that each pair of doped regions forms a corresponding space charge region having a corresponding electric field therein, the space charge region extending substantially from the surface of the semiconductor body and into the semiconductor body such that photons entering the semiconductor body through the surface and travelling along paths within the space charge region generate electron-hole pairs in the space charge region that are separated in opposing directions substantially orthogonal to the photon paths by the electric field and collected by the corresponding pair of doped regions, thereby providing an electrical current to be conducted from the device.

Also described herein is a photovoltaic device, including a semiconductor body having a surface to receive photons and a plurality of doped regions of opposite doping polarities, the doped regions extending substantially from the surface of the semiconductor and into the semiconductor body, and being arranged in one or more pairs of opposite doping polarities such that each pair of doped regions forms a corresponding space charge region having a corresponding electric field therein, the space charge region extending substantially from the surface of the semiconductor body and into the semiconductor body such that electron-hole pairs created substantially at the surface of the semiconductor body by photons entering the space charge region are separated in opposing directions by the electric field and collected by the corresponding pair of doped regions, thereby providing an electrical current to be conducted from the device.

The space charge region may extend substantially from the surface of the semiconductor body through the semiconductor body such that electron-hole pairs created at the surface and throughout the semiconductor body by photons entering the space charge region are separated in opposing directions by the electric field and collected by the corresponding pair of doped regions, thereby providing an electrical current to be conducted from the device.

The doped regions may extend substantially from the surface of the semiconductor body into the semiconductor body along a direction such that the space charge region also extends substantially from the surface of the semiconductor body into the semiconductor body along said direction and to a depth such that a substantial portion of the electron-hole pairs created in the semiconductor body by absorption of photons entering the space charge region along paths substantially parallel to the direction are collected and contribute to the electrical current to be conducted from the device. A substantial majority or even substantially all of the electron-hole pairs created in the space charge region can be collected and contribute to the electrical current.

The doped regions may extend completely through the semiconductor body so that substantially all of the electron-hole pairs created in the semiconductor body by photons entering the space charge region along paths substantially parallel to the direction are collected and contribute to the electrical current to be conducted from the device.

The photovoltaic device may be provided with one or more optical trapping mechanisms to enable a substantial majority or even substantially all of the photons entering the space charge region to be absorbed and create electron-hole pairs.

The semiconductor body may be in the form of a thin film, the direction along which the doped regions extend into the semiconductor body being substantially orthogonal to the plane of the thin film.

The semiconductor body may be in the form of a thin film of silicon. The thin film of silicon may be single-crystal, poly-crystalline, amorphous, or a combination of these forms. The thin film of silicon may be attached to an optically transparent and electrically insulating substrate and configured so that the photons pass through the substrate to enter the thin film of silicon.

Each space charge region may be formed by substantially abutting p-type and n-type doped regions, or intrinsic or nominally intrinsic regions may be disposed between respective pairs of p-type and n-type doped regions.

The optically transparent substrate may be a glass, quartz, or sapphire substrate.

The semiconductor body may be in the form of a thin film of single crystal silicon.

The thin film of single crystal silicon may be epitaxially grown on the sapphire substrate.

Alternatively, the semiconductor body may be in the form of a thin film of poly-crystalline silicon.

The thin film of poly-crystalline silicon may be deposited on the substrate and annealed.

Alternatively, the semiconductor body may be in the form of a thin film of amorphous silicon.

The thin film of amorphous silicon may be formed by ion implantation into a thin film of single-crystal or poly-crystalline silicon.

Alternatively, the semiconductor body may be in the form of a thin film of silicon substantially consisting of amorphous and poly-crystalline regions.

Alternatively, the semiconductor body may be in the form of a thin film of silicon consisting of amorphous and single crystal regions.

The amorphous regions may be formed by ion implantation into a thin film of poly-crystalline or single-crystal silicon.

The thin film may have a thickness between about 100 nm and 100 µm.

Also described herein is a photovoltaic device, including a semiconductor body having a surface to receive photons and a plurality of substantially parallel doped regions of opposite doping polarities, the doped regions extending substantially from the surface of the semiconductor into the semiconductor body along a direction substantially orthogonal to the surface, and being arranged in one or more pairs of opposite doping polarities such that each pair of doped regions forms a corresponding space charge region having a corresponding electric field directed across the space charge region along a direction substantially parallel to the surface of the semiconductor body, the space charge region extending substantially from the surface of the semiconductor body and into the semiconductor body to a distance such that a majority of the electron-hole pairs created in the semiconductor body by photons entering the space charge region along paths substantially orthogonal to the surface of the semiconductor body are separated in opposing directions substantially orthogonal to the paths of the photons by the electric field and collected by the corresponding pair of doped regions, thereby providing an electrical current to be conducted from the device.

The substantial majority of the electron-hole pairs may be collected and contribute to the photocurrent generated by the device.

Substantially the entirety of the electron-hole pairs may be collected and contribute to the photocurrent generated by the device.

The semiconductor body may be in the form of a thin film.

The semiconductor body may be in the form of a thin film attached to a substrate.

The semiconductor body may be in the form of a thin film attached to an optically transparent substrate, the device being configured such that the photons travel through the optically transparent substrate to reach the surface of the semiconductor body.

The optically transparent substrate may be electrically insulating.

The optically transparent substrate may be a glass, quartz, or sapphire substrate.

The semiconductor body may be in the form of a thin film of single crystal silicon.

The thin film of single crystal silicon may be epitaxially grown on the sapphire substrate.

Alternatively, the semiconductor body may be in the form of a thin film of poly-crystalline silicon.

The thin film of poly-crystalline silicon may be deposited on the substrate and annealed Alternatively, the semiconductor body may be in the form of a thin film of amorphous silicon.

The thin film of amorphous silicon may be formed by ion implantation into a thin film of single-crystal or polycrystalline silicon.

Alternatively, the semiconductor body may be in the form of a thin film of silicon consisting of amorphous and poly-crystalline regions.

Alternatively, the semiconductor body may be in the form of a thin film of silicon consisting of amorphous and single crystal regions.

Alternatively, the semiconductor body may be in the form of a thin film of silicon consisting of amorphous, poly-crystalline, and single crystal regions.

The amorphous regions may be formed by ion implantation into a thin film of poly-crystalline or single-crystal silicon.

Each space charge region may be formed by substantially abutting p-type and n-type doped regions, or an intrinsic or nominally intrinsic region may be disposed between each pair of p-type and n-type doped regions. The intrinsic or nominally intrinsic region may be amorphous and the doped regions may be crystalline. Alternatively, the intrinsic or nominally intrinsic region may be amorphous near the surface to capture high energy photons and crystalline at greater depths.

The doped regions may have widths that are substantially less than the diffusion lengths of charge carriers so that charge carriers generated in the doped regions can diffuse to the intrinsic or nominally intrinsic region to be collected.

The doped regions may be configured as interdigitated fingers with the intrinsic or nominally intrinsic regions disposed between the doped fingers. The doped regions may be configured as one or more hierarchies of interdigitated finger structures. The doped regions may be configured as two-dimensional fractal patterns.

Alternatively, the doped regions of opposite polarities may be localised in plan view at the nodes of two two-dimensional arrays being offset relative to one another so that the localised doped regions of one polarity can be contacted with a first set of linear parallel contacts and the localised doped regions of the opposite polarity can be contacted with a second set of linear parallel contacts, wherein the contacts of the first set are interleaved between the contacts of the second set.

The doped regions may be arranged in plan view as a two-dimensional array of mutually spaced doped regions of opposite doping polarities, wherein the doped regions of the array along each row or column of the array are of a corresponding doping polarity, consecutive rows or columns of the array are of alternating doping polarities, and the doped regions of the array along each diagonal of the array are of alternating doping polarities.

The doped regions may be arranged in plan view as a two-dimensional array of mutually spaced doped regions, the array including:
  a first two-dimensional array of mutually spaced doped regions of a first polarity; a second two-dimensional array of mutually spaced doped regions of a second polarity opposite to the first polarity;
  wherein the doped regions of the second polarity are at locations intermediate to corresponding locations of the doped regions of the first polarity.

The device may further include a contact structure including interdigitated elongate contacts providing electrical contacts to the doped regions of the first and second polarities, the elongate interdigitated contacts including a first set of interconnected parallel elongate contacts providing electrical contacts to the doped regions of the first polarity, and a second set of interconnected parallel elongate contacts providing electrical contacts to the doped regions of the second polarity.

Each of the doped regions of the first and second polarities may be square.

Alternatively, each of the doped regions of the first and second polarities may be rectangular. The longer of the sides of each rectangular doped region may be parallel with the longitudinal axis of the corresponding elongate contact to provide a larger contact area and thereby a lower series resistance, whilst allowing close spacing of the parallel elongate contacts.

Alternatively, each of the doped regions of the first polarity may be rectangular, and each of the doped regions of the second polarity may be cross-shaped.

Alternatively, each of the doped regions of the first and second polarities may be cross-shaped.

Also described herein is a photovoltaic device, including a semiconductor body having a surface to receive photons and one or more substantially parallel doped regions of opposite doping polarities, the doped regions extending substantially from the surface of the semiconductor body into the semiconductor body along a direction substantially parallel to the paths of the received photons, and being arranged in one or more pairs of opposite doping polarities such that each pair of doped regions forms a corresponding space charge region having a corresponding electric field directed across the space charge region along a direction substantially orthogonal to the direction of photon travel, the space charge region extending substantially from the surface of the semiconductor body and into the semiconductor body to a distance such that a majority of the electron-hole pairs created in the semiconductor body by photons entering the space charge region are separated in opposing directions substantially orthogonal to the paths of the photons by the electric field and collected by the corresponding pair of doped regions, thereby providing an electrical current to be conducted from the device.

Also described herein is an optoelectronic device including a semiconductor body in which elongate space charge regions are formed between corresponding pairs of doped regions, wherein a longitudinal axis of each space charge region is substantially aligned with propagation directions of photons incident upon a photon-receiving surface the device so that the photons travel along the space charge regions and generate charge carriers therein. Each space charge regions may extend substantially to the photon-receiving surface of the semiconductor body. Each space charge regions may be in the form of a plane or sheet, wherein the photons travel along the plane rather than across it. The plane or sheet may extend substantially through the semiconductor body. The doped regions may be substantially thinner than diffusion lengths of charge carriers in the doped regions, so that a majority of charge carriers generated in the doped regions can diffuse to the space charge regions to be collected and contribute to the device current.

Also described herein is a photovoltaic device, including an optically transparent and electrically insulating substrate having a thin film of semiconductor attached thereto, the device being configured to generate electrical current from photons that travel through the optically transparent substrate and a first surface of the semiconductor thin film to generate electron-hole pairs in space charge regions within the semiconductor, the electron-hole pairs being separated in opposite directions to corresponding doped regions within the semiconductor, the electrical current being conducted from the doped regions to electrical contacts disposed on one or more surfaces of the semiconductor thin film other than the first surface.

The optically transparent and electrically insulating substrate may be a single-crystal substrate. The thin film of semiconductor may be epitaxially grown on the single-crystal substrate. Alternatively, the thin film may be deposited on the substrate. The substrate may be sapphire and the semiconductor may be silicon.

The device may be configured so that at least a portion of each space charge region is disposed substantially at the first surface of the semiconductor thin film to enable electron-hole pairs generated substantially at the first surface to be collected and form part of the electrical current.

The present invention also provides an optoelectronic device manufacturing process, including:
  forming a plurality of doped regions of opposite doping polarities in a semiconductor body, the doped regions extending substantially from a surface of the semiconductor body and into the semiconductor body, and being arranged in one or more pairs of opposite doping polarities such that each pair of doped regions forms a corresponding space charge region having a corresponding electric field therein, the space charge region extending substantially from the surface of the semiconductor body and into the semiconductor body such that photons entering the semiconductor body through the surface and travelling along paths within the space charge region generate electron-hole pairs in the space charge region that are separated in opposing directions substantially orthogonal to the photon paths by the electric field and collected by the corresponding pair of doped regions, thereby providing an electrical current to be conducted from the device.

Also described herein is an optoelectronic device manufacturing process, including:

epitaxially growing a layer of single-crystal semiconductor on a single-crystal optically transparent substrate, the epitaxial growth producing structural defects in a region near the interface between the substrate and the semiconductor layer, the structural defects being of a type that would degrade the performance of optoelectronic devices formed in the semiconductor layer; and implanting ions into the semiconductor layer to modify a buried portion of the semiconductor layer above or including the region containing the structural defects to at least mitigate the deleterious effects of the structural defects on optoelectronic devices formed in a portion of the semiconductor layer above the modified portion.

The modified portion of the semiconductor layer may isolate the structural defects from the optoelectronic devices. The isolation may be achieved by forming a buried conductive layer beneath the regions in which the optoelectronic devices would be formed.

Alternatively, the modified portion of the semiconductor layer may modify or remove the structural defects themselves.

The modified portion of the semiconductor layer may include the region containing the structural defects and may be amorphised by the ion implantation. The process may include heating the amorphous layer to transform it to a single-crystalline phase by solid-phase epitaxial regrowth. Alternatively, the entire semiconductor layer may be amorphised by ion implantation.

Also described herein is an optoelectronic device manufacturing process, including:

epitaxially growing a layer of semiconductor on a single-crystal optically transparent substrate to form a thin film of substantially single-crystal semiconductor;

processing the grown layer of semiconductor to reduce the defect density near the interface between the semiconductor and the single-crystal optically transparent substrate; and forming one or more optoelectronic devices in the thin film of substantially single-crystal semiconductor.

The process may include cleaning the single-crystal optically transparent substrate prior to the epitaxial growth. The optically transparent substrate may be sapphire and the cleaning may include exposing the sapphire to an oxygen plasma and scrubbing the sapphire.

One or more amorphous regions may be formed in the thin film of semiconductor by selected-area ion implantation into the thin film. The semiconductor may be silicon.

Also described herein is an optoelectronic device, including an optically transparent substrate having a thin film of semiconductor disposed thereon, the device being configured to generate electrical current from photons that travel through the optically transparent substrate and a first surface of the semiconductor thin film to generate electrical current within the semiconductor thin film, the semiconductor thin film having an associated optically active component therewith to cause photons that travel through the semiconductor thin film without being absorbed to be redirected back into the semiconductor thin film to be absorbed therein.

The optically active component may be provided by an electrically conductive interconnect disposed on the semiconductor thin film. The interconnect may be configured to reflect or to diffract photons back into the semiconductor thin film.

Alternatively, the optically active component may be provided by a pseudo-random arrangement of at least three regions configured to reflect photons with respective phase differences.

The optically transparent substrate may also have an associated optically active component therewith to cause redirected photons that travel back through the semiconductor thin film without being absorbed to be further redirected back into the semiconductor thin film to be absorbed therein.

BRIEF DESCRIPTION OF THE DRAWINGS

Some embodiments of the present invention are hereinafter described, by way of example only, with reference to the accompanying drawings, wherein:

FIG. 3A is a schematic illustration of a prior art vertical junction photovoltaic device;

FIG. 3B is a graph illustrating the limited optical absorption achievable by the structure of FIG. 3A;

FIGS. 9A-9E are diagrams illustrating the different crystal structures of sapphire and single-crystal silicon and the corresponding lattice mismatch when silicon is epitaxially grown on a sapphire substrate;

FIG. 10A is a cross-sectional transmission electron microscope image illustrating the extended defects that form when a silicon layer is epitaxially grown on an R-plane sapphire substrate;

FIG. 10B is a schematic illustration of the silicon epitaxial growth process that leads to the structure shown in FIG. 10A;

FIGS. 12A and 12B are schematic illustrations of fully-depleted and partially depleted embodiments of lateral junction silicon-on-sapphire (SOS) optoelectronic devices;

FIGS. 15A to 15H are schematic cross-sectional side views illustrating processes for manufacturing optoelectronic or photovoltaic lateral junction SOS devices in accordance with embodiments of the present invention, with FIG. 15D being a graph illustrating the epitaxial regrowth rate of silicon as a function of inverse temperature for various crystal orientations and doping concentrations;

FIGS. 16A to 16C are schematic side-views illustrating respective embodiments of lateral junction p-i-n devices in which amorphous and crystalline regions are configured in different ways;

FIGS. 20A and 20B are schematic cross-sectional side views of two embodiments of lateral junction p-i-n devices with the same device pitch but different region widths;

FIGS. 21A to 21D are schematic diagrams illustrating how the lateral junction device configuration enables these devices to efficiently collect charge carriers created throughout the entire depth of the silicon epi-layer irrespective of the wavelength of the incident photons;

FIGS. 27A and 27B are schematic plan and cross-sectional side views respectively, of an embodiment of a planar 2-D grating array formed by a square regions that diffract incident solar radiation into large-angle diffracted first and second order beams;

FIGS. 33A and 33B are schematic plan and side-views, respectively, of a unit element of a pseudo-random light scattering structure having three regions with spatially respective different optical path lengths;

DETAILED DESCRIPTION

Figures 1A, 1B:
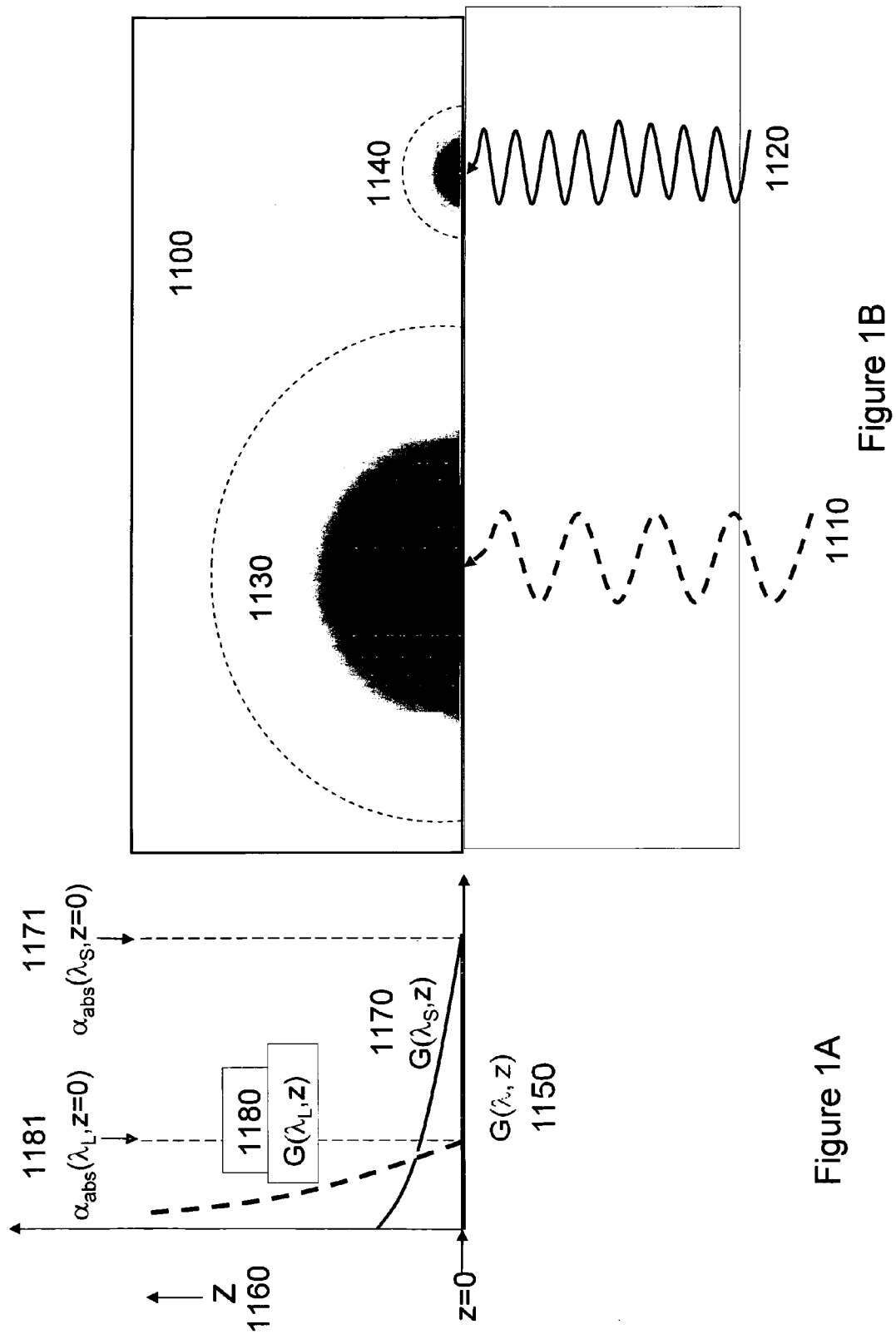
FIG. 1A is a schematic graph of the absorption coefficient of silicon as a function of depth for high energy and low energy solar photons.
FIG. 1B is a schematic diagram illustrating the different regions of silicon in which such photons are absorbed.

FIGS. 1A & 1B depict schematically and graphically the generation rate 1150 of photogenerated carriers in a silicon (Si) layer 1100 as a function of distance z 1160 from a photon-receiving surface (z=0) of the silicon layer 1100. The generation rate $G(\lambda)$ given by, $$G(\lambda)=\alpha(\lambda)F(\lambda)[1-R(\lambda)]e^{-\alpha(\lambda)z}$$

is a strong function of the silicon absorption coefficient $\alpha(\lambda)$, which is itself a function of wavelength. For band edge photons 1110 in the vicinity of the indirect band gap, the long exponential decay 1180 into the material means that these photons 1110 are absorbed throughout a relatively large volume region 1130 to create charge carriers (electron-hole pairs, EHPs) therein. Conversely, high energy photons 1120 well in excess of the indirect band gap and approaching and beyond the direct band gap of Si are rapidly absorbed 1170 in a much smaller volume 1140 at and close to the photon-receiving surface.

Lateral Junction Devices

Figure 2A:
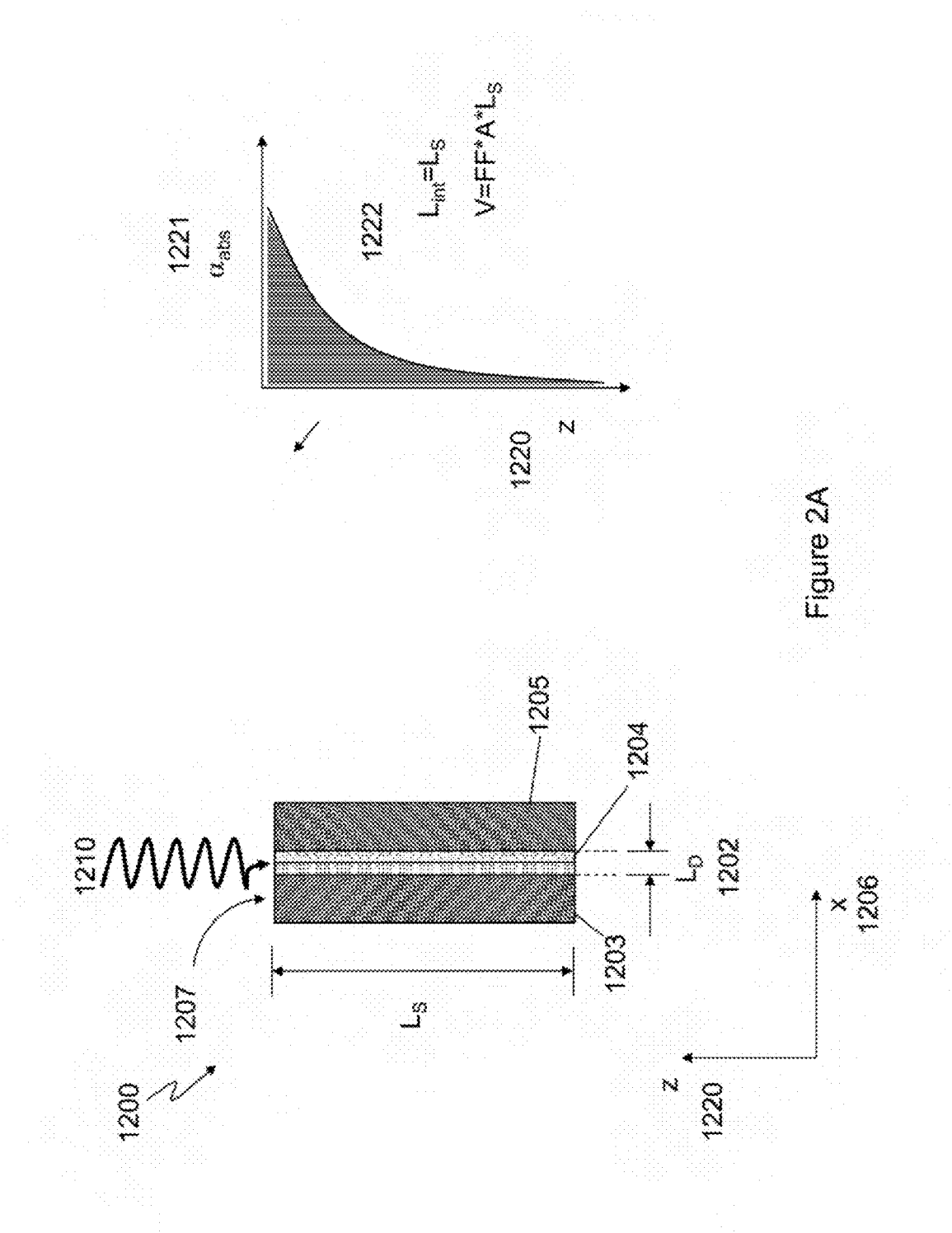
FIG. 2A is a schematic diagram illustrating a lateral p-n junction device in accordance with one embodiment of the present invention, together with a schematic graph illustrating how the device allows charge carriers generated throughout the device by photons of any wavelength to be collected and thereby contribute to the photocurrent provided by the device.

As shown schematically in FIG. 2A, a "lateral junction" or "lateral field" photovoltaic device includes a semiconductor body 1200 having a surface 1207 to receive photons, and doped regions 1203, 1205 of opposite doping polarities, namely a p-type region 1203 and an n-type region 1205, extending substantially from the surface of the semiconductor and into the semiconductor body, the two regions forming a p-n junction. As described in introductory text books on semiconductor devices, the diffusion of majority carriers of the corresponding type from each of the doped regions 1203, 1205 to the other 1203, 1205 and the resulting 'built-in' electric field created by this diffusion gives rise to a 'depletion' or 'space charge' region (SCR) 1204 Of width $L_D$ 1202) essentially depleted of free charge carriers.

Photons 1210 incident upon the depletion region 1204 in directions that are substantially normal to the photon receiving surface 1207 (and hence substantially parallel to the z-axis 1220 shown in FIG. 2A and to the edges of the SCR 1204 abutting the doped regions 1203, 1205) travel along paths that remain substantially or entirely within the depletion region 1204 and create electron-hole pairs along these paths. The electric field across the depletion region 1204 separates the electrons and holes in opposite directions that are substantially orthogonal to the paths of the photons (and parallel to the x-axis 1206 shown in FIG. 2A). These charge carriers are collected by the doped regions 1203, 1205, thereby providing the electrical current generated by the device to an external circuit or storage device.

Because the photons 1210 are directed along the depletion region 1204 (rather than across it), a greater portion of the electron-hole pairs generated within the semiconductor body 1200 are generated within the depletion region 1204 than would otherwise be the case, and can thus be collected. Moreover, by configuring the device so that the depletion region 1204 extends to the surface 1207 of the semiconductor body 1200 as shown in FIG. 2A (or at least substantially to the surface 1207), the efficiency of the device is even further enhanced. This enhancement is due not only to the resulting increase in the photon path length within the depletion region 1204, but also to the fact that high energy (i.e., short wavelength) photons are very strongly absorbed in the semiconductor body 1200, as described above, thus generating electron-hole pairs (EHP) within the depletion region 1204 with an exponentially and rapidly decaying generation rate 1221 with distance z 1220 from the surface 1207, as shown by the graph in FIG. 2A. By arranging for the depletion region 1204 to extend to the surface 1207 (or at least very close to the surface 1207), most if not all of these EHPs can be collected, whereas they would otherwise be largely or completely lost to energy conversion. Thus this configuration allows nearly all of the EHPs generated in the depletion region 1204 to be collected. As will be appreciated by those skilled in the art, in addition to the EHPs formed within the depletion region 1204, electrons or holes generated within the doped regions 1203, 1205, but also within the relevant diffusion length of the corresponding edge of the depletion region 1204 can diffuse to the depletion region 1204 and be swept across the depletion region 1204 by the electric field, thereby contributing to the device photocurrent.

The lateral junction arrangement described above enables more efficient collection of EHPs than standard photovoltaic devices, referred to herein as "vertical junction" devices. As shown in FIG. 3, in a standard photovoltaic device with a "vertical" pn junction buried well below the photon receiving surface, incident photons must travel through a doped surface layer 302 before reaching a relatively narrow depletion region 303 in the form of a sheet that is orthogonal to the direction of photon travel. Consequently, only EHPs created within the relatively narrow depletion region 303 or within a diffusion length of its edges can be collected and contribute to the device photocurrent. In particular, high energy (short wavelength) photons strongly absorbed in the doped surface layer 302 of such devices cannot reach the depletion region 303 and hence do not contribute to the photocurrent. Furthermore, when photons are absorbed in the depletion region, in most cases at least one of the generated carriers must traverse a relatively large distance before collection, which requires a long carrier lifetime.

In vertical junction devices, the large excess energy $(\Delta E_{th}=E_\gamma-E_G>0)$ of the hot photo-generated carriers is quickly thermalized via interaction with lattice phonons and converted into heat before the carriers can traverse the relatively large distances (≥100 μm) to be collected, thereby increasing the cell temperature $T_O$ and phase space filling available states. Consequently, the most efficient photons for photocurrent generation in vertical junction devices are those with energies at or in the immediate vicinity above the fundamental band gap $E_G$. These losses have the cumulative effect of reducing the useful energy bandwidth of the solar spectrum above $E_G$ that can be converted into useful charge carriers. That is, the high energy photon energy loss processes in vertical junction device topologies limits the useful solar energy bandwidth to only a small region above $E_G$, leaving the high energy portion of the solar spectrum unutilized.

In contrast, the lateral field devices described herein allow a greater range of wavelengths to be efficiently converted into electrical energy by enabling the efficient collection of EHPs generated: (i) at and substantially at the semiconductor surface; and (ii) along the entire length of the depletion region 1204 extending from the surface 1207 of the semiconductor body 1200 into the semiconductor body 1200.

Although only one lateral pn junction is shown in FIG. 2A for the sake of clarity, in practice a large array of such devices are formed in a single semiconductor wafer or thin film and interconnected to form a single device. This allows a far greater proportion of the semiconductor wafer to be used to form the depletion or space charge regions than would be the case for vertical junction devices, where the depletion region is limited to a narrow band. By densely packing the lateral junction devices, a majority of the wafer or thin film can be used as active regions from which EHPs are collected. It will be apparent that the overall efficiency of the device is generally increased by forming the doped regions 1203, 1205 to be deep (to extend the space charge regions deeper into the semiconductor, and thereby capture more EHPs along the paths of the photons 1210) but narrow (to reduce or substantially eliminate the proportion of EHPs created within the doped regions 1203, 1205 further than a diffusion length from the corresponding edge of the depletion region 1204). For example, a series of parallel narrow sheets of doped semiconductor arranged vertically (i.e., as stripes in plan view) can be formed in a semiconductor wafer using standard lithography and masked ion implantation, as will be apparent to those skilled in the art.

Although the lateral junction structures described above allow the efficient collection of EHPs generated by photons with a wide range of wavelengths, in practice, the width $L_D$ 1202 of the p-n junction depletion region 1204 is limited to being about 1 µm or less, which limits the overall efficiency of the device.

Figure 2B:
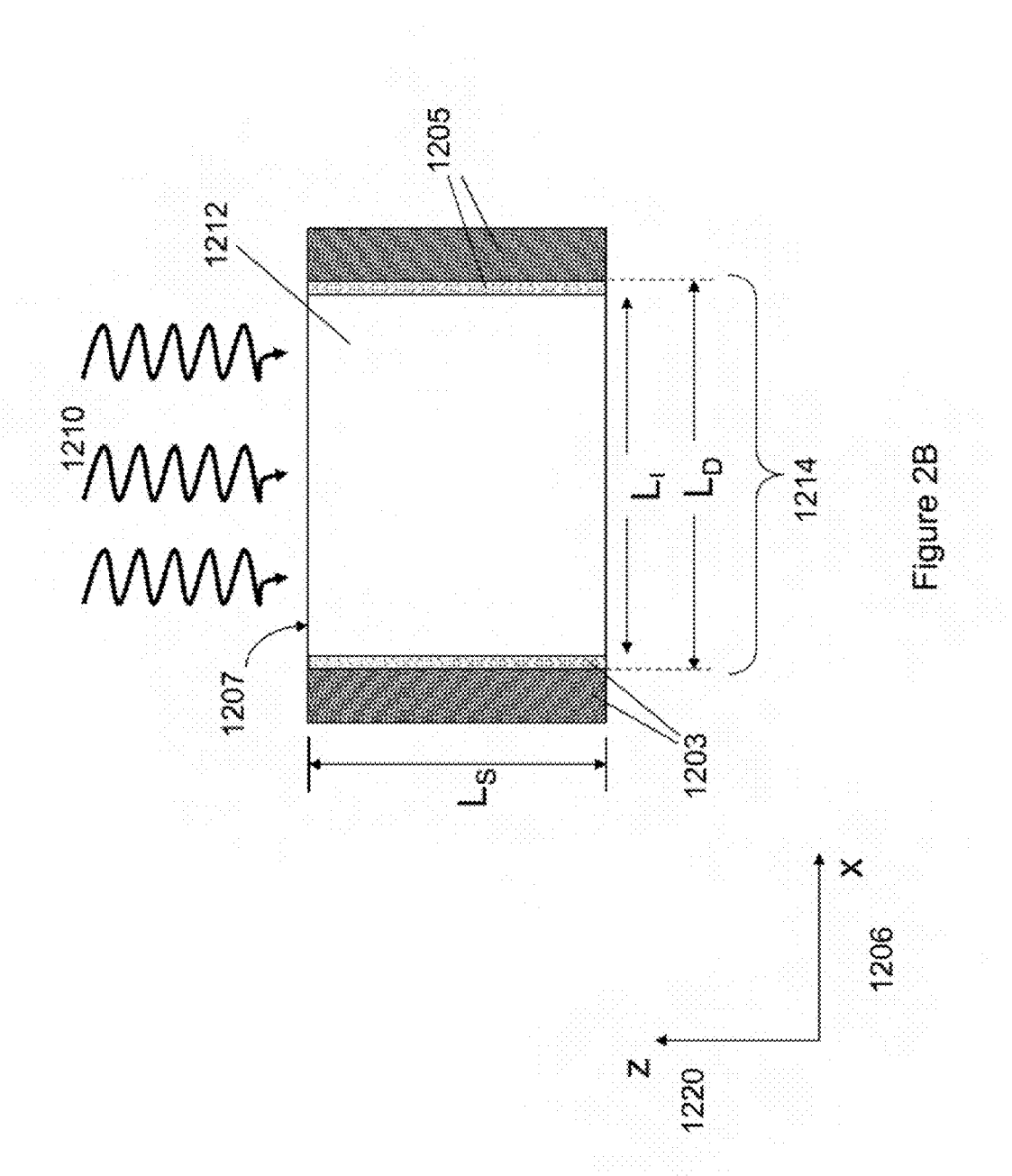
FIG. 2B is a schematic illustration of a lateral junction p-i-n device in accordance with one embodiment of the present invention.

In other embodiments, as shown in FIG. 2B, an intrinsic or not intentionally doped (NID), or at least very lightly doped region 1212 of relatively high resistivity is disposed between the p-type 1203 and n-type 1205 doped regions to provide a lateral field p-i-n photovoltaic device where the width $L_D$ of the space charge region 1214 for generating/collecting EHPs is substantially increased over the p-n lateral junction device 1200 described above, thus providing increased efficiency. In the context of the lateral devices described herein, the terms "intrinsic region" and "NID region" refer to a region that is either undoped or is lightly doped relative to the p-type and n-type doped regions disposed on either side such that the doped regions establish an electric field across the 'intrinsic' region to form a p-i-n diode structure or equivalent thereof. As described below, although the "intrinsic region" in such a structure is nominally undoped, or background doped only, in some cases it may be desirable to lightly dope the "intrinsic region" to increase carrier mobility and lifetime therein, and consequently the terms "intrinsic region" and "NID region" are to be construed accordingly.

Indeed, the p-i-n device can have an almost arbitrarily large "intrinsic" region 1212, which enables the simultaneous optimization of optical absorption and EHP carrier extraction. The volume of the intrinsic region 1212 available for optical absorption (i.e., for EHP generation) increases linearly with its width $L_I$. However, in practice, the efficiency of EHP carrier extraction will eventually reach a maximum value and then decrease due to the limited carrier lifetime and decreasing electric field strength within the "intrinsic" region 1212. In some embodiments, the width $L_I$ of the "intrinsic" region 1212 is up to about 100 micrometers. In other embodiments, its width $L_I$ is of the order of 10 micrometers. In yet other embodiments, the width $L_I$ is between about 1 to 20 micrometers. For example, it will be appreciated by those skilled in the art that the optimal "intrinsic" region width $L_I$ will be greater for crystalline silicon than for poly-crystalline silicon or for amorphous silicon due to the superior carrier mobility and longer minority carrier lifetimes in single-crystal silicon.

Because the depletion region 1214 extends a practically negligible distance into the n- and p-type regions 1203, 1205 of a p-i-n device, the volume of the intrinsic region 1212 essentially determines the volume of the semiconductor body that is available for optical absorption, and consequently widening the n- and p-type regions 1203, 1205 reduces the total volume available for optical absorption. However, widening the n- and p-type regions 1203, 1205 also reduces the series resistance and increases the efficiency of EHP carrier extraction. Therefore, given fixed material properties (including choice of semiconductor and doping concentrations), the overall efficiency of a lateral field p-i-n photovoltaic device can be optimized by adjusting the widths of the n-, p- and i-type regions. In some embodiments, the widths of the n- and p-type regions are up to 20 micrometers. In other embodiments, the n-type regions are approximately 3.5 micrometers wide and the p-type regions are approximately 5 micrometers wide.

The optical absorption and EHP carrier extraction can be further improved by the choice of doping concentrations in the n- and p-type regions 1203, 1205 and by the choice of the shapes of these regions 1203, 1205. In some embodiments, the n- and p-type regions 1203, 1205 become wider towards the photon-receiving surface 1207 to reduce the length of the path that high energy carriers created near the entry surface 1207 by high energy photons must traverse to be collected, while providing a larger volume for the absorption of lower energy photons further from the photon entry surface 1207. In some embodiments, the doping concentrations in the n- and p-type regions are between $10^{15}$ and $10^{21}$ atoms per cubic centimeter. In some embodiments, the "intrinsic" region is lightly doped to a concentration between about $10^{12}$ and $10^{14}$ cm$^{-3}$ in order to increase mobility and carrier lifetimes.

Figure 4:
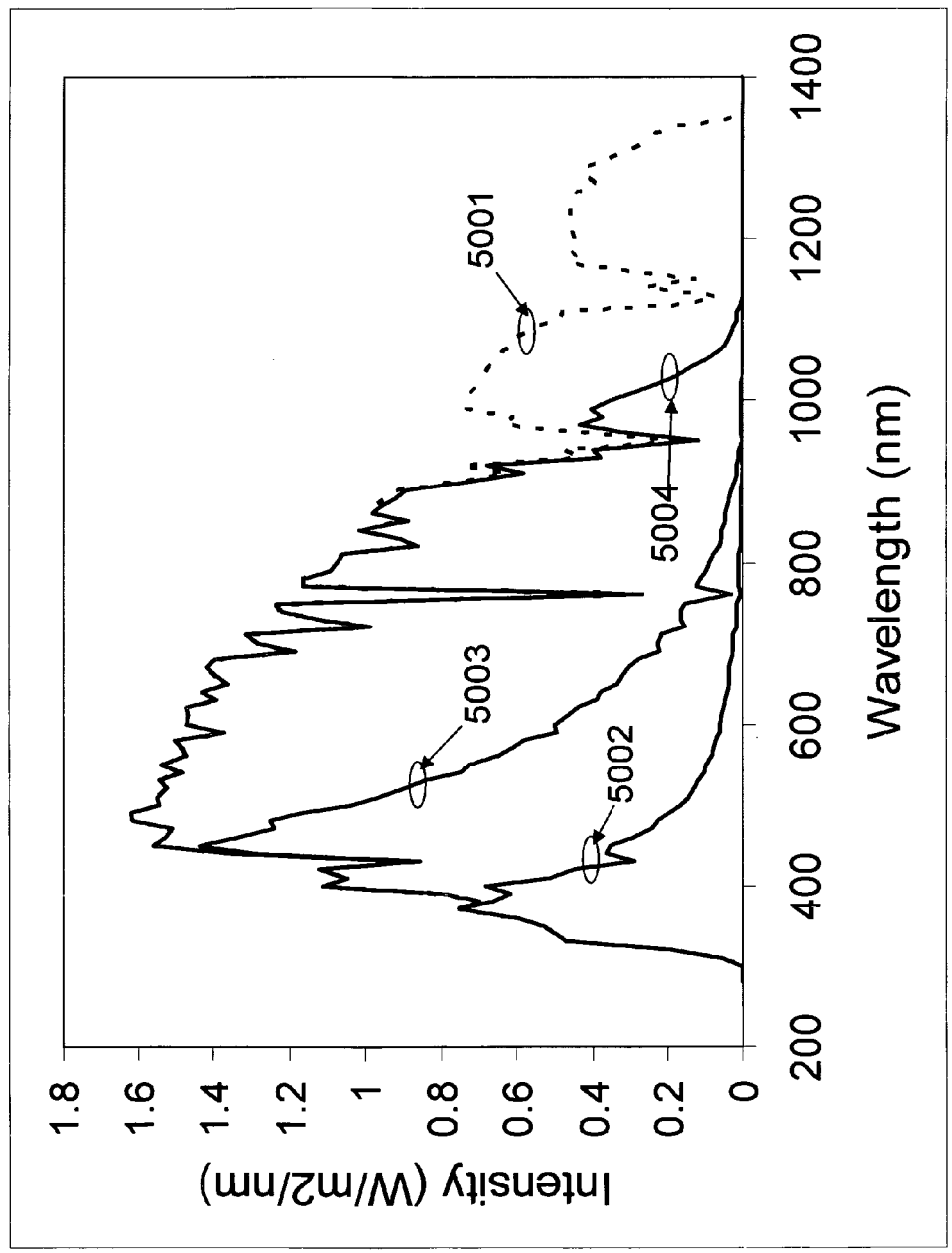
FIG. 4 is a graph illustrating the portion of the sea-level solar spectrum absorbed by silicon layers of thicknesses 100 nm, 1,000 nm, and 10,000 nm.
Figure 5:
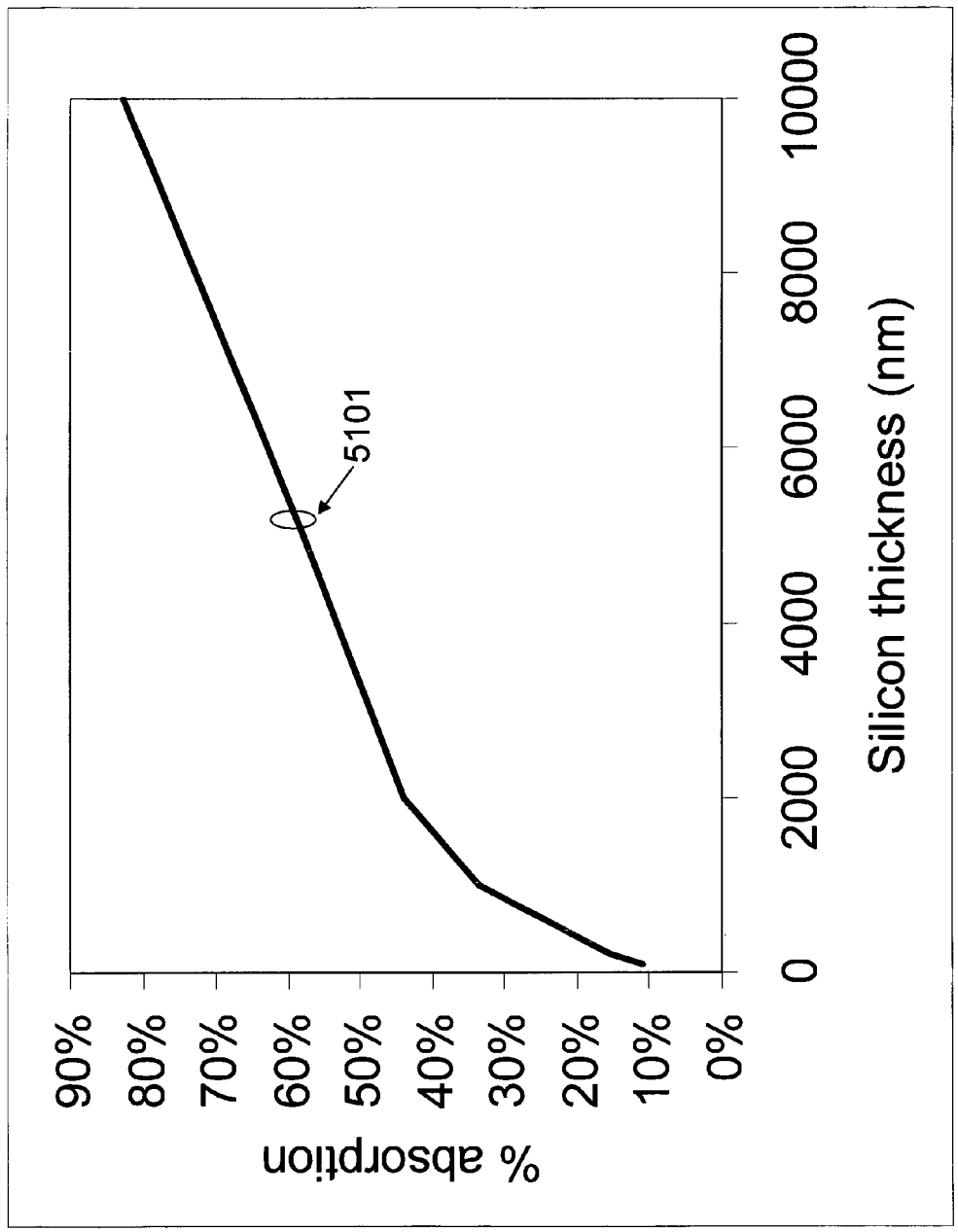
FIG. 5 is a graph showing the percentage absorption of the solar spectrum in a silicon layer as a function of the thickness of the layer.

The volume of the semiconductor body available for optical absorption can be increased by increasing the thickness of the semiconductor body. FIG. 4 illustrates the portion of the sea-level solar spectrum 5001 absorbed by silicon layers of thickness 100 nm 5002, 1000 nm 5003, and 10,000 nm 5004. As shown in the graph of FIG. 5, a 100 nm thick silicon layer can absorb approximately 11% of the incident solar spectrum at sea level, while a 1,000 nm thick silicon layer will absorb over three times that amount, 34%. However, increasing the layer thickness also increases the series resistance, reducing carrier extraction, and increases manufacturing costs. As with the width $L_I$ of the intrinsic region, the thickness $L_S$ of the semiconductor body can be selected to optimize optical absorption and EHP carrier extraction. For example, in some embodiments, the thickness of the semiconductor body is between 100 nm and 10,000 nm. In other embodiments, the thickness of the semiconductor body is approximately 1,000 nm. In still other embodiments, the thickness of the semiconductor body is approximately 200 nm.

Figure 6:
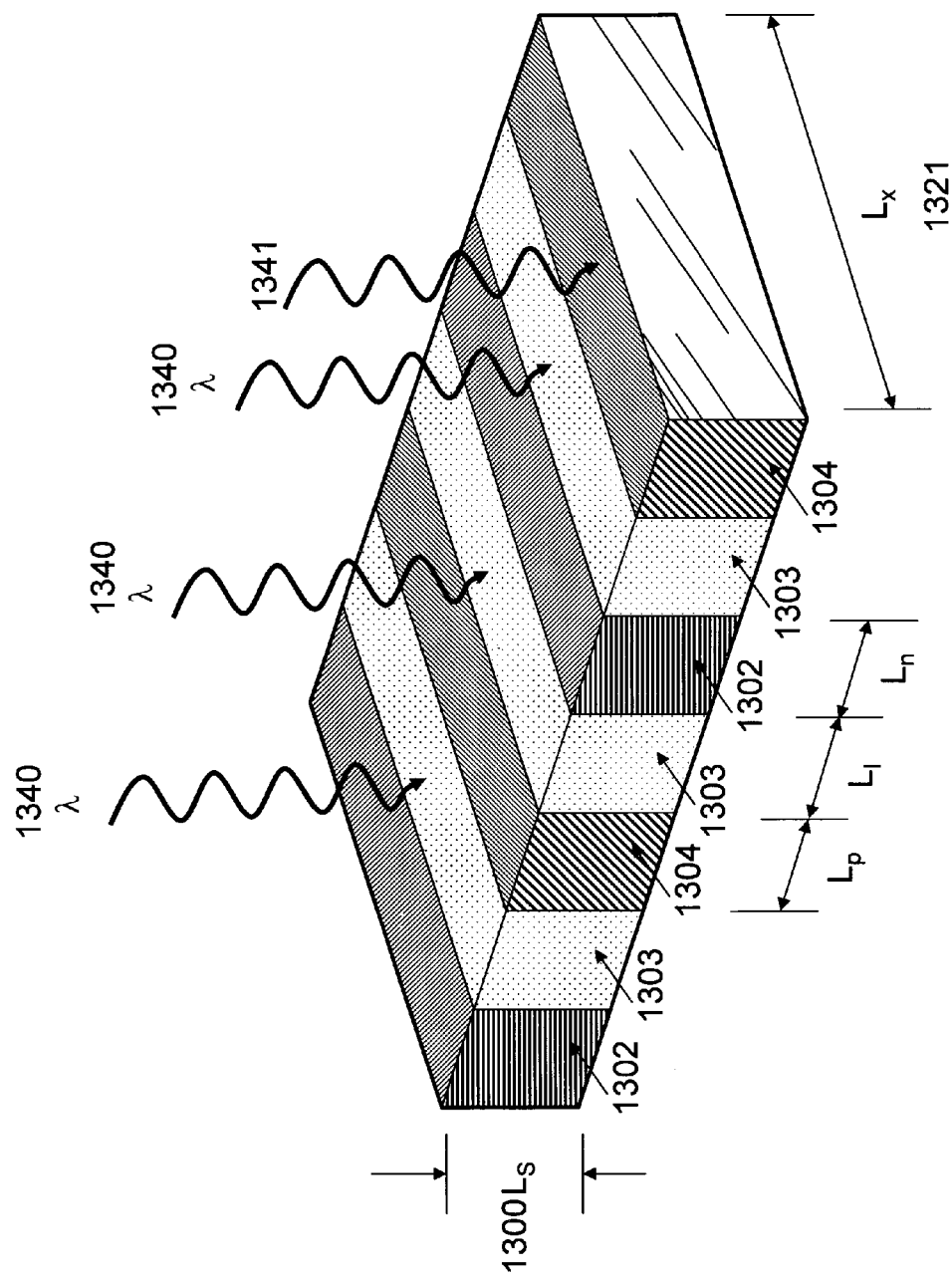
FIG. 6 is a schematic diagram illustrating a p-i-n-i-p- . . . lateral stack device in accordance with one embodiment of the present invention.

As shown in FIG. 6, some embodiments of a p-i-n device include a lateral array of p-i-n regions, with the doped regions 1302, 1304 arranged in alternating polarities so that the overall arrangement can be written as {p-i-n-i-p- . . . }, notwithstanding that it is referred to herein as a p-i-n structure for convenience. The doped and intrinsic regions 1302, 1303, 1304 are all of thickness $L_s$ 1300 and length $L_x$ 1321, the intrinsic region 1303 is of width $L_I$ and the doped regions 1302, 1304 are of widths $L_n$ and $L_p$. The volume of each intrinsic region 1303 is given by $V_I = L_I \times L_s \times L_x$, representing a fraction $L_I/(L_I + L_n + L_p)$ of the entire volume of the device. However, in practice the carrier diffusion lengths are well in excess of the widths of the doped regions 1302, 1304 (e.g., $L_p = L_n = 3$ μm, with carrier diffusion lengths >100 μm), so that the majority of carriers created in any of the doped and intrinsic regions 1302, 1303, 1304 are collected.

In contrast to a vertical p-n or p-i-n structure, the volume of the intrinsic regions 1303 available for EHP generation scales linearly with $L_S$, the thickness of the doped regions 1302, 1304 and the intrinsic regions 1303. As with the lateral p-n junction devices described above, the doped regions 1302, 1304 can be formed by masked ion implantation, surface doping or a combination thereof, using standard doping processes known to those skilled in the art, with the intrinsic regions 1303 being provided by the remaining undoped regions between the doped regions 1302, 1304. The semiconductor can be silicon, germanium, or any of the range of standard elemental and compound semiconductor materials used for photovoltaic, microelectronic, and/or optoelectronic devices. Further details of these processes are described below.

Figure 7:
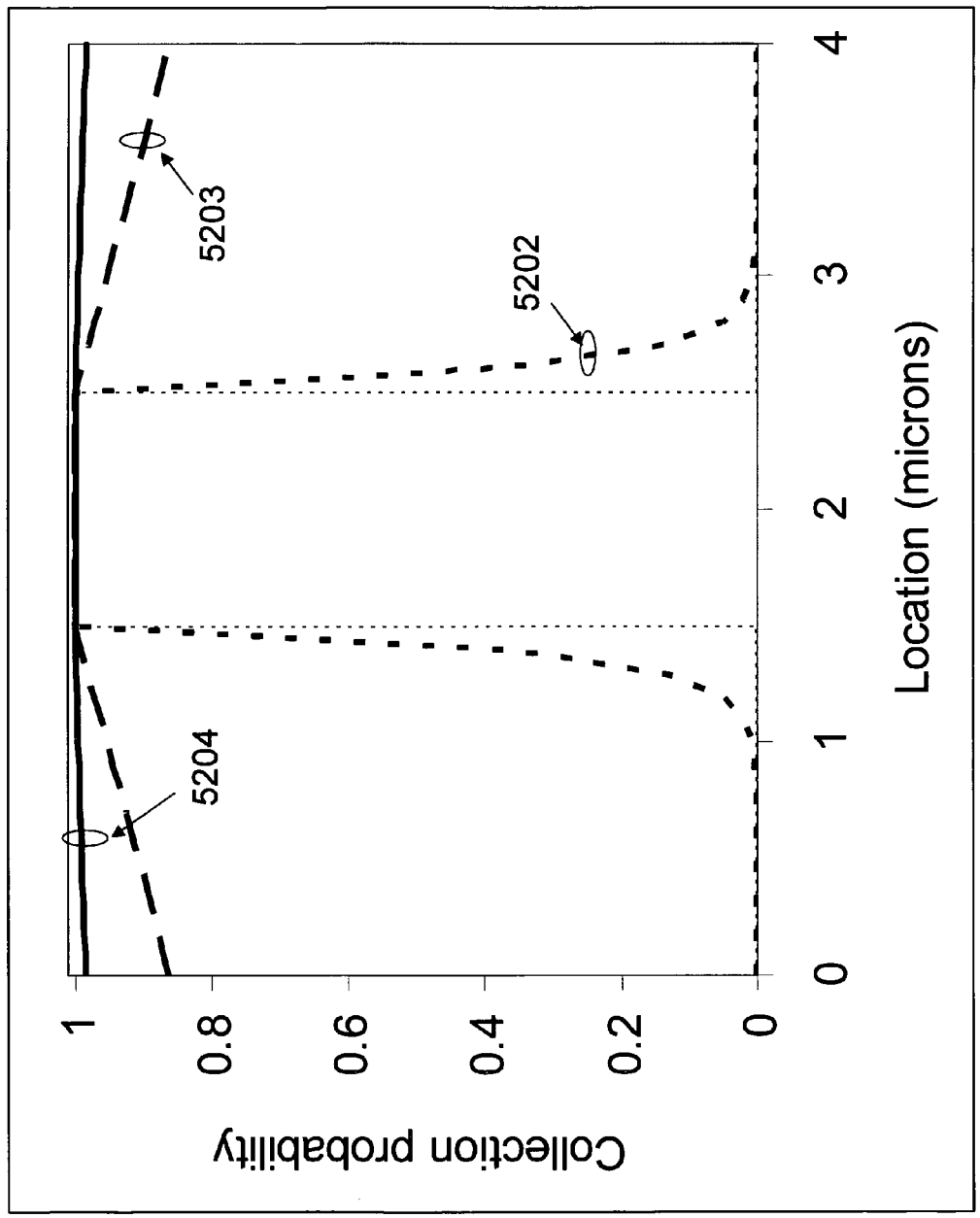
FIG. 7 is a graph illustrating the probability of charge carrier collection as a function of lateral (creation) position across a single lateral junction p-i-n device, for minority carrier diffusion lengths of 100, 10, and 0.1 μm.

FIG. 7 illustrates the simulated carrier collection probability as a function of lateral position and for three different values of minority carrier diffusion length in a lateral field p-i-n photovoltaic device with a 1.0 micrometer wide "intrinsic" region and 3.0 micrometer wide doped regions, so that, overall, the aggregate intrinsic region width is ¼ of the total (intrinsic+doped regions) lateral stack width. The carrier collection probability changes significantly with minority carrier diffusion length, which determines the collected portion of charge carriers generated in the doped regions. For a 100 micrometer diffusion length 5204, which is typical of crystalline silicon, substantially all (99%) of the photo-generated carriers are collected. For a 10 micrometer diffusion length 5203, which is typical of poly-crystalline silicon, approximately 94% of the photo-generated carriers are collected. For a 0.1 micrometer diffusion length 5202, which is typical of amorphous silicon, approximately only 30% of the photo-generated carriers are collected. Thus, for a single crystal silicon semiconductor body, the internal quantum efficiency of the device will be determined by the silicon body thickness for realistic device dimensions, increasing from approximately 10% for a 100 nm thick silicon layer to over 80% for a 10,000 nm (10 μm) thick silicon layer.

Thus the lateral field devices described above provide many advantages over prior art devices, perhaps the most salient of these being:

(i) the arrangement of space charge regions extending into the semiconductor body along the paths of photons incident on the device allows EHPs generated along a majority or even substantially all of those paths to be collected and contribute to the device current;

(ii) the arrangement of space charge regions extending to (or substantially to) the photon receiving surface of the semiconductor body allows high energy photons that are strongly absorbed near the surface of the semiconductor to contribute to the device current;

(iii) the arrangement of doped regions extending into the semiconductor body but each region having at least one lateral dimension that is substantially less than the diffusion length of the corresponding minority carrier allows the majority or even substantially all of the EHPs generated within the doped regions to contribute to the device current; and (iv) the combination of the above points allows EHPs generated anywhere in substantially the entirety of the semiconductor body to contribute to the device current, thereby achieving extremely high conversion efficiencies.

Transparent Superstrates

Although the lateral junction devices described above can convert a wider range of wavelengths to electrical energy than vertical junction devices, the efficiency of either type of device can be substantially improved by providing the junctions in a thin film or layer of a semiconductor attached to an optically transparent and electrically insulating superstrate, and configured so that the incident photons travel through the superstrate to reach the depleted/intrinsic regions extending (in the case of lateral junction devices) to the surface (or at least substantially to the surface) of the semiconductor film that attaches it to the superstrate. In the embodiments described below, the superstrate is single crystal $Al_2O_3$ (sapphire) and the semiconductor is silicon, although it will be apparent to those skilled in the art that other materials (e.g., glasses) can be alternatively used in at least some embodiments. However, it will be appreciated by those skilled in the art that certain combinations of semiconductors and transparent single-crystal substrates allow epitaxial growth of a single-crystal layer of the semiconductor on the single-crystal substrate, thereby providing a layer of extremely high quality semiconductor at a cost competitive with or lower than that of layer transfer processes.

Figure 8:
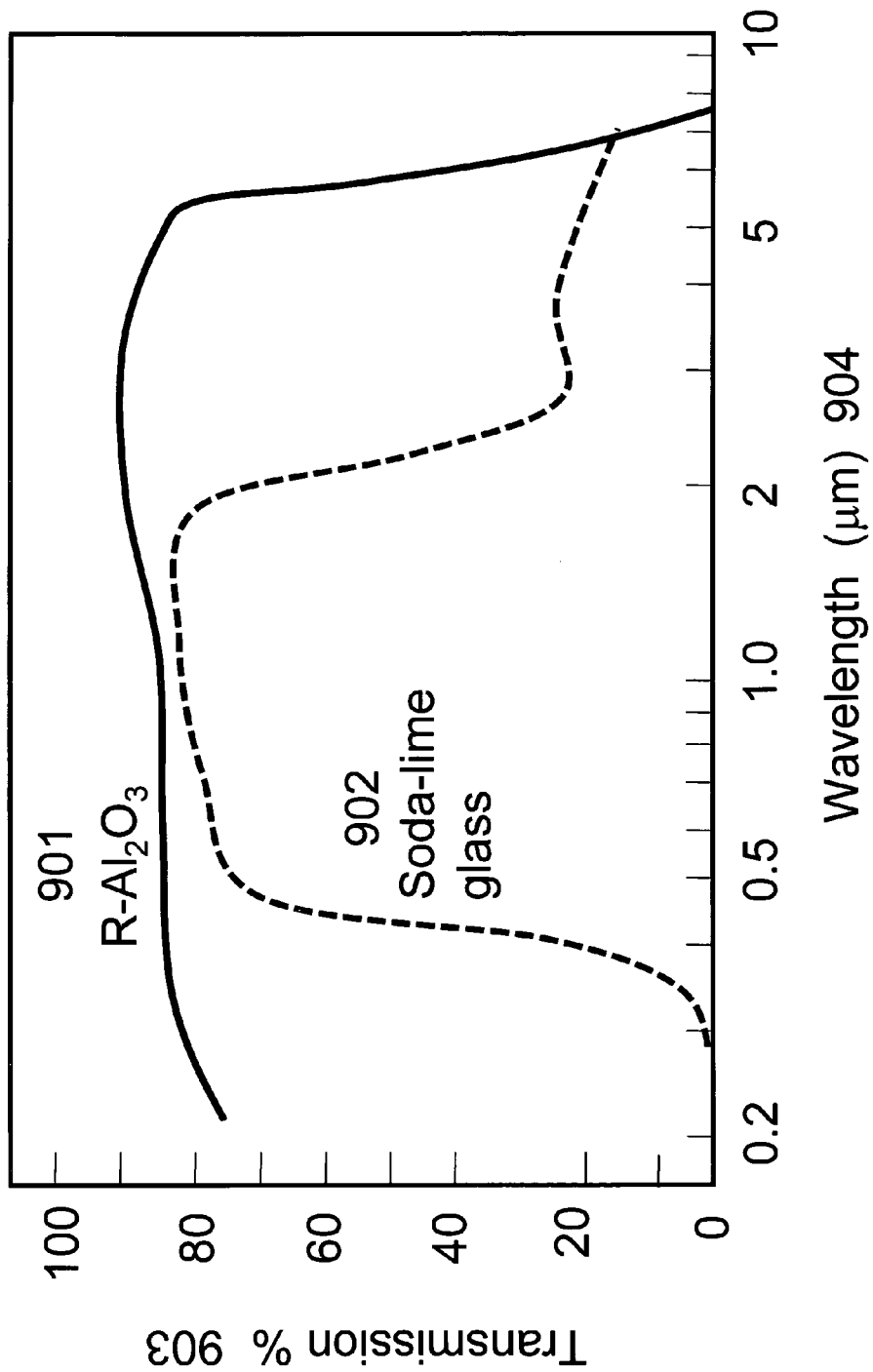
FIG. 8 is a graph comparing the optical transmission of R-cut $Al_2O_3$ and soda-lime glass as a function of wavelength.

Sapphire has the benefit that it has improved optical transparency for solar radiation compared to many other transparent materials. For example, FIG. 8 is a graph of optical transmission as a function of wavelength for high quality r-plane sapphire 901 and soda-lime alkali glass 902, demonstrating a 5-10% improvement in the transmission of sapphire over the range of wavelengths of relevance to solar energy conversion, 400-1700 nm. In addition, the use of a transparent substrate, such as sapphire, in a photovoltaic device enables both electrical contacts of the device to be placed away from the photon-receiving surface 1207; e.g., on the backside of the photovoltaic device, opposite to the incident solar energy. This eliminates any shadowing of the cells by the metal contact structures and wires. Furthermore, sapphire is a very robust material, providing an environmental encapsulant without requiring additional layers, thereby simplifying the design of photovoltaic modules.

Moreover, the single crystal structure of sapphire allows thin films of single crystal semiconductors, in particular (but not necessarily) silicon, to be epitaxially grown on sapphire substrates. Furthermore, it allows thin films of very high quality polycrystalline semiconductors to be grown with relatively inexpensive vapor-phase deposition tools.

As will be understood by those skilled in the art, sapphire is one of the most versatile metal-oxide crystals capable of being formed in single crystal forms via many growth processes and available in large form factors, either as large as-cut wafers from boules grown by the Czochralski method, or as large area single crystal sheets formed directly by edge-fed-growth (EFG) processes.

The epitaxial growth of Si films on sapphire substrates has been used for microelectronic applications requiring high resistivity substrates, in particular high frequency (e.g., radio-frequency telecommunications) and/or low power microelectronic devices. The bulk or unstrained $Al_2O_3$ sapphire crystal exhibits hexagonal or pseudo-cubic/rhombic symmetry along the c- and r-axes, respectively. Due to its hexagonal symmetry, a sapphire crystal can be described using hexagonal coordinates, such that the C-axis of sapphire is written as <0001>.

Figure 9A:
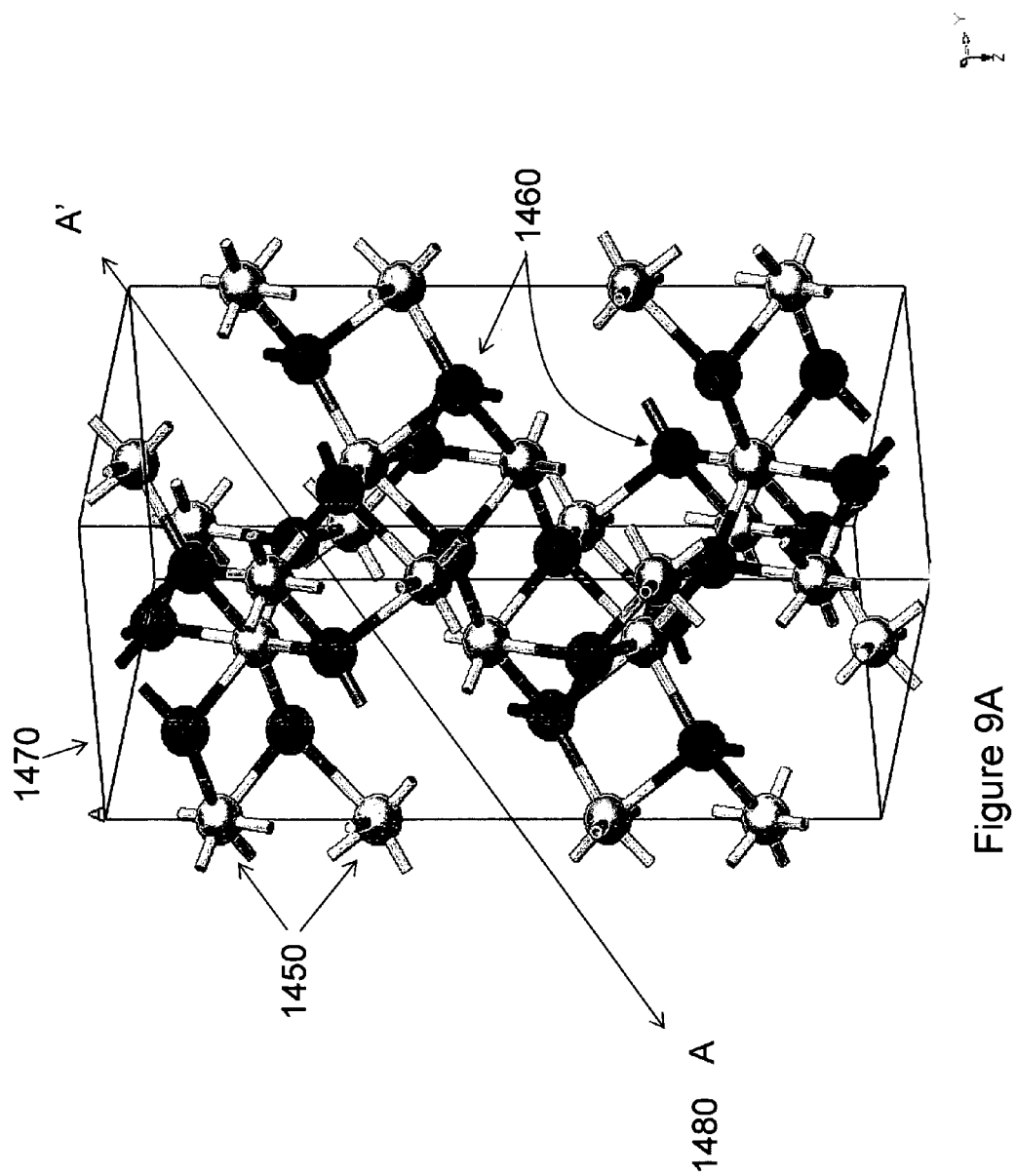

The sapphire crystal structure exhibits a trigonal space group (167), and can be cut along crystallographic planes referred to in the art as the C-plane, A-plane and R-plane, the latter shown by the line A-A' 1480 in FIG. 9A. The C-plane has hexagonal symmetry and is useful for epitaxially growing crystalline materials having wurtzite type crystal structures, such as InGaN, AlN, and ZnO. The embodiments described below utilize the R-plane surface exhibiting tetragonal pseudo-cubic symmetry, although other orientations could alternatively be used. The R-plane is suitable for the epitaxial growth of zinc-blende (ZB) and/or cubic semiconductors, such as cubic indium nitride, silicon (Si), germanium, titanium nitride (TiN), silicon titanium nitride (SiTiN), boron titanium nitride (BTiN), and titanium oxynitrides ($TiO_xN_y$), for example.

Accordingly, although lateral junction structures are generally described below as being formed in single-crystal silicon epitaxially grown on an R-plane sapphire substrate, it should be understood that the lateral junction structures could alternatively be formed in single-crystal layers of other semiconductor materials epitaxially grown on sapphire substrates of appropriate orientations. Furthermore, although the combination of a sapphire substrate and lateral junction devices will provide the highest energy conversion efficiency, the efficiency of vertical junction devices can also be substantially improved by forming them in thin films of single-crystal semiconductors epitaxially grown on sapphire substrates.

Figure 9E:
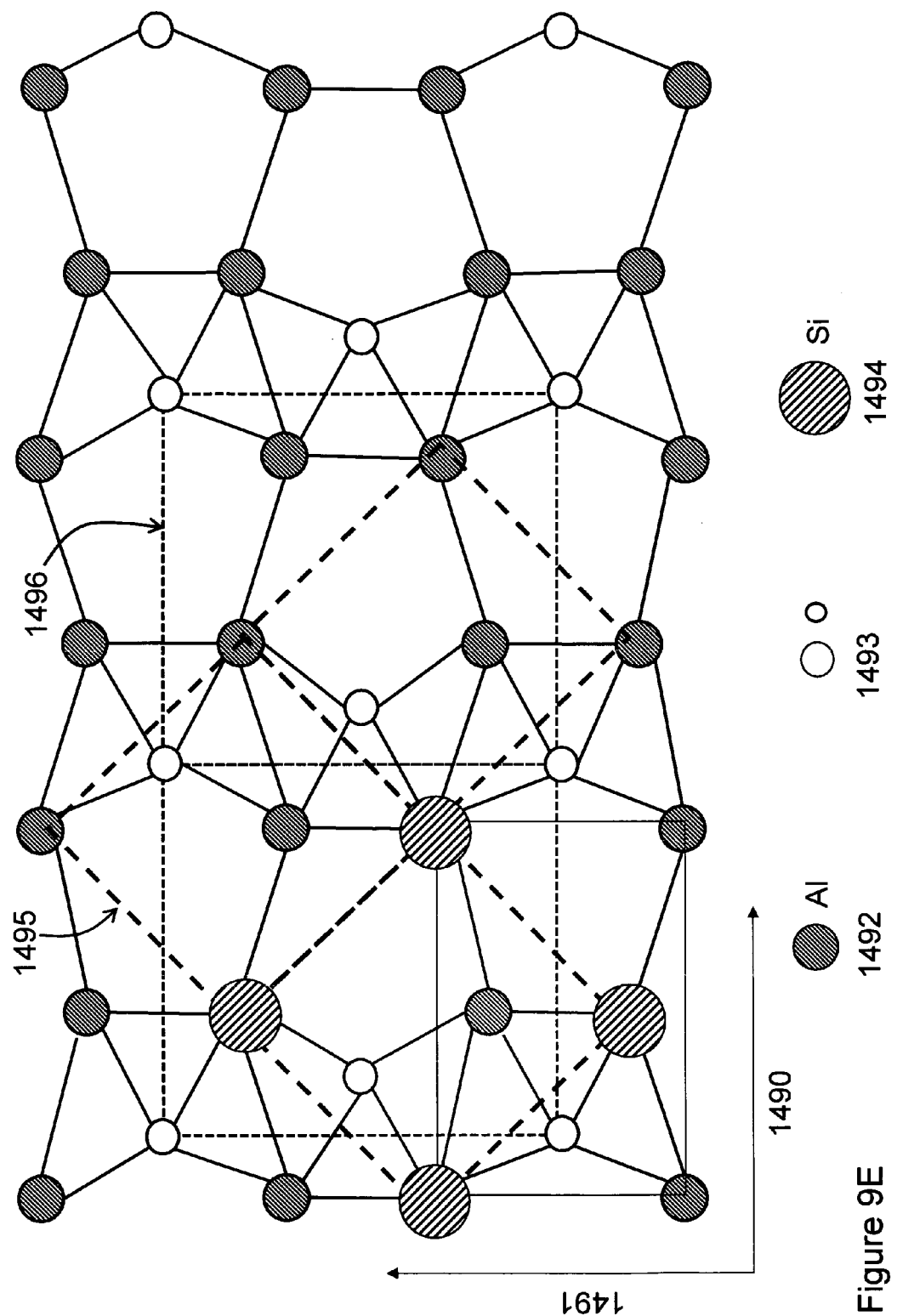

Referring to FIG. 9B, the R-plane has Aluminium (Al) atoms 1420 arranged in the plane with Al atom spacings 1401 (~4.76 Å) along the <1120> direction 1410 and 1402 (~5.20 Å) along the <1101> direction 1411. The (001)-oriented bulk Si unit cell 1406 is shown in FIG. 9C, where the Si atom 1421 lattice spacings 1403, 1404 are 5.431 Å. For direct Si epitaxial growth on the R-plane sapphire surface, there is a lattice mismatch of 4.2% along the <1101> direction and a lattice mismatch of 12.5% along the <1120> direction. FIGS. 9D and 9E overlay the free standing unit cells of (001)-oriented Si and R-plane sapphire, showing the difference in cell dimensions and atomic symmetry. This lattice and crystal symmetry mismatch between sapphire crystal and silicon crystal leads to a loss of registry between interfacial bonds, causing crystalline defects (twins and dislocations) and strain fields in the silicon layer. It is anticipated that AlN, TiN or Al2O3 may be advantageous for use as buffers layer deposited between the sapphire and the topmost thin film semiconductor layer such as Si.

The fundamental differences in crystalline structure and symmetry between $Al_2O_3$ and Si result in substantially strained layer hetero-epitaxy. The Si film is distorted tetragonally, and the Si unit cell can be described as being compressed onto the underlying Al atoms shown in FIG. 9D. The 1:1 lattice mismatch can be compensated by multiple lattice constant domain matching. As shown in the cross-section side view of FIG. 10A, transmission electron microscope imaging of direct Si epitaxy upon R-plane sapphire reveals unique multiple growth modes peculiar to this combination of materials. The initial Si nucleation phase forms a highly defective Si epilayer 1503. Further growth results in a lower defect density region 1504 characterized by a high density of twin defects resulting from the critical layer thickness being exceeded. If the growth of Si is continued beyond this region 1504, the Si film 1501 partially relaxes and twin-defect 1506 annihilation occurs. With continued growth, the subsequent region 1505 beyond approximately 0.15 to 0.2 μm of film growth has a relatively low defect density, and can be described as high quality single crystal Si. The two regions with the highest defect density 1503, 1504 are characteristically weakly p-type, and can be used via further processing to form a buried conductive layer 1508. Additionally, high temperature Si-epitaxy causes aluminium (Al) atoms to diffuse into the growing Si film, thereby auto-doping the Si film (Al is a p-type dopant in Si). This effect can also be used to create buried p-type layers.

Figure 11:
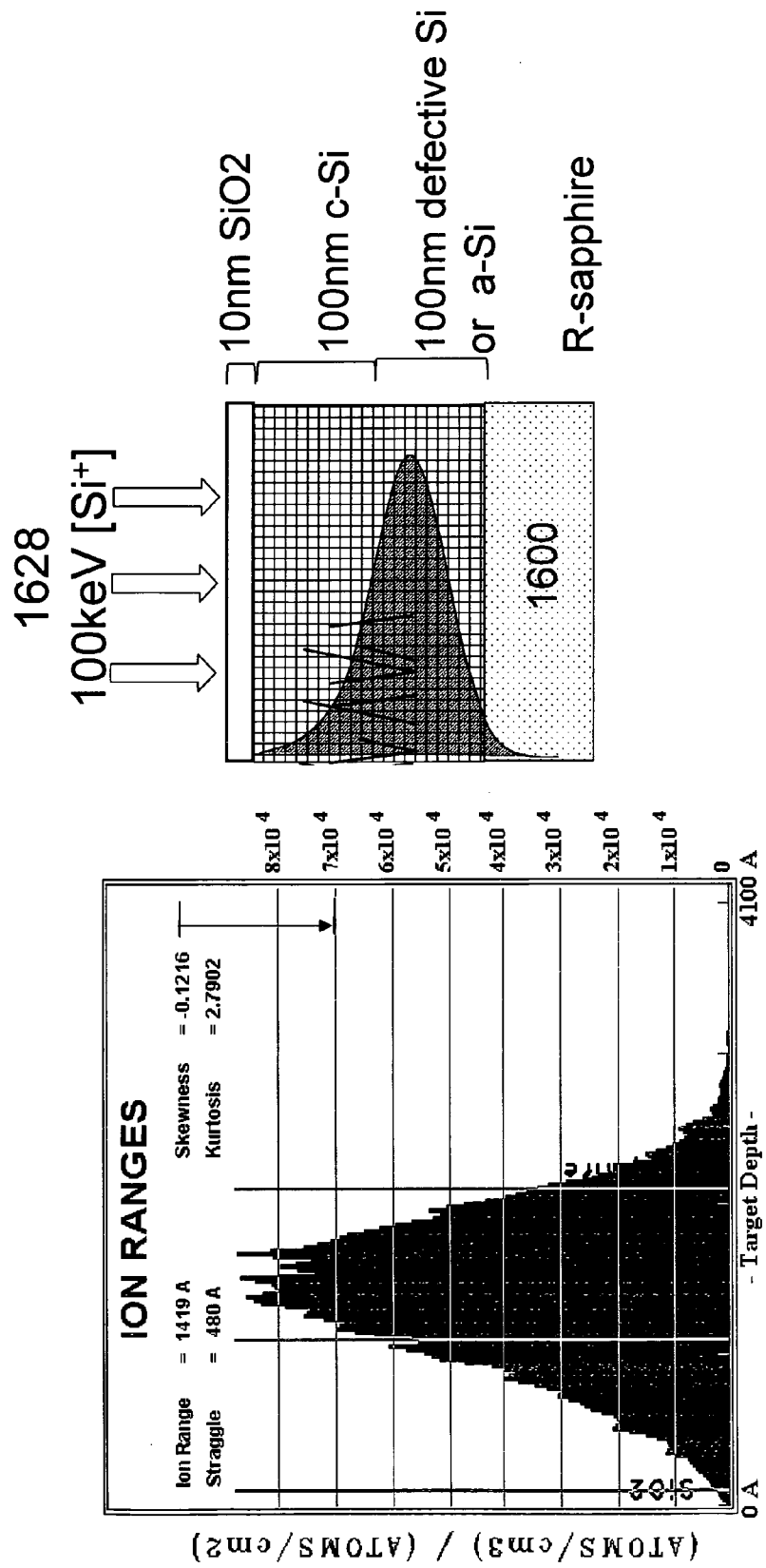
FIG. 11 includes a graph of the depth profile of silicon atoms implanted at an energy of 100 keV into a silicon layer, together with a schematic illustration of the overlap between the implanted silicon atoms and the extended defects in the epitaxially-grown silicon layer of FIGS. 10A and 10B.

Bare sapphire surface preparation techniques can also be used in conjunction with growth processes to further control the Si epitaxial film structural and electronic properties. FIG. 10B illustrates process steps for directly growing an epitaxial Si layer 1502 on an R-plane sapphire substrate 1500. The sapphire surface 1520 is clean and free from particulate and impurity contamination, and is preferably aluminium terminated. The substrate 1500 can be outgassed at high temperature, cleaned by an oxygen plasma, and optionally followed by Al monolayer deposition 1530. Optionally, the Al-terminated surface can be further treated via an active nitrogen species suitable for the formation of an aluminium nitride (AlN) surface. For example, such a layer can be formed by plasma-enhanced CVD. Surface nitridation of the bare sapphire surface reduces Al diffusion into the Si film during initial epitaxy and reduces the formation of silicon-oxides at the heterointerface. A Si-precursor species 1540, such as Silane, is then decomposed upon the heated substrate 1500 to grow the Si layer or film. As described above, the Si film initially grows with a high concentration of defects (including twin defects) near the $Si/Al_2O_3$ interface, but the defect density decreases as a function of increasing film thickness beyond a critical thickness 1504, the subsequently grown region 1505 becoming essentially free of structural defects and being suitable for single crystal photovoltaic (PV) devices. As shown in the right-hand diagram of FIG. 11, ion implantation (e.g., of Si), can then be used to modify the structural properties of the defective region 1504 shown in FIGS. 10A and 10B, as described below.

Lateral Field Silicon on Sapphire Devices

FIGS. 12A and 12B are schematic diagrams of lateral field p-i-n devices on sapphire superstrates with fully depleted (FIG. 12A) and partially depleted (FIG. 12B) intrinsic silicon regions, respectively. The p-type (1803-P) and n-type (1805-N) regions can be formed by ion-implantation into a Si layer 1802 epitaxially grown on the Sapphire 1801. As described above, the "intrinsic" regions 1820 and 1821 are either NID or are doped to a low impurity concentration relative to the doped regions 1803-P, 1805-N. Indeed, the central "intrinsic" region 1821 of the partially depleted device in FIG. 12B is actually p-type, but is doped lightly compared to the relatively heavily doped p-type region 1803-P. The doping of this central region may be provided by the background doping of the as-grown silicon film, and/or may be introduced by ion implantation, for example.

As known by those skilled in the art, the relative doping concentrations of such regions is represented in the art by the use of superscript + and − symbols to represent high and low doping concentrations, respectively. Thus in this instance the general configuration of the three doped regions can be represented as either p-p$^-$-n or as p$^+$-p-n$^+$, depending on the absolute doping concentrations used in the three regions. Thus it should be understood that alternative embodiments of the lateral junctions described herein can be formed by regions having a wide variety of different combinations of doping concentrations, provided that the central region in the lateral stack of regions has a substantially lower doping concentration than either of the two doped regions on respective sides of the central region. It should therefore be understood that the central region in a lateral junction device, although typically described as being "intrinsic" in many of the described embodiments, can be undoped, p-type or n-type.

Metal contacts 1807 are made to the doped regions 1803-P and 1805-N via intermediate silicides 1806, using standard metallization methods known to those skilled in the art. A high quality dielectric passivation layer 1808 is used to improve the surface recombination properties of the Si film 1802. Additionally, the dielectric layer 1808 can incorporate substantial trapped electrical charge to control inversion and/or accumulation layers within the intrinsic layers 1820 and 1821.

Solar radiation 1830 is incident preferably (but not necessarily or exclusively) from the backside of the sapphire substrate (as shown) and is absorbed in the lateral p-i-n active region. Because the p-type regions 1803-P and the n-type regions 1805-N extend through the silicon layer 1802 to the underlying sapphire 1801, the entire thickness of each intrinsic layer 1820, 1821 is available for efficient collection of excess charge carriers created by the incident photons 1830. Depending upon the doping of the "intrinsic-layer" 1820, 1821, the extent of the depletion of that layer in the lateral p-i-n or p+-p-n+ or p-p⁻-n devices can vary with lateral position between the contact regions 1803-P and 1805-N, as represented schematically in FIG. 12B.

Figure 13:
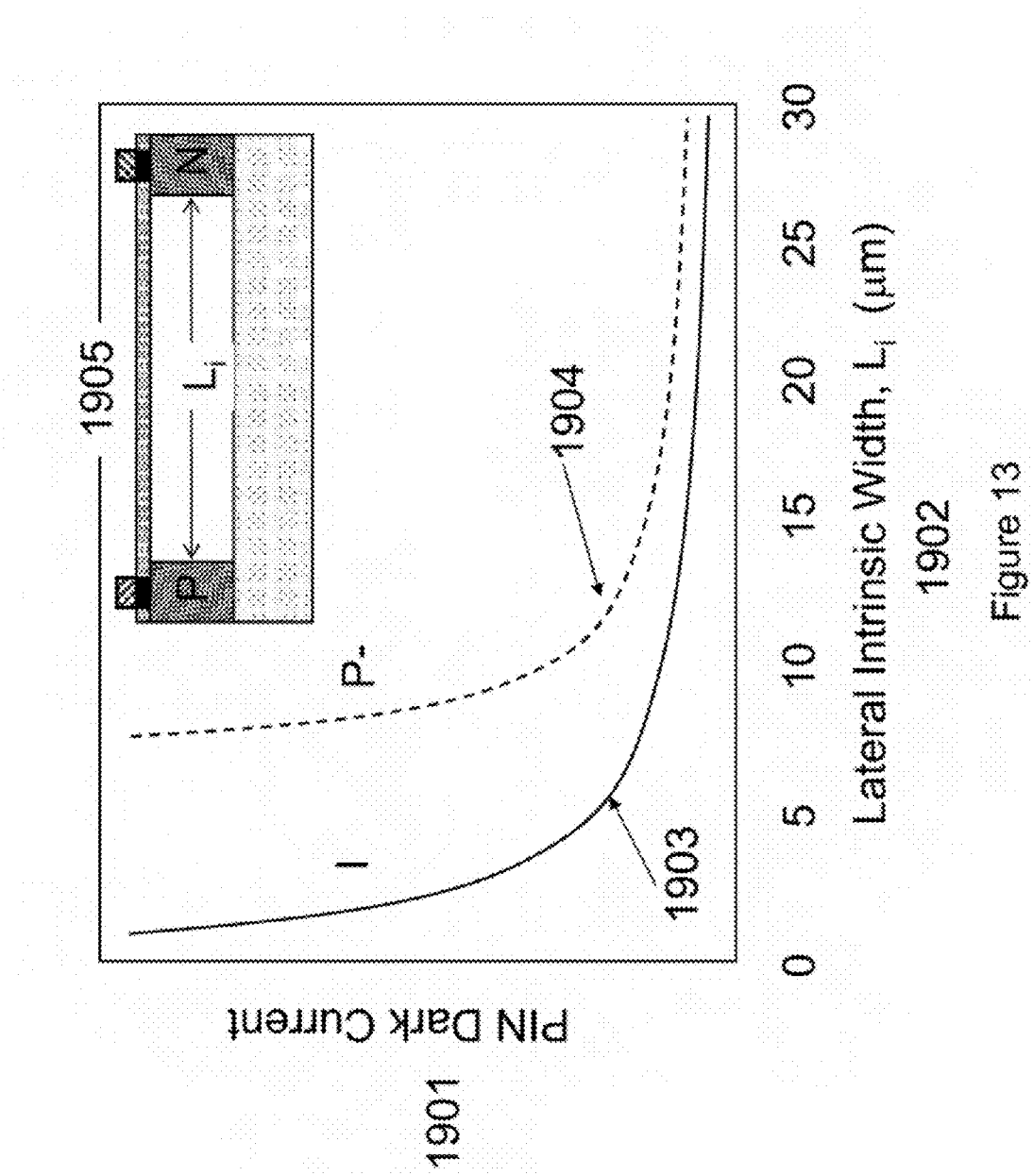
FIG. 13 is a schematic graph illustrating the relationship between the dark current in a p-i-n lateral junction SOS device and the width of the intrinsic region of the device.
Figure 14:
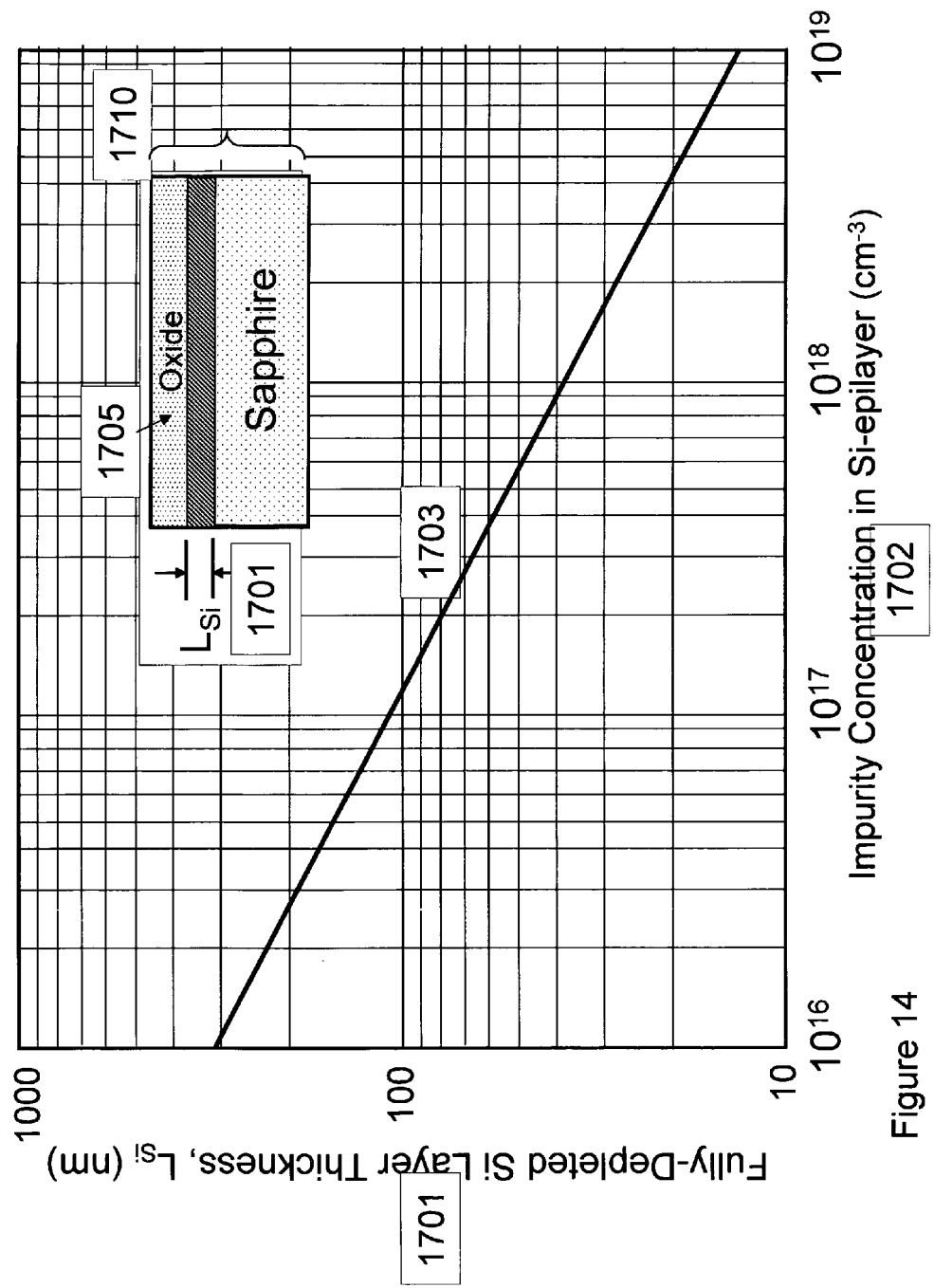
FIG. 14 is a graph of the thickness of fully-depleted silicon in an epitaxial silicon layer sandwiched between a sapphire substrate and an oxide capping layer as a function of the doping concentration in the silicon epilayer.

FIG. 13 is a graph representing the general trend of the dark current 1901 of a generic lateral field device 1905 as a function of the lateral intrinsic region length $L_i$ 1902 separating the p-type and n-type regions of the device 1905. The effect of uniformly and lightly doping the nominally 'intrinsic' region with a p-type dopant is to increase the dark current compared to a truly intrinsic region. However, the thickness of the Si epilayer can be selected so that the device will be fully depleted and thus will have a very low dark current. Referring to FIG. 14, the intrinsic regions of a 200 nm thick Si epi layer will be fully depleted if their doping concentration is less than about $3 \times 10^{16}$ cm$^{-3}$. Similarly, the "intrinsic" regions of a 1 micron thick Si epi layer will be fully depleted at doping concentrations less than about $1 \times 10^{14}$ cm$^{-3}$.

Processes for Producing Lateral Field Silicon on Sapphire Devices

The lateral field photovoltaic devices described herein can be formed using ion implantation, although other doping methods (including thermal diffusion or a combination of implantation and diffusion) can be alternatively used. FIGS. 15A to 15H depict the steps of a generalized process flow for preparing a high-quality single-crystal Si epi-layer on a single-crystal sapphire substrate and the subsequent formation of lateral PV devices and modules.

As shown in FIG. 15-A, the process begins at step 2000 with a clean single-crystal R-plane-cut sapphire substrate 2030, with optional misaligned and/or miscut surface from the true R-plane. At step 2001, the substrate surface is then optionally modified, for example by exposure to reactive nitrogen, oxygen, hydrogen, and/or aluminium species 2031, thereby forming a template layer 2032. The template layer can be a nitride-terminated surface that inhibits Al-atom diffusion into the overlying Si epilayer during its growth, and can be formed by exposure to a nitrogen plasma in a PECVD tool. Optionally, an aluminium oxide template layer having an Al ad-atom terminated surface can be prepared.

The next step 2002 exposes the substrate to a reactive species 2033 of Si atoms and/or a precursor gas (e.g., silane) suitable for the epitaxial growth of a Si layer on the substrate 2030. As described above, the portion 2034 of the resulting epitaxial Si layer within about ~150-200 nm of the interface with the sapphire surface is highly defective. Beyond that initial region 2034, the Si epilayer becomes markedly less defective, providing a low defect density region 2035. Generally, thick Si films 2035 grown close to or in excess of 1 μm attain a flatter topmost surface morphology than thinner layers close to the Si/sapphire interface, whose flatness is limited by the flatness of the underlying sapphire surface, which itself is ultimately limited by mechanical polishing.

As an alternative, step 2002 can expose the substrate to a reactive species 2033 of Si atoms and/or a precursor gas (e.g., silane) to deposit a polycrystalline layer on the substrate 2030. The polycrystalline layer is then subjected to a high temperature anneal (e.g., at least 30 minutes at a temperature between about 800° C. and 1300° C.) so that the film attains a crystal quality and flatness approaching that of epitaxially grown silicon. An optional pre-anneal implant with a species that encourages crystallization, such as boron, can further improve the crystal quality. A polysilicon film formed in this way can be substantially single crystal, because the sapphire and optional template layers act as seeds for local crystal growth and the ability of the sapphire substrate to withstand high temperatures enables substantial crystallization during the anneal process.

As shown in FIG. 15-B, steps 2003 and 2004 illustrate the removal of the defects confined predominately in the region 2034 close to the Si-sapphire interface by implanting ion species 2036 spatially confined to a Gaussian profile 2039 straddling the defective region 2034, as determined by the mass and energy of the implanted species. The implantation conditions are selected to fully amorphize the defective region 2034, resulting in an amorphous region 2041 separating a substantially high quality single crystal region 2040 from the sapphire substrate 2030. The implanted species can be an electrically inert species or a species that passivates dangling bonds. For example, where the semiconductor body is Si, the inert ion species can include Si and/or Ge, and the passivating species can include H and/or F. Where the species 2036 is Si, an amorphous layer can be formed by implanting Si ions to a fluence in the range of ~$10^{14}$-$10^{16}$ cm$^{-2}$, depending on temperature, ion energy and ion flux. Fluorine and/or hydrogen can also be implanted into the defective region 2034 to passivate dangling bonds and hence reduce the electrical activity of the implanted region.

It will be appreciated by those skilled in the art that the silicon layer can be fully amorphized by a combination of implant steps, where the ion energies and fluences are selected so that the amorphous regions formed by each implant step overlap to form a relatively thick, continuous amorphous layer. For example, a low energy silicon implant can be used to amorphize the surface region following an initial (higher energy) implantation step that forms a buried amorphous layer. Alternatively, the silicon layer can be fully amorphized in a single implant step by a suitable selection of implant conditions. In any case, the implants can be made through a sacrificial oxide layer grown to protect the surface from damage. Amorphous silicon layers formed using these ion implantation processes do not require the hydrogen precursors that are required when amorphous silicon layers are deposited. Incorporated hydrogen is known to be a principal cause of amorphous silicon solar cell degradation during exposure to UV light.

As shown in FIG. 15-C, the implanted superstrate is thermally processed to recrystallize the buried amorphous Si layer 2041 seeded by the overlying single crystal Si region 2040. Step 2005 of FIG. 15-C shows schematically the effect on the single crystal region surface in one embodiment in which the recrystallization is achieved by heating in an oxidizing environment, whereby a surface oxide layer 2042 is formed, with the growth front for Si consumption indicated by arrows 2045. The recrystallization front 2046 moves through the amorphous layer 2041, leaving behind a substantially single-crystal Si region 2043. The recrystallization step is preferably progressed until a single crystal Si region 2048 is formed in close proximity to or at the sapphire interface, beyond which point the oxide layer 2047 continues to grow, thereby reducing the thickness of the remaining single-crystal Si 2048 to a desired thickness. The oxide layer 2047 can then be removed (e.g., by an HF dip).

Figure 15A:
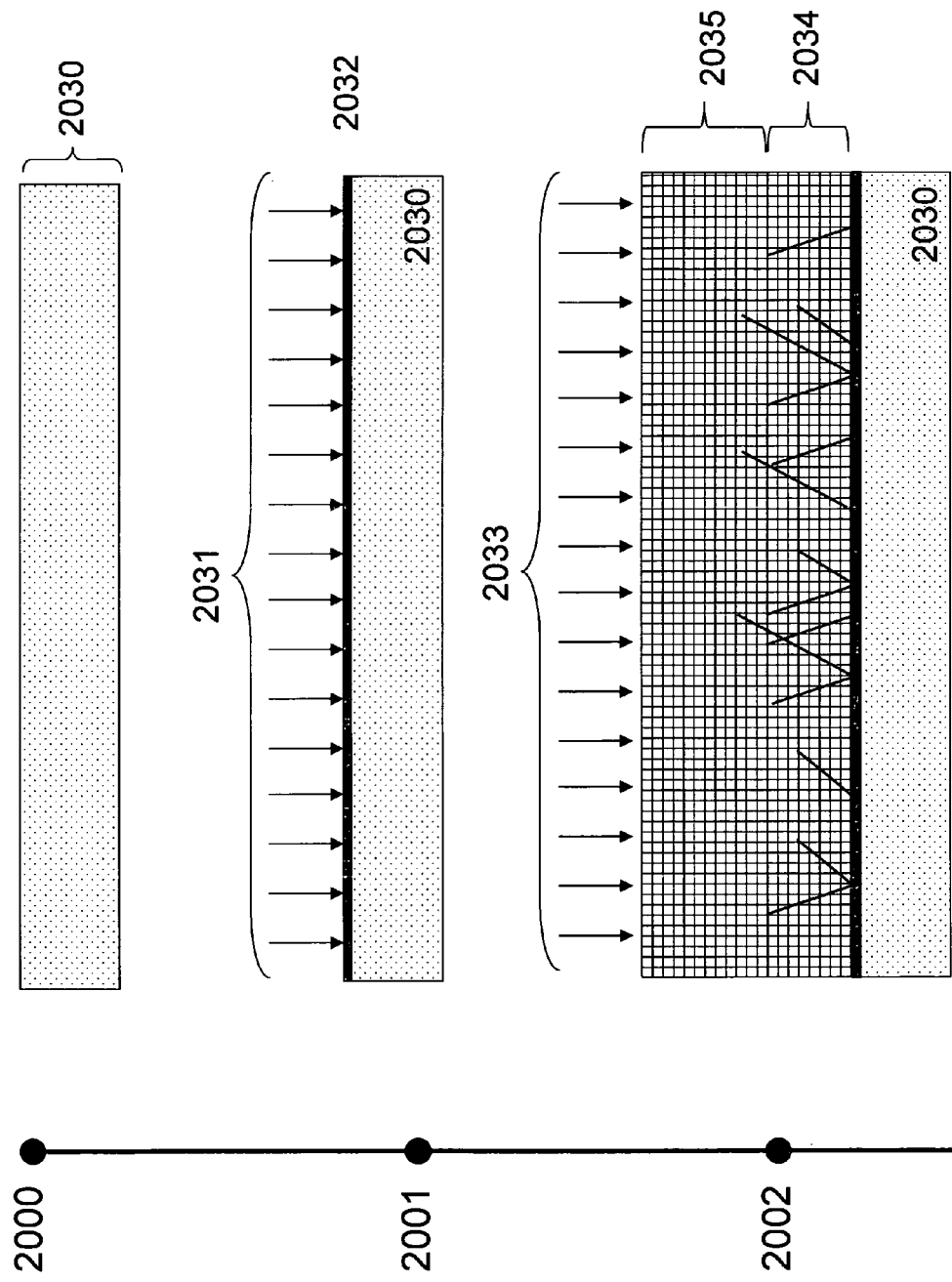
Figure 15B:
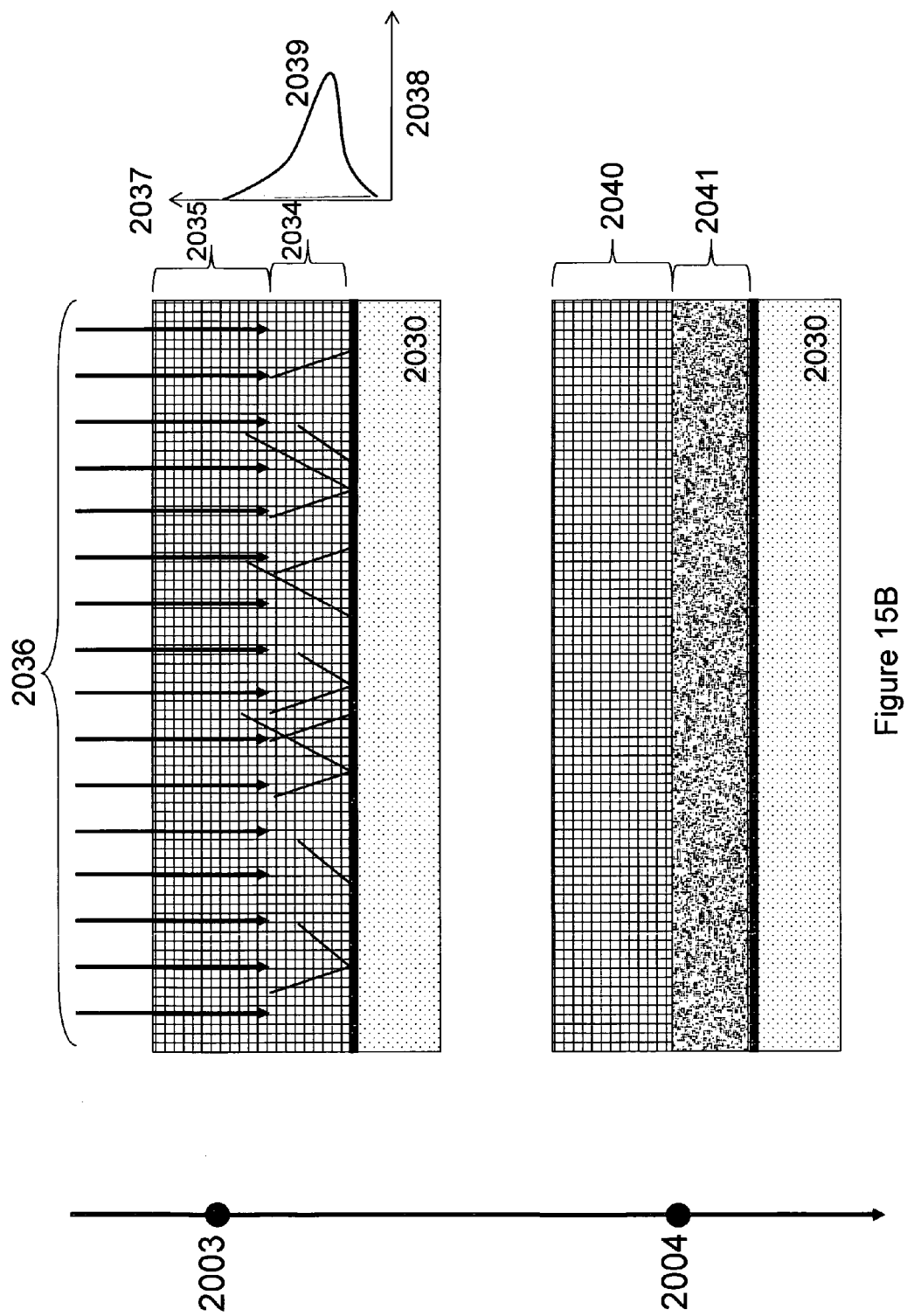
Figure 15D:
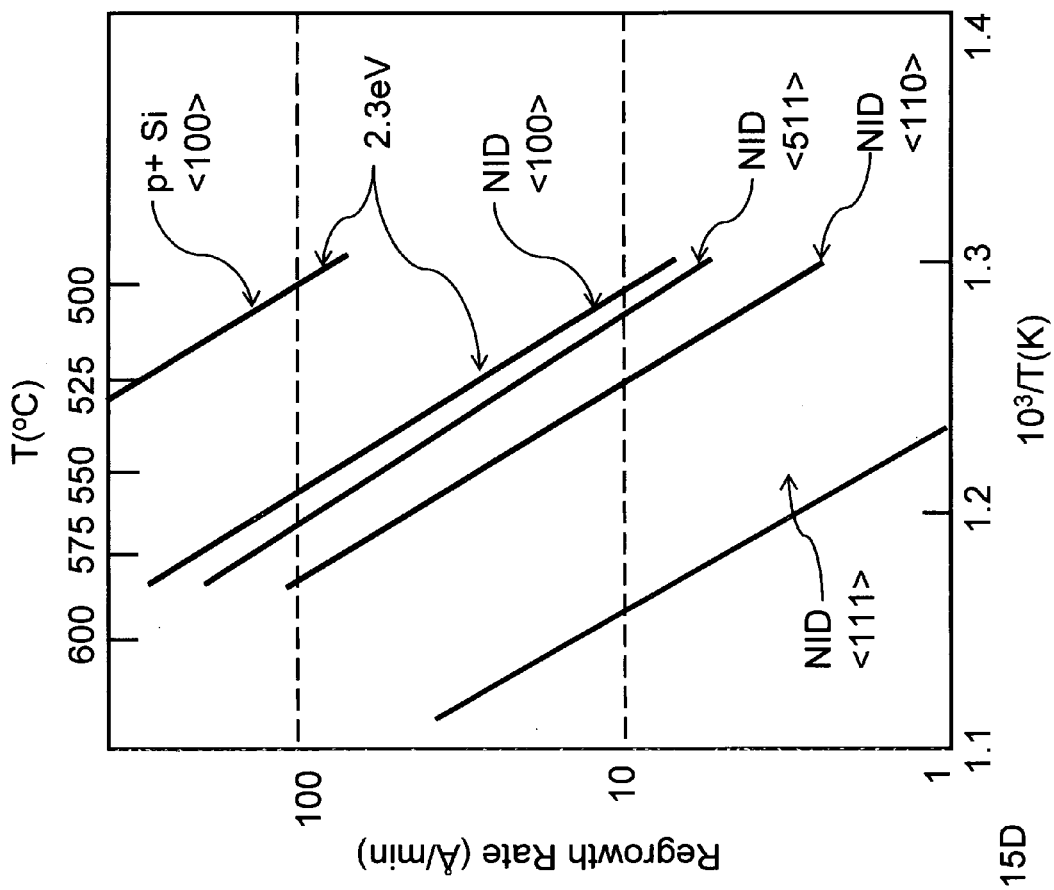

As known by those skilled in the art, the solid-phase epitaxial re-crystallization (SPE) of the amorphous Si 2041 proceeds at a rate that depends on temperature, doping, and crystal orientation. For example, rates for not intentionally doped (NID) silicon with a resistivity of approximately 200 Ohm-cm are shown in FIG. 15D.

The activation energy for SPE of a-Si→c-Si is 2.3 eV, implying that the process involves bond breaking at the interface between the amorphous and crystalline phases. The presence of impurities such as oxygen impedes the regrowth process because it binds to broken silicon bonds, forming Si—O. Conversely, dopants such as B, P, and As increase the re-growth rate by a factor of 10 for concentrations of the order of $10^{20}$ atoms/cm$^3$. The thermal budget required for SPE can therefore be reduced by implanting one of these dopants between the depth of the peak concentration of the amorphizing ion species and the Si surface. However, the resulting doping will affect the final thickness of Si required to form a fully depleted structure. In any case, and in particular if a fully depleted Si epilayer is not required, the implantation of additional dopants can be used to substantially increase the SPE regrowth rate and thus reduce the thermal budget required to achieve it.

If the implantation conditions are not sufficient to create fully amorphous layer, lattice repair occurs by the generation and diffusion of point defects. This process has a much higher activation energy of ~5 eV and requires temperatures on the order of 900° C. to remove all of the extended defects. It is therefore easier in many cases to repair a fully amorphized layer than a partially damaged one, hence the general desirability of fully amorphizing the defective growth region close to the Si/sapphire interface.

However, it should be understood that the removal of the crystalline defects close to the Si/Sapphire interface and the complete elimination of grain boundaries may not be required in order to produce a high efficiency solar cell. That is, the methods and device configurations described herein can be used either with or without those defects or grain boundaries being present, although for convenience the embodiments described below do not include those defects.

Figure 15E:
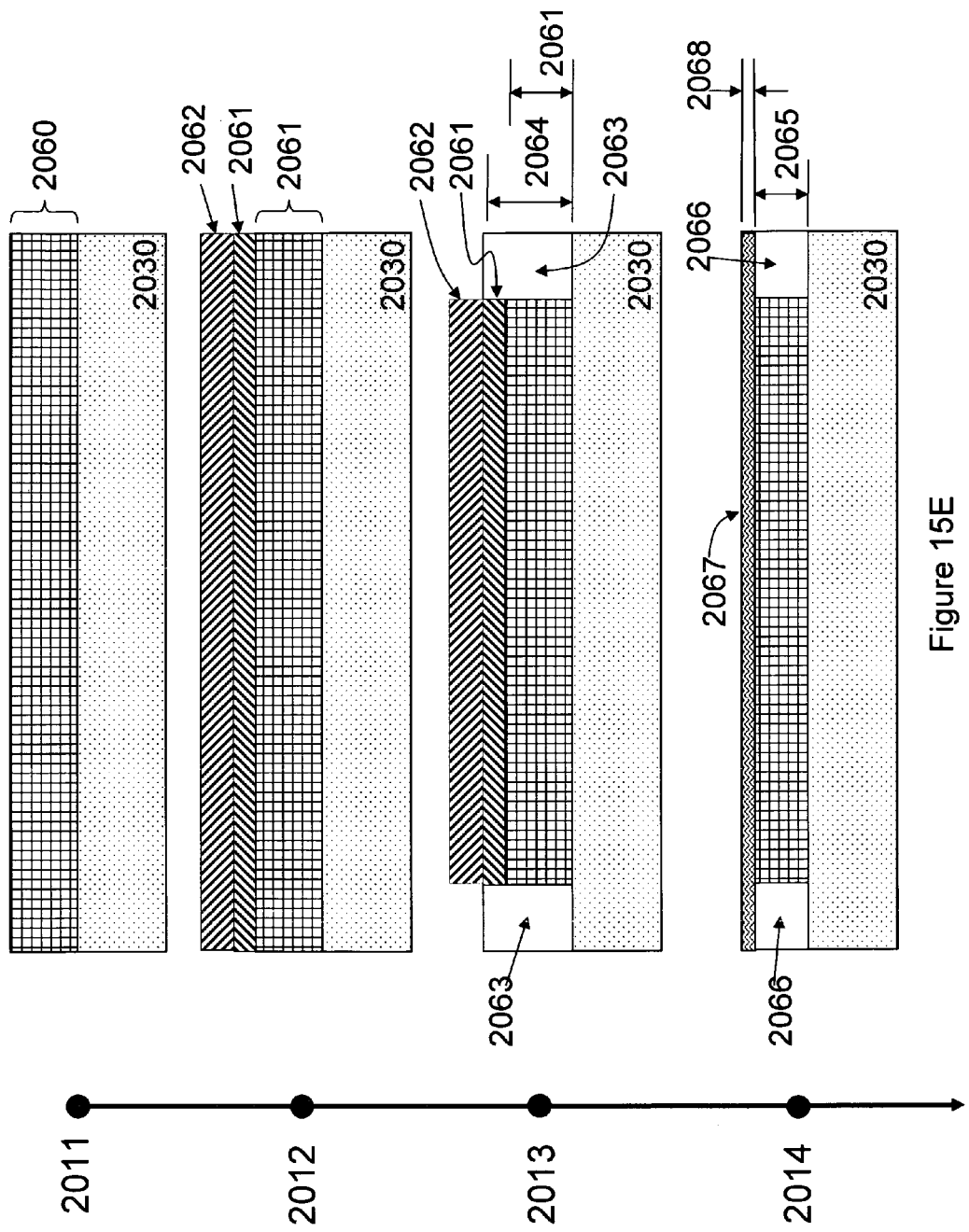
Figure 15F:
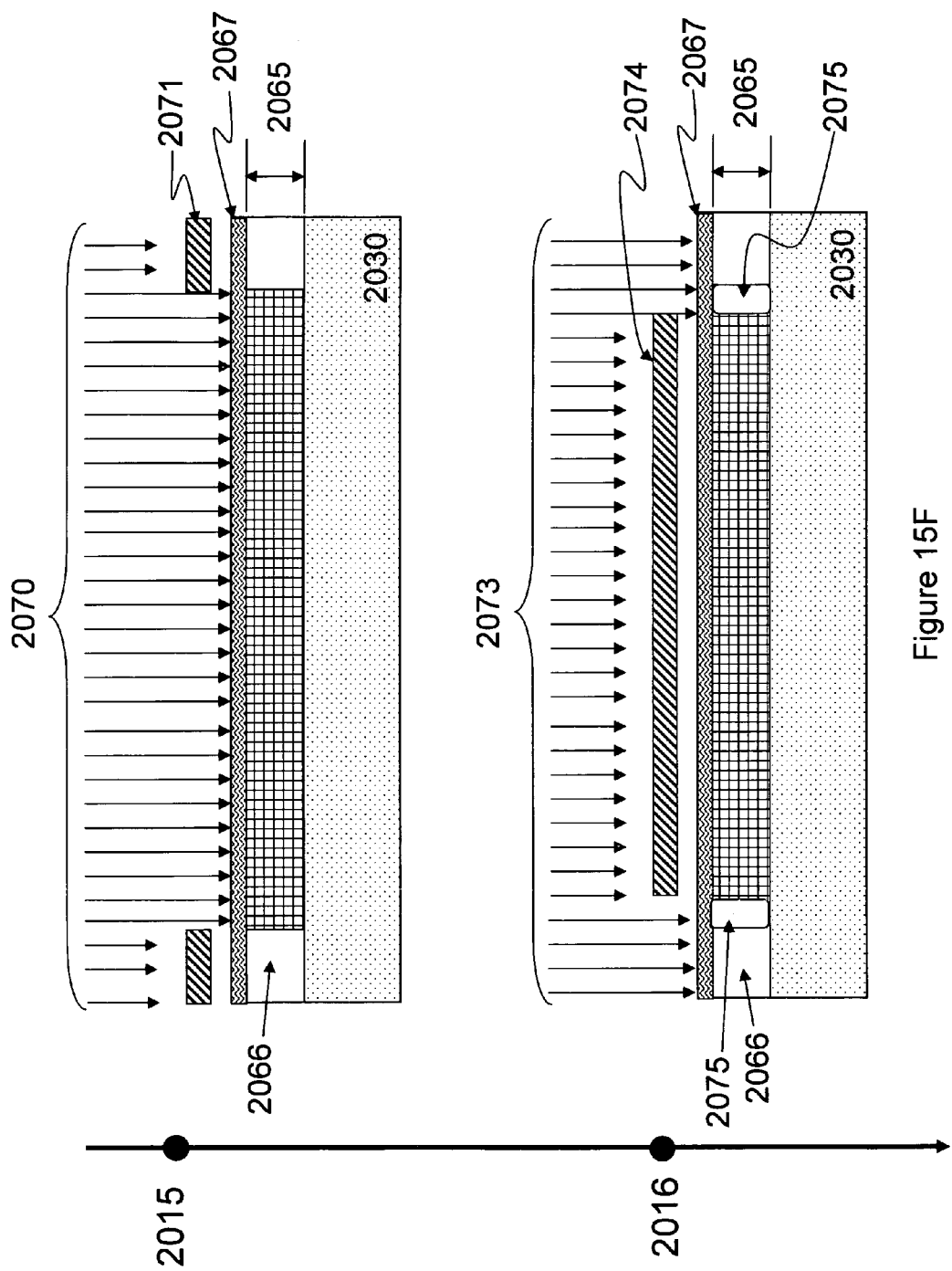
Figure 15G:
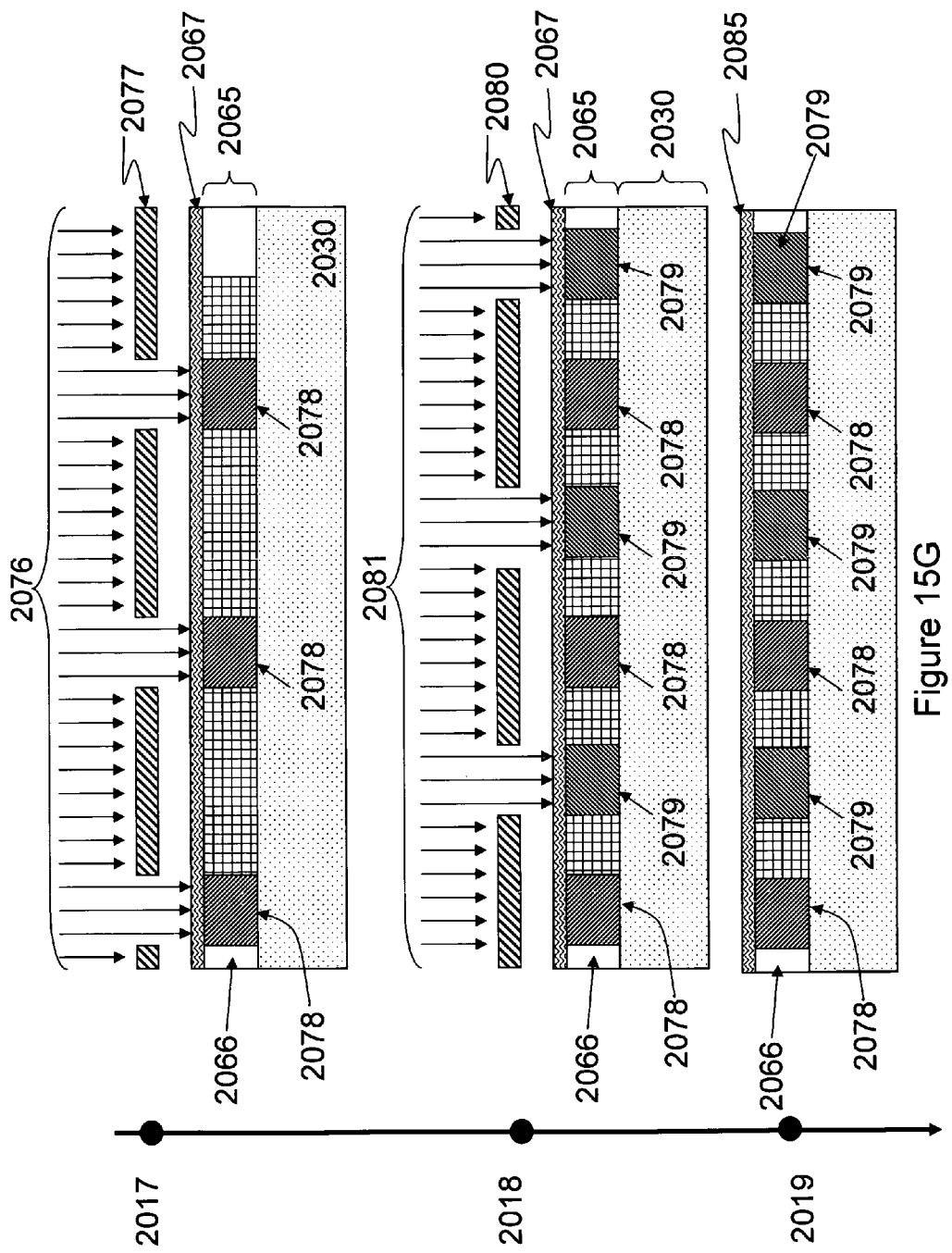
Figure 15H:
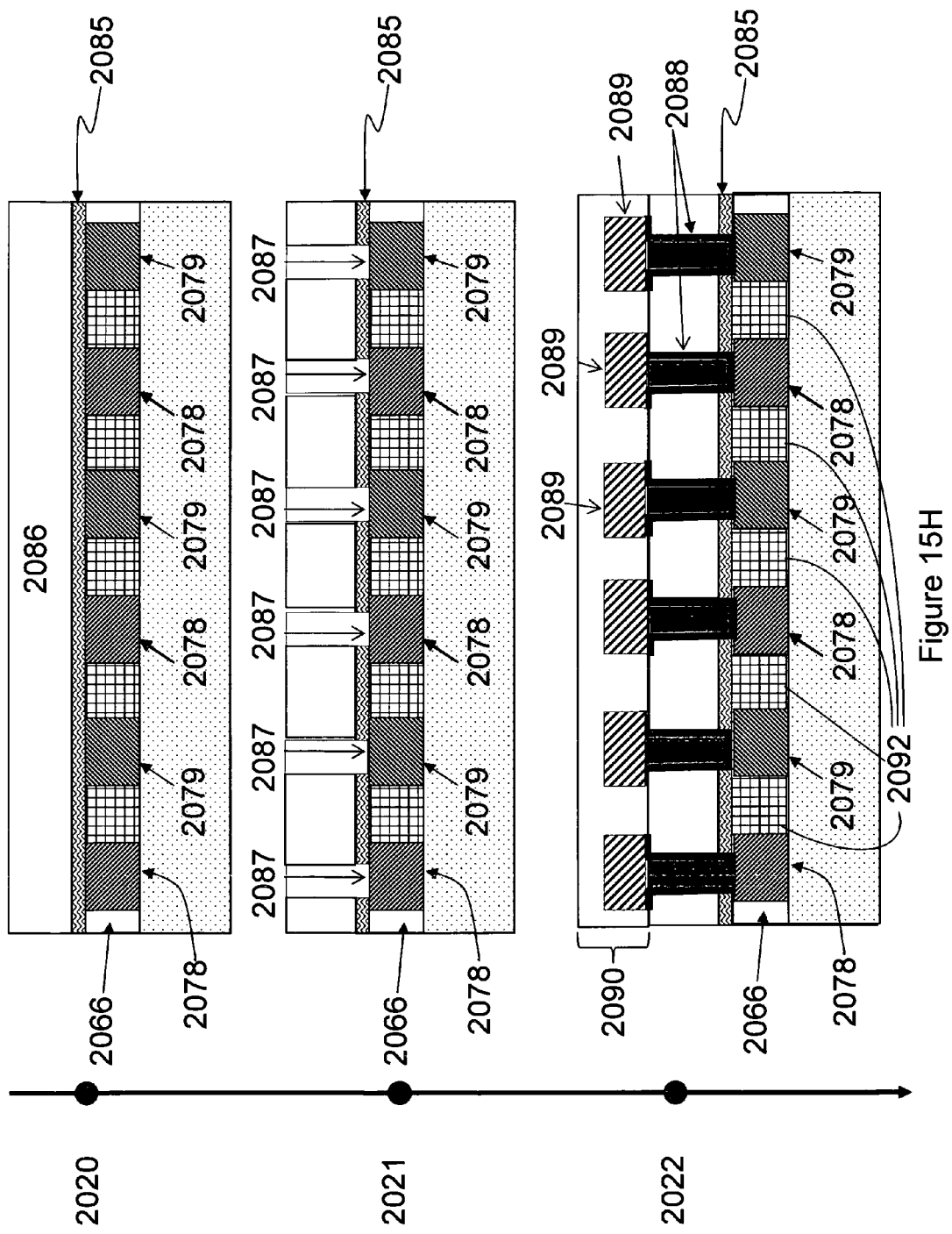

Referring to FIG. 15E, a single crystal Si layer 2060 disposed upon an insulating sapphire substrate 2030 is prepared at step 2011 by any one of the processes described above. At step 2012, a PAD oxide (PADOX) coating on the Si-on-sapphire article is formed by native or low temperature grown SiO$_2$ 2061, followed by a layer of Si$_3$N$_4$ 2062. The thickness of the PADOX 2061 may be between 100 Å and 200 Å, and the thickness of the nitride layer may be between 1000 Å and 5000 Å. At step 2013, selected areas of the nitride 2062 and PADOX 2061 are opened (using standard lithography methods) to expose the underlying Si, and a field oxide (FOX) 2063 is grown by a standard LOCalized Oxidation of Silicon (LOCOS) process for electrical isolation. At step 2014, the nitride mask 2062 is stripped and the resulting structure is capped with an oxide layer 2067 of thickness 2068, thermally grown by wet oxidation. The oxide layer may be between 500 Å and 1000 Å thick. The c-Si layer thickness 2065 is slightly diminished during these steps. Step 2015 of FIG. 15-F illustrates the selective area implantation of the active Si area with an implant species 2070 and conditions chosen to adjust the turn-on threshold properties of the devices described herein. The threshold adjustment step 2015 improves the open-circuit voltage $V_{OC}$ of PV devices, thereby enhancing the energy conversion efficiency. Step 2016 illustrates an optional edge implantation with dopant species 2073 to dope the edge regions 2075 (by way of an implant mask 2074) between the FOX 2066 and Si active areas (AA).

Steps 2017 and 2018 of FIG. 15-G illustrate respective masked implantation steps that are used to respectively form doped regions 2078 and 2079 of opposite doping polarities. As shown at step 2019, the resulting structure is an alternating {p-i-n-i-p-...}, as was generally described above and shown in FIG. 6. At step 2019, the capping oxide layer 2067 is stripped and a native oxide layer 2085 grown.

Steps 2020 and 2021 of FIG. 15-H represent the deposition and patterning of an insulating oxide layer 2086 and the subsequent etching 2087 of both the deposited oxide 2086 and the underlying native oxide 2085 to expose the doped Si regions 2078 and 2079. At step 2022, barrier layer(s) and metallic contacts 2088 are sequentially deposited on to the doped regions 2078 and 2079 exposed by the openings in the deposited oxide layer 2086 and onto the sidewalls of those openings to form contact plugs that fill the openings. Metal interconnects 2089 are then formed on the plugs and embedded in an insulating glass layer 2090. The glass layer can be formed using standard BPSG reflow and spin-on glass processes and are typically between 5000 and 10,000 Å thick. The contact holes in the oxide layer 2086 can be formed by conventional dry etch processes. The metal interconnects can be formed by conventional sputter deposition processes.

The device of step 2022 represents a general lateral field photovoltaic cell with planar metallic interconnect. The sapphire substrate is used to couple solar radiation to the active semiconductor regions 2092, 2078, and 2079 where electron-hole pairs are generated by incident photons and are collected to provide electrical energy, as described above.

The lateral field photovoltaic cells described herein can be formed in single crystal, poly-crystalline, or amorphous semiconductors, or a combination of single-crystal, poly-crystalline and/or amorphous forms. FIG. 16A illustrates a lateral photovoltaic cell formed in an amorphous silicon layer 5302 on a sapphire substrate 5301. The amorphous layer 5302 can be formed in the amorphous layer 5302 as described above. Doped 5303-P, 5303-N and intrinsic 5303-I regions can be formed as described above. The bandgap energy of amorphous silicon is typically approximately 1.5 eV, which is larger than that of crystalline silicon, which is typically approximately 1.1 eV. Therefore, forming lateral photovoltaic cells in amorphous silicon enables the cells to be tuned to different parts of the solar spectrum.

FIG. 16B illustrates an embodiment in which a lateral field photovoltaic cell is formed in a composite phase thin film consisting of amorphous silicon 5304 and single-crystal silicon layers 5305 formed on a sapphire substrate 5301. The dual, amorphous-single crystal thin film can be formed by eliminating the re-crystallization step 2005 of the implantation and amorphisation process described above. Such a device provides pairs of parallel PIN diodes, one formed in amorphous silicon 5304 and one formed in single-crystal silicon 5305. The two diodes can thus be tuned to capture different portions of the solar spectrum.

FIG. 16C illustrates an embodiment of a lateral field photovoltaic cell having amorphous intrinsic regions 5307-I and single crystal doped regions 5307-N and 5307-P. The amorphous intrinsic regions 5307-I can be formed by selected-area or masked implantation of silicon or other suitable species into a single-crystal silicon thin film. This configuration enables the exploitation of the superior conductivity of crystalline silicon to reduce the series resistance in otherwise amorphous silicon solar cells.

It will be appreciated by those skilled in the art that many such combinations of different phases or forms of semiconductor can be used to provide different lateral field photovoltaic cell architectures.

Forming Deeply Doped Regions

Figure 17A:
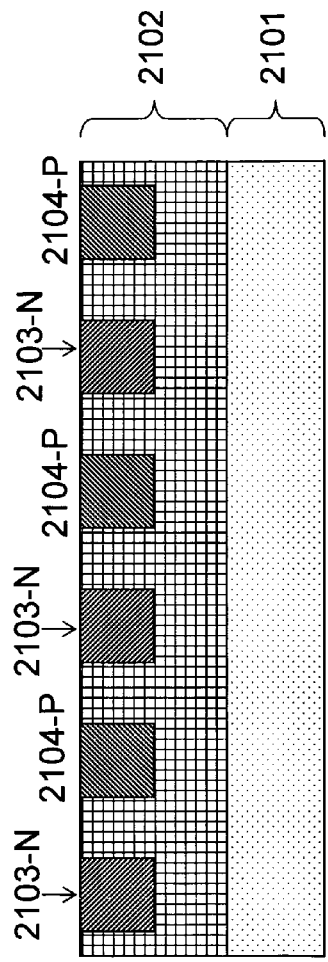
FIGS. 17A to 17C are schematic side-views illustrating different configurations of intrinsic and p-type and n-type doped regions that can be formed in the silicon epi-layer.
Figure 17B:
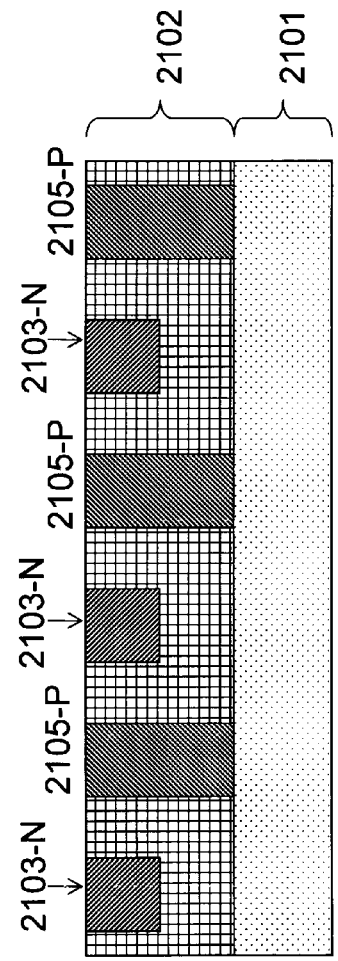
Figure 17C:
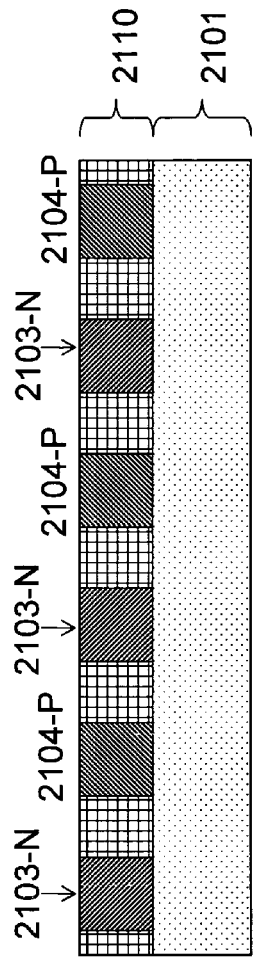

FIGS. 17A, 17B, and 17C are schematic cross-sectional side views illustrating how the energy of the implanted dopant ions can be controlled to determine the depth of the doped regions into the Si layer. The thickness of the Si layer 2102, 2110 itself can of course also be controlled as desired.

The ion-implantation energy can be tuned for variable depth modification of Si, ranging from shallow (<0.1 μm) to deep (≥1 μm) implants. Typically, impurity ions/dopants can be introduced into Si at areal doses ranging from about $10^{11}$ to $10^{16}$ cm$^{-2}$. High energy oxygen or hydrogen implants are used for non-standard CMOS processes, such as SIMOX and wafer splitting, respectively. For example, p- and n-type doping of a 110 nm Si film on sapphire requires energies of approximately 15 keV for Boron and 40 keV for Phosphorous, whereas a 1 μm layer of Si requires a substantially higher energy implant of at least 450 keV for Boron and 900 keV for Phosphorus. The wide range of implant energies used in current standard and non-standard CMOS process steps can be readily utilized to form the lateral field devices described herein.

Figure 17D:
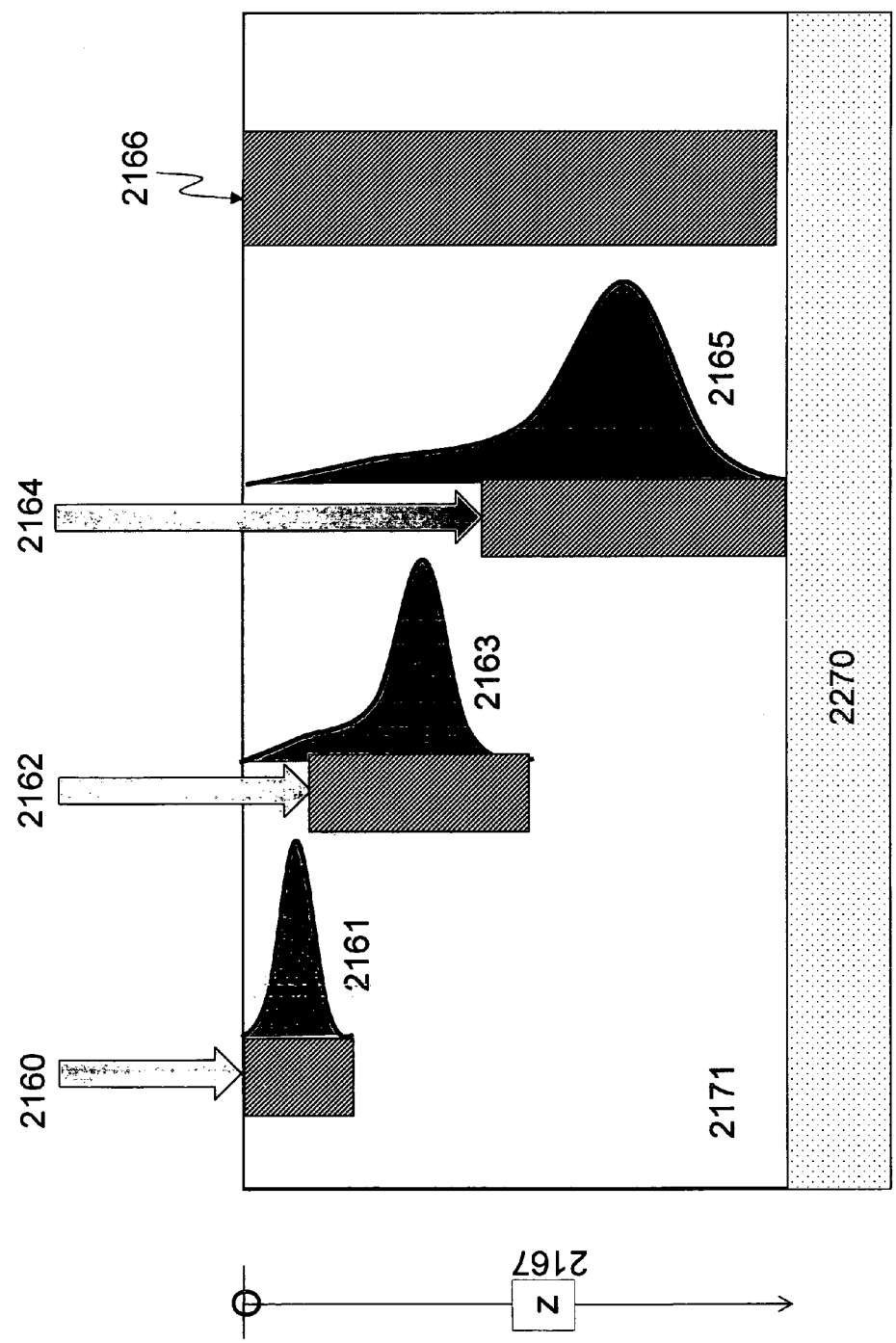
FIG. 17D is a schematic side-view illustrating how multiple ion implantation steps with different energies and ion fluences can be used to form a doped region of relatively uniform dopant concentration throughout the thickness of the silicon layer.

In order to form deep and relatively uniform dopant profiles in thick film Si-on-insulator, it is possible to perform multiple energy implants 2160, 2162 an 2164, as shown in FIG. 17D. Alternatively, deep, relatively uniform dopant profiles can be formed by diffusion through the silicon surface or by a combination of implantation and surface diffusion. In some embodiments, a low energy 2160 implant is used to form a shallow dopant region 2161 and higher energy implants are used to form deeper implant regions 2163, 2165. Using the same mask but variable energy, a continuously doped region 2166 can be formed. Software is available to calculate the energies and fluences required to provide a substantially uniform dopant concentration with depth.

Having described example processes for fabrication lateral field silicon-on-sapphire devices, several device topologies are described below in detail.

Lateral Field Device Topologies

Figure 18A:
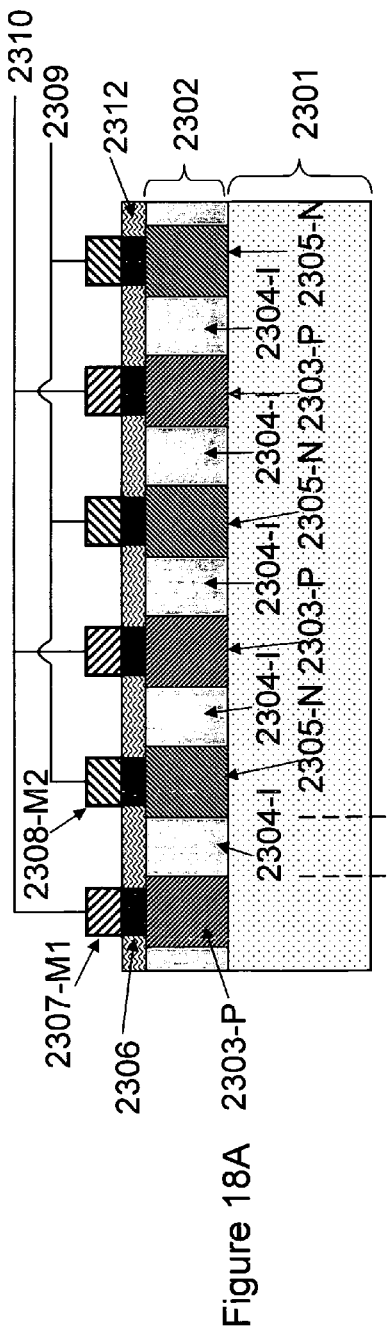
FIGS. 18A and 18B are schematic cross-sectional side view and plan views, respectively, of one embodiment of an interdigitated finger or comb structure of doped regions formed in the silicon layer, and the associated interconnect fabric.

One form of lateral p-i-n device implemented in a thin film silicon layer on a sapphire superstrate is shown in FIGS. 18A to 18D. FIG. 18A is a schematic cross-sectional side view of a periodic array of lateral field p-i-n diodes interconnected in parallel. P-type 2303-P and n-type 2305-N regions are formed by implantation into a NID silicon layer 2302, thereby defining intrinsic regions 2304-I. The p-i-n diodes are interconnected via metallic contacts 2306, 2307 and 2308. As will be appreciated by those skilled in the art, the metallizations can be different to provide low resistance Ohmic contacts to the n-type or p-type Si regions. The back-to-back p-i-n diodes are interconnected via top metallization layers M1 and M2, which are not shown in FIG. 18A for clarity. The metal interconnect layers are embedded in insulating layers and can be close packed.

Figure 18B:
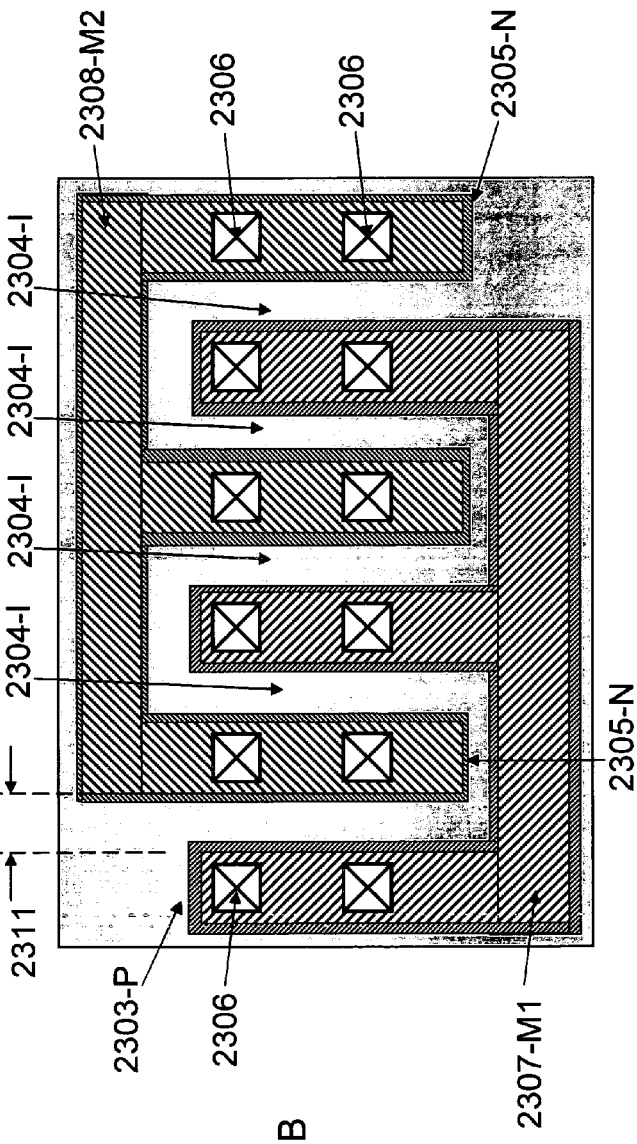

A very efficient packing scheme is shown in plan view in FIG. 18B wherein an interdigitated finger or comb configuration is utilized. The doped regions form interdigitated combs of alternating doping types and a substantially constant intrinsic layer width 2311. Contact plugs or vias 2306 connect the doped regions to the overlying metal interconnect fabric. A dielectric and/or surface passivation layer 2312 is used to protect those portions of the Si surface that are not contacted by the silicide 2306. Photocurrent is extracted from metal bus lines 2307-M1 and 2308-M2.

The metal interconnect fabric can also be used to form reflection surfaces that redirect unabsorbed solar radiation that passes through the sapphire substrate 2301 and the silicon layer 2302 back into the active regions of the silicon layer 2302. Furthermore, regular interconnect patterns can be configured to provide diffractive elements that trap light within the Si layer 2302, thereby increasing the conversion efficiency of the device. Not shown is the optical radiation entering the backside of the sapphire substrate 2301 and generating EHPs within the lateral p-i-n devices.

Figure 18C:
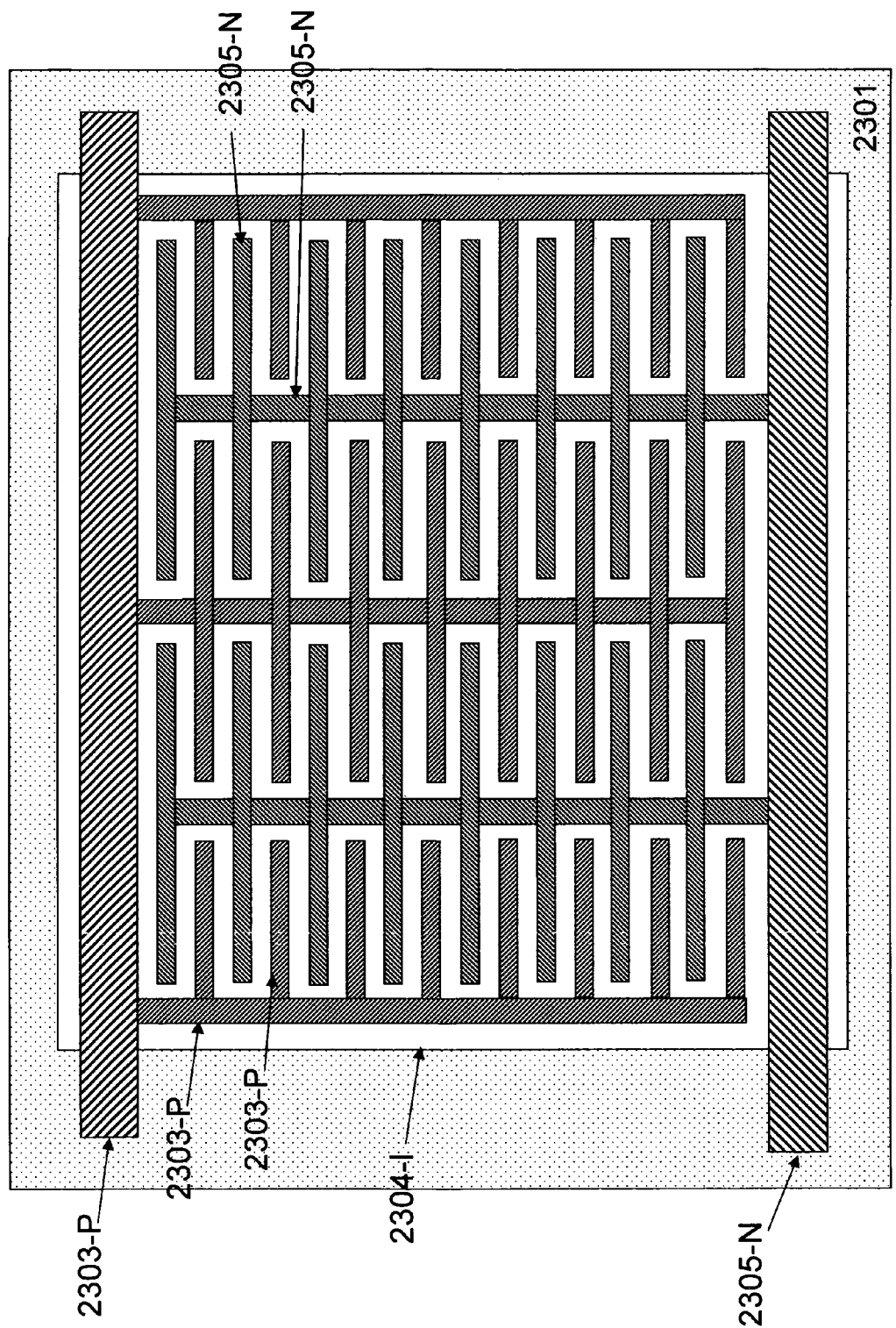
FIGS. 18C, 18D, and 18E are schematic plan views of respective further embodiments of interdigitated finger structures.
Figure 18D:
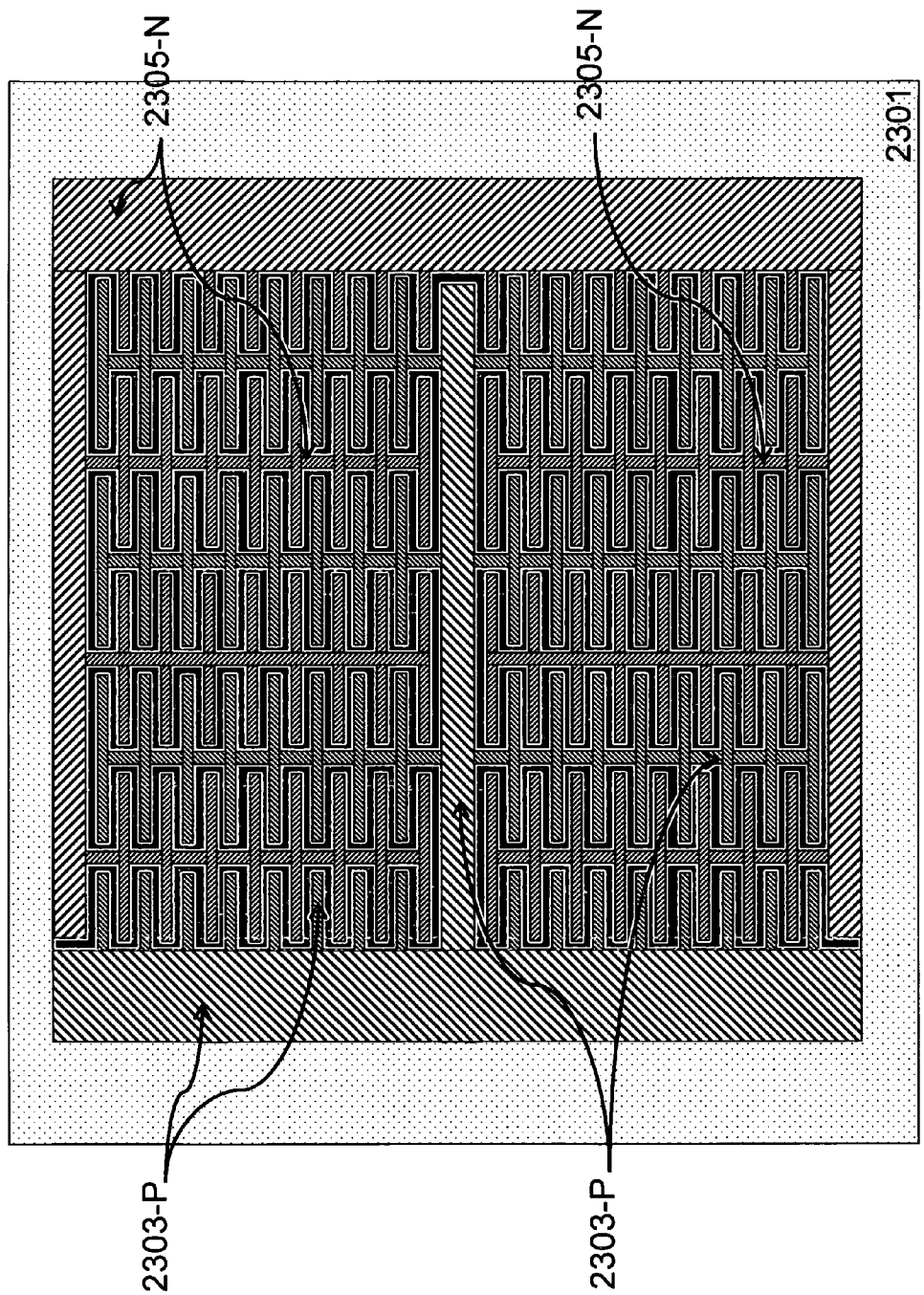
Figure 18E:
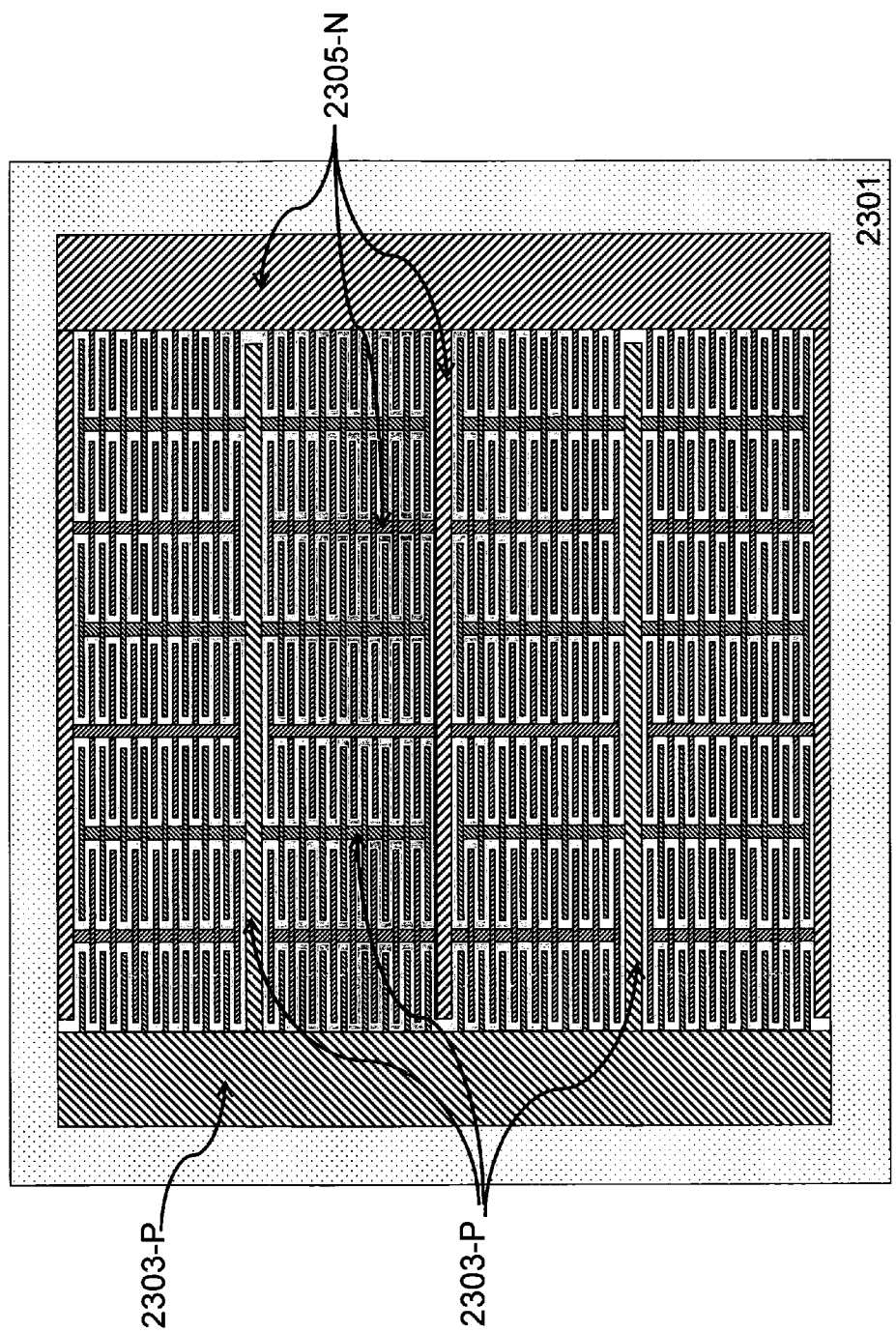

FIGS. 18C, 18D and 18E illustrate further embodiments of lateral interdigititated doped regions formed by ion implantation and photolithographic techniques. The hierarchical connections of these distributed arrays of p-i-n cells enable the total series resistance to be dramatically reduced relative to a single p-i-n unit cell of equivalent total area. Series resistance is a key parameter for the optimization of $V_{OC}$ for PV applications.

Figure 19:
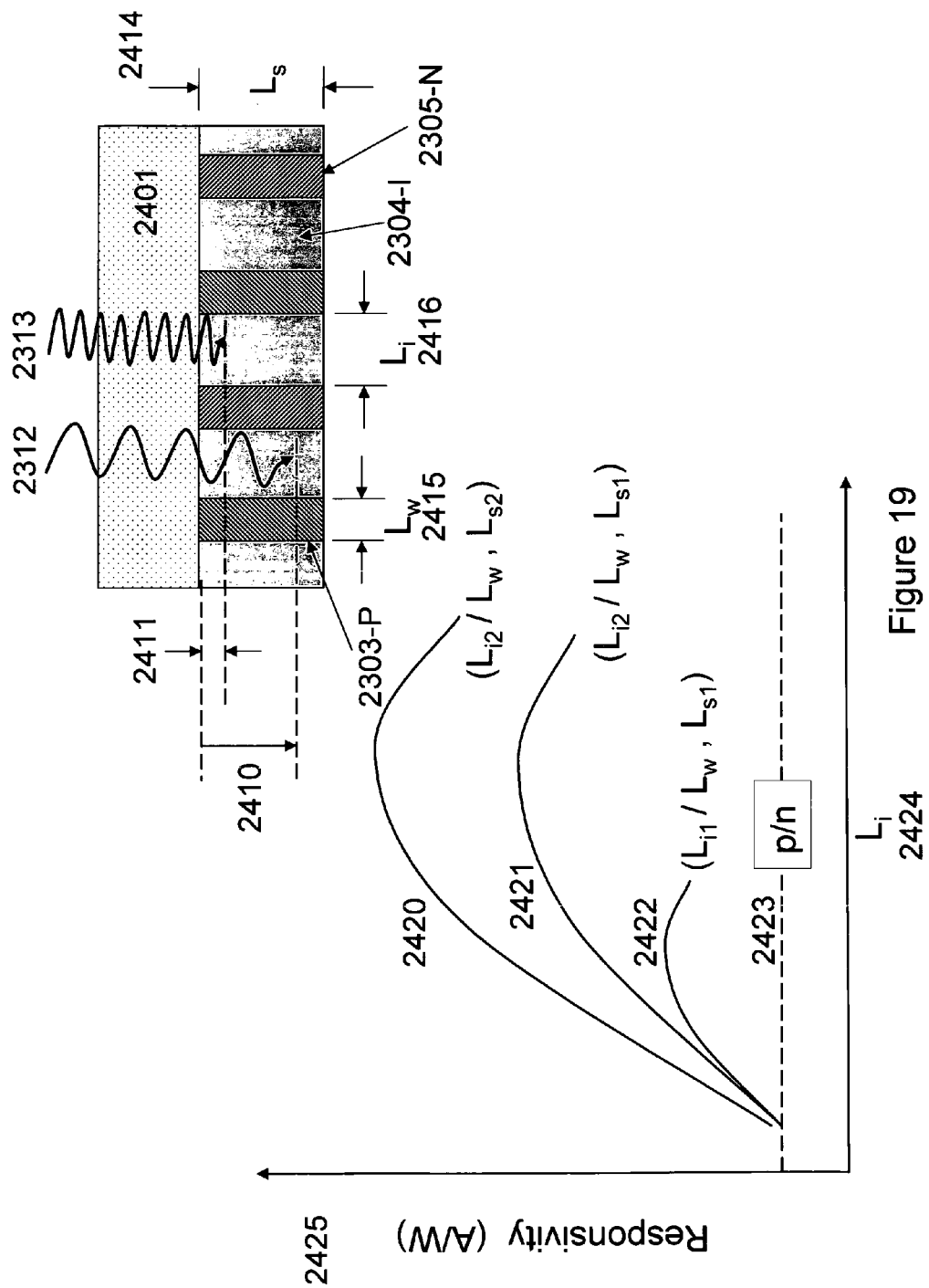
FIG. 19 is a schematic diagram illustrating the relationship between the responsivity of a lateral junction p-i-n photovoltaic device and the lateral widths of the doped and intrinsic regions and the thickness of the silicon epi-layer.

The operation of these devices is now described. The lateral p-i-n PV devices implemented in silicon-on-sapphire provide solar energy conversion efficiencies well beyond those of prior art Si vertical junction devices. FIG. 19 illustrates the influence of the incident photon wavelengths 2312 and 2313, intrinsic layer width 2416, and the Si epilayer thickness 2414 on the performance of the lateral field SoS devices.

The responsivity 2425, defined as the generated photocurrent divided by the input optical power, is a function of the Si epilayer material quality, the processing steps used during manufacture, the device geometry, and the wavelength of the incident light. The graph in FIG. 19 depicts the general trend of the responsivity 2425 as a function of the lateral intrinsic layer width $L_i$ 2416 for three different combinations of technology factors and incident photon energies, and where the ratio $L_i/L_w$ is content (i.e., $L_w$ is varied with $L_i$), where $L_{i2}>L_{i1}$ and $L_{s2}>L_{s1}$. Comparison of the responsivity curves 2422 and 2421 shows the general trend of increasing the intrinsic layer width $L_i$ 2416 relative to the doped region width $L_w$ 2415: increasing the mark-space ratio of the swept 'intrinsic' region relative to the doped regions increases the collection efficiency of EHPs for a given Si film thickness $L_{s1}$. Comparison of curves 2420 and 2421 shows that, for a given p-i-n finger width configuration (i.e., value of $L_i/L_w$), increasing the Si film thickness increases the available absorption depth and hence the number of EHPs created within the device. Curves 2421 and 2420 represent the corresponding increase in responsivity 2425 due to increasing the Si film thickness from $L_{s1}$ to $L_{s2}$, respectively.

For comparison, a vertical p-n device of the form shown in FIG. 3 will have a constant responsivity 2423 for a given emitter layer thickness and depletion width, as represented by the dashed line 2423.

FIGS. 20A and 20B are cross-sectional side views of two embodiments with the same device pitch but different widths 2511, 2512 of the doped regions and correspondingly different widths 2514 and 2513 of the intrinsic regions. Depending upon the material properties of the silicon film, an optimal geometry can be determined by parametric searches of the device responsivity, such as the curves shown in FIG. 19. For single crystal silicon films, factors such as low intrinsic region mobility effectively limit the practical width of the intrinsic regions to no more than about 20 micrometers. For polysilicon films, the maximum practical width is no more than 5 microns. For amorphous silicon films, the maximum practical width is no more than 1 micron. The minimum width of the doped regions is typically determined by photolithographic control and alignment. For the equivalent of a 0.25 micron silicon CMOS manufacturing process, the minimum width is between three and five microns. Typically, this is substantially less than the minority carrier diffusion length of single crystal silicon and poly-crystalline silicon, but larger than the minority carrier diffusion length of amorphous silicon. Thus, relatively high performance amorphous silicon devices can be produced by setting the widths of the doped regions at the minimum value allowable by the lithographic capability of the process, which increases the charge carrier collection efficiency at the expense of increased series resistance. In contrast, the greater minority carrier diffusion length in single-crystal and poly-crystalline devices allows the widths of the doped regions to be increased to reduce the series resistance of the device, whilst having little effect on the charge carrier collection efficiency.

Figure 21B:
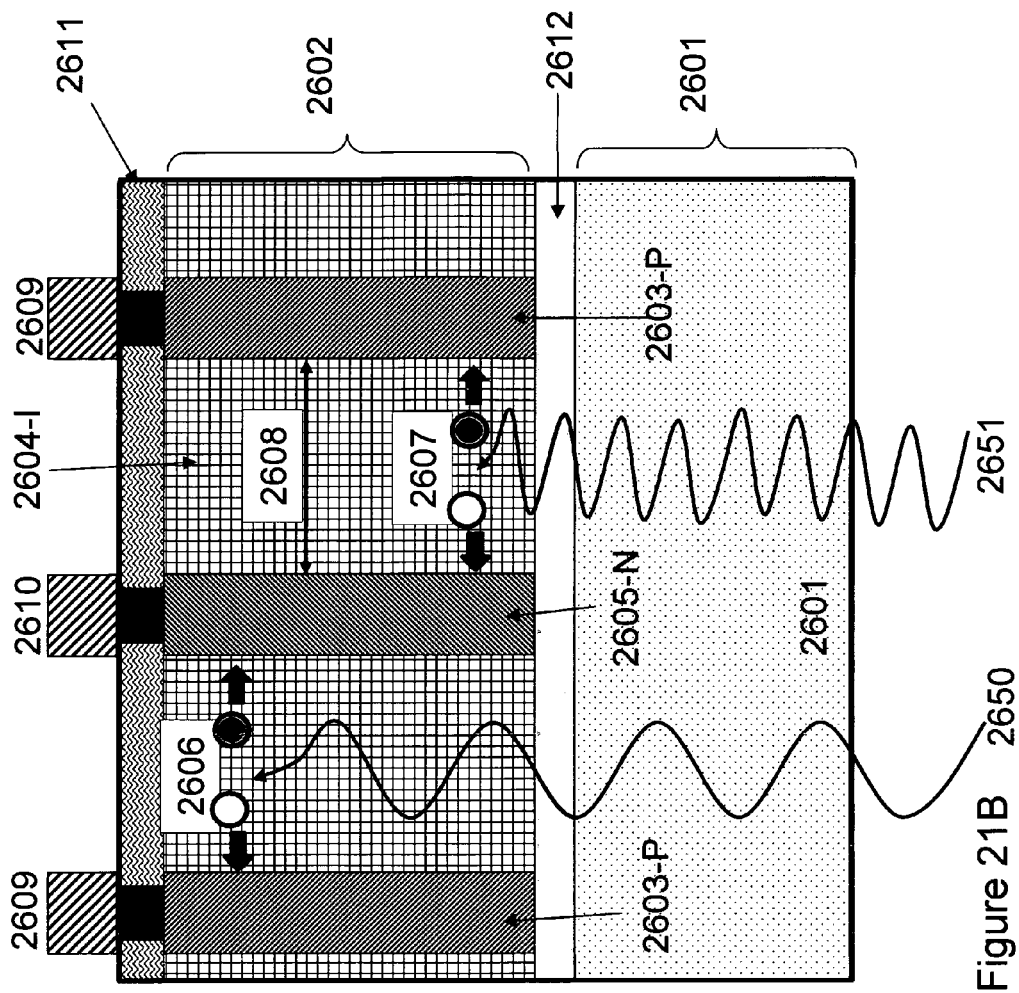
Figure 21A:
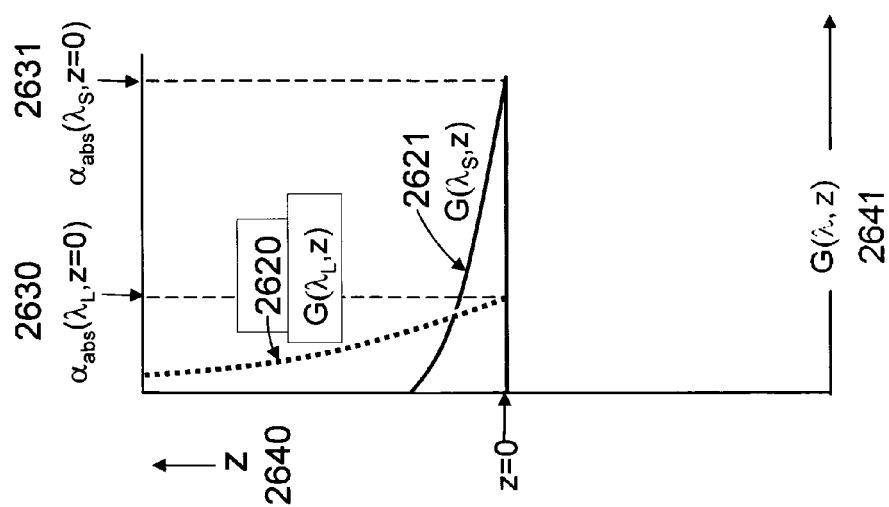

FIG. 21 further demonstrates the unique function enabled by configuring the device so that the electric field is substantially orthogonal to the photons normally incident (or substantially so) on the device. FIG. 21A is a graph of the generation rate $G(\lambda,z)$ of EHPs as a function of penetration depth z into the Si film from the Si/sapphire interface for the two cases of incident photons of long wavelength $\lambda_L$ (dotted curve 2620) and short wavelength $\lambda_s$ (solid curve 2621).

FIG. 21B shows representative spatial locations of EHPs 2607 and 2606 generated by short (2651) and long (2650) wavelength photons, respectively. EHPs 2607 generated by the high energy photons are created close to the Si/sapphire interface due to their high absorption co-efficient in Si, and are therefore completely absorbed in a short depth. In silicon, photons with wavelengths of 400 nm or less are absorbed at depths of less than 100 nm from the silicon surface. In contrast, long wavelength photons with energies in the vicinity of the indirect band edge of Si are absorbed throughout the entire thickness of the silicon layer 2602 because their absorption coefficient is very low. For the same reasons, the total number of EHPs and the rate of exponential decay are smaller for these long wavelength photons than for high energy photons.

Referring to FIGS. 21A and 21B, the high energy absorbed photons produce EHPs 2607 over a short range of penetration depths given by the solid curve 2621 in FIG. 21A. Similarly, the low energy absorbed photons produce EHPs 2606 over a broad range of penetration depth given by the dashed curve 2620. If the intrinsic region width 2608 is such that the EHPs 2607 generated by the high energy photons 2651 can be efficiently collected by electrodes 2610 and 2609 (e.g., the width $L_i$ 2608 is between one and a hundred microns), then those EHPs (and the high energy photons that created them) can contribute substantially to the total photocurrent generated. The utilization of the solar spectrum is thus increased above that attainable by standard vertical p-n junction PV devices.

Device Modeling

Unlike vertical p-i-n photodiodes where the incident optical radiation is substantially parallel to the electric field across the intrinsic region, the lateral p-i-n devices described herein require a two-dimensional (2-D) analysis due to the substantially orthogonal nature of optical propagation and carrier transport therein. Clearly, as $G(\lambda,z)$ is dependent upon wavelength and depth, the EHP carrier concentrations vary with depth (z) and lateral (x) positions. A diffusive current density $J_{nz}$ in the z-direction 2640 acts to equalize the carrier concentrations.

The continuity equation of minority carriers can be represented by a 2-D simple model according to:

$$\frac{1}{q}\left[\frac{\partial J_{nx}(x,z)}{\partial x}+\frac{\partial J_{nz}(x,z)}{\partial z}\right]+G(\lambda,z)-\frac{n_e(x,z)}{\tau}=0$$

where q is the electron charge, $J_{nz}$ is the diffusive current density in the z-direction, $J_{nx}$ is the diffusive current density in the lateral x-direction, $n_e(x,z)$ is the excess carrier concentration of electrons, and z is the carrier lifetime. For simplicity, assuming quasi-neutral diffusion currents only, the components can be written as:

$$J_{nx}=q\cdot D_n\frac{\partial n_e(x,z)}{\partial x}$$
$$J_{nz}=q\cdot D_n\frac{\partial n_e(x,z)}{\partial z}$$

where $D_n$ is the diffusion coefficient. Separating the continuity equation into respective spatial components gives the coupled equations:

$$\frac{1}{q}\left[\frac{\partial J_{nx}(x,z)}{\partial x}\right]+G_x(\lambda,x,z)-\frac{n_e(x,z)}{\tau}=0$$
$$\frac{1}{q}\left[\frac{\partial J_{nz}(x,z)}{\partial z}\right]+G(\lambda,z)-G_x(\lambda,x,z)=0$$

where $G_x(\lambda,x,z)$ is expressly written as the lateral component of the total optical generation rate of EHPs. The volume recombination term $n_e(x,z)/\tau$ takes into account the Si film thickness $L_{Si}$ and the diffusion length $L_{Diff}=\sqrt{D_n\tau}$. For the case of an ultrathin Si film, for example $L_{Si}\sim100$ nm, the carriers can diffuse vertically without significant volume recombination if $L_{Si}\ll L_{Diff}$. Conversely, for thick films, for example $L_{Si}\geq1$ μm, there may be significant volume recombination and this should be taken into account.

Anti-Reflection Structures

A cost effective and flexible optical design for light collection is highly desirable in high performance solar cells. An ideal anti-reflection (AR) structure would provide zero reflection loss for incident solar radiation on solar cell surfaces over a broad spectral range, and for all angles of incidence. Such a coating is referred to as an omnidirectional anti-reflection (OAR) coating. OARs potentially eliminate the requirement for mechanical tracking of the solar module device for optimum optical alignment of the solar cell with respect to incident sunlight.

Figure 22:
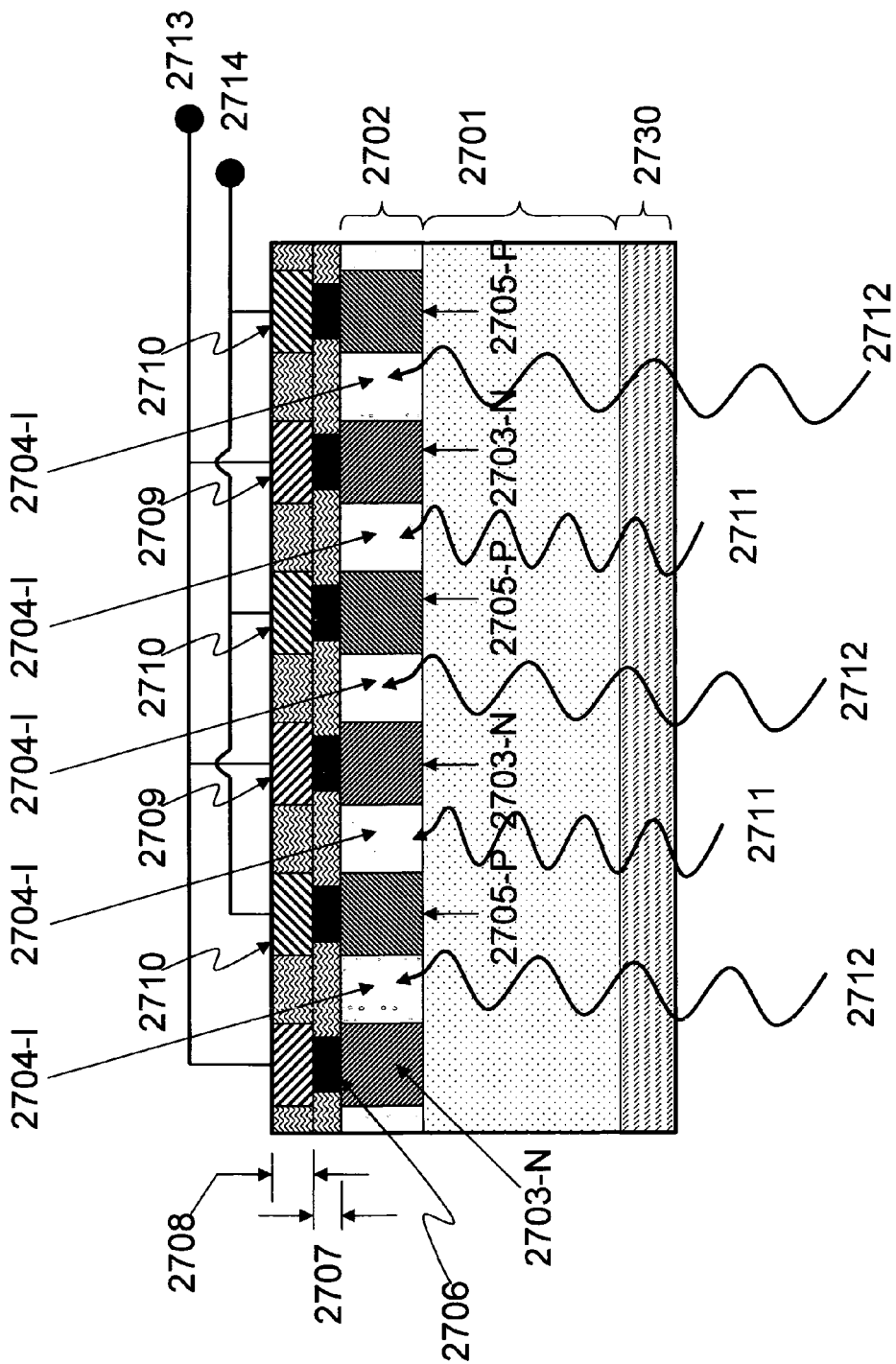
FIG. 22 is a schematic cross-sectional side view of a lateral junction SOS device with a front-side anti-reflection layer formed by deposition or surface modification.

An anti-reflection coating (ARC) is used to efficiently couple solar radiation into the silicon-on-sapphire superstrate. FIG. 22 shows an embodiment of a lateral p-i-n Si-on-sapphire device with an ARC 2730 formed by deposition or surface modification, such as texturing. The sapphire surface can be textured using an acidic etchant such as HF or $H_3PO_4$. In some embodiments, close to zero reflection over a wide spectral range is achieved by forming an additional layer of low refractive index material (e.g.: SiNx) on microscale structures formed by etching the sapphire surface.

Optically Active Components

FIG. 23 is a cross-sectional side view of an embodiment that further illustrates the utility of providing a CMOS-style two-metal layer metal interconnect fabric overlaying lateral junction devices in a Si-on-sapphire superstrate. A two-level metallization scheme is shown, with a first metal layer M-1 including a metal interconnect 2805 embedded within an insulating and/or low dielectric material 2807. Similarly, a second metal layer M-2 includes an interconnect metal 2806 embedded within an insulating layer 2808. A reflector and/or encapsulant layer 2809 such as silicon nitride is also shown and is further utilized for photon recycling back into the active layer 2801. The relative ranking of refractive indices, $n(SiO_2) < n(Al_2O_3) < n(SiN_x)$, in this embodiment acts to trap internally reflected light in the silicon layer, thereby increasing the likelihood of absorption.

Figures 23A, 23B:
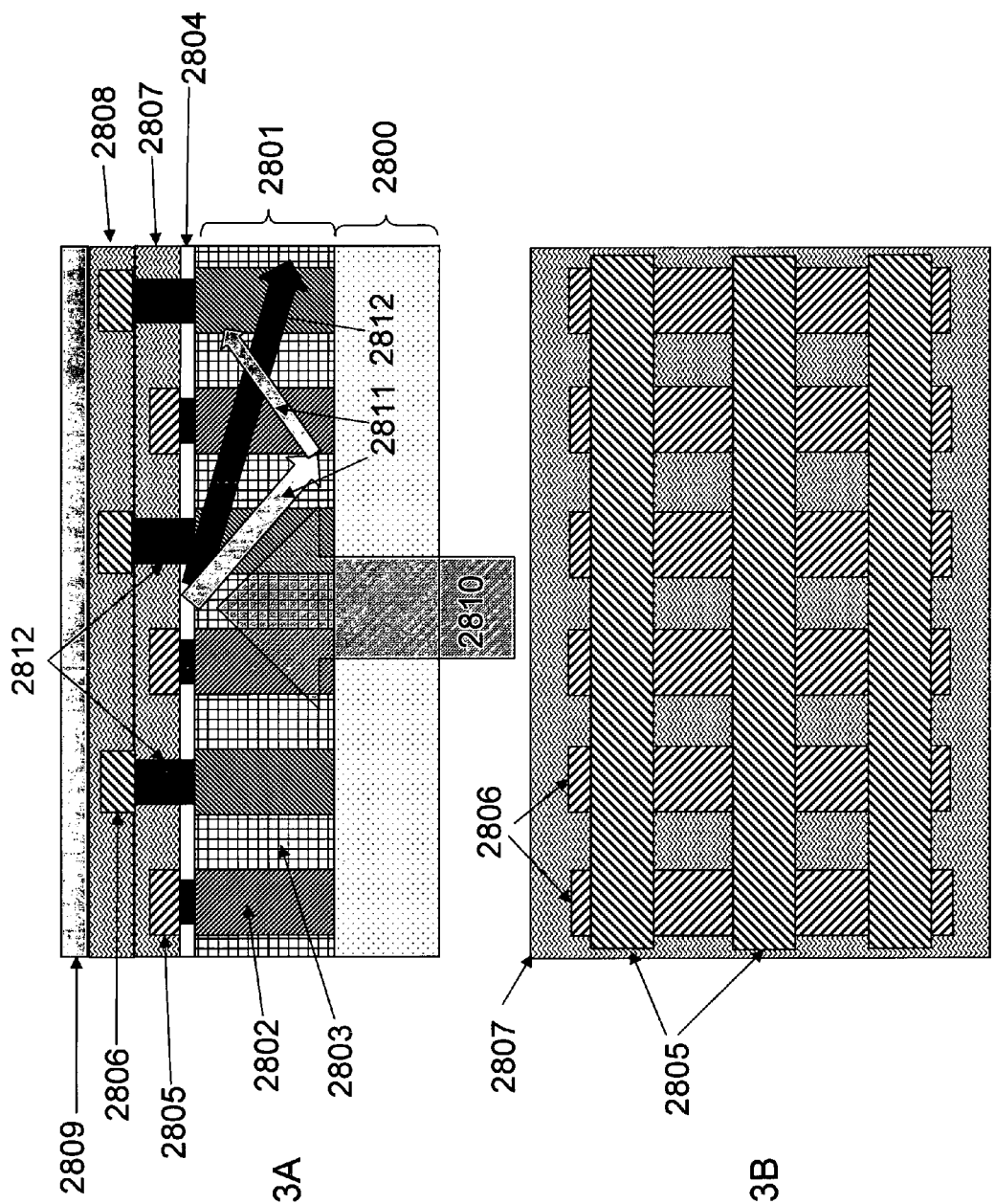
FIGS. 23A and 23B are cross-sectional side and plan views, respectively, of a lateral junction SOS device in which an interconnect fabric is used to return unabsorbed photons that pass through the silicon layer back into the silicon layer where they are trapped by total internal reflection.

FIG. 23B shows in plan view an example metal fabric geometry with perpendicular metal interconnect bus bars 2805 (M-2) and 2806 (M-1). The pitch spacing between the metal lines can be made sufficiently small, typically one to five microns, using standard lithographic patterning techniques, to function as an optically diffractive element. The effect of the resulting optically active metal interconnect layers 2807 is to produce diffracted optical beams 2811, 2812, as shown in FIG. 23A, in two dimensions, with an optical path length difference between M-1 and M-2 for incident multi-wavelength solar radiation 2810. The diffracted orders spatially separate the various wavelengths of the solar radiation so as to direct a portion of the incident optical energy into propagation vectors 2812 substantially in the plane of the active layer 2801. The refractive index contrast between the sapphire substrate 2800 and the active layer semiconductor 2801 enables light coupled into the active layer 2801 to be trapped via total internal reflection.

Figure 24:
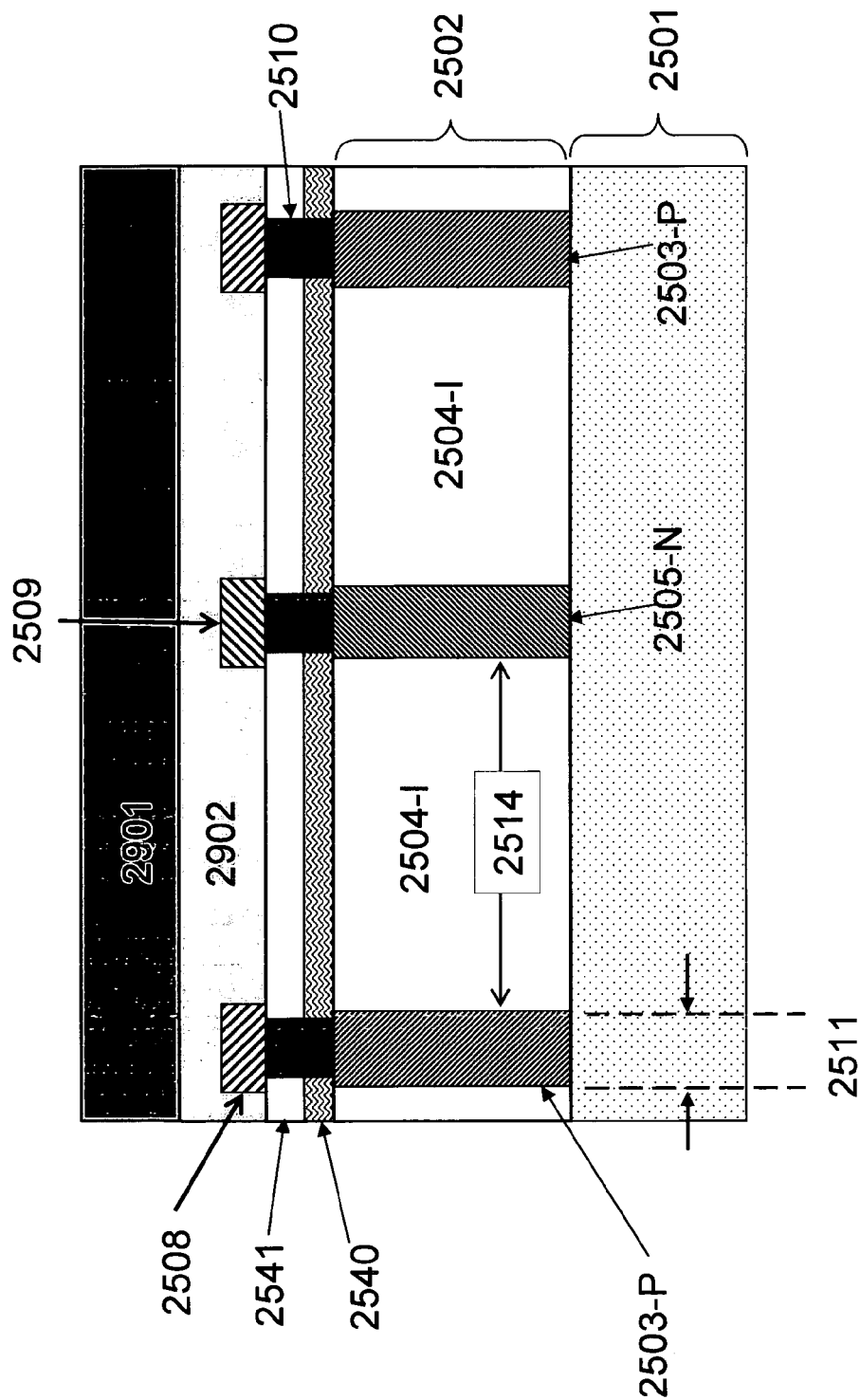
FIG. 24 is a schematic cross-sectional side view of a lateral junction SOS device in which multi-layer dielectric materials are used to reflect solar radiation back into the silicon layer for subsequent absorption.

As shown schematically in FIG. 24, in some embodiments multilayer dielectric materials 2540, 2541, 2902 are used to reflect solar radiation that was not absorbed on a first pass through the active regions 2502 back into the active region 2502 for subsequent absorption. The lateral p-i-n diode regions 2503-P/2504-I/2505-N are shown and the electrodes 2508 and 2508 are embedded within interconnect dielectric layers 2541 and 2902. A protective dielectric and/or insulating layer 2540 serves to reduce surface recombination at the semiconductor/insulator interface. These layers 2540, 2541 and 2902 can be formed from standard materials such as $SiO_2$, PBSG, PSG and BSG silicate glasses and silicon nitride passivation layers.

Figure 25:
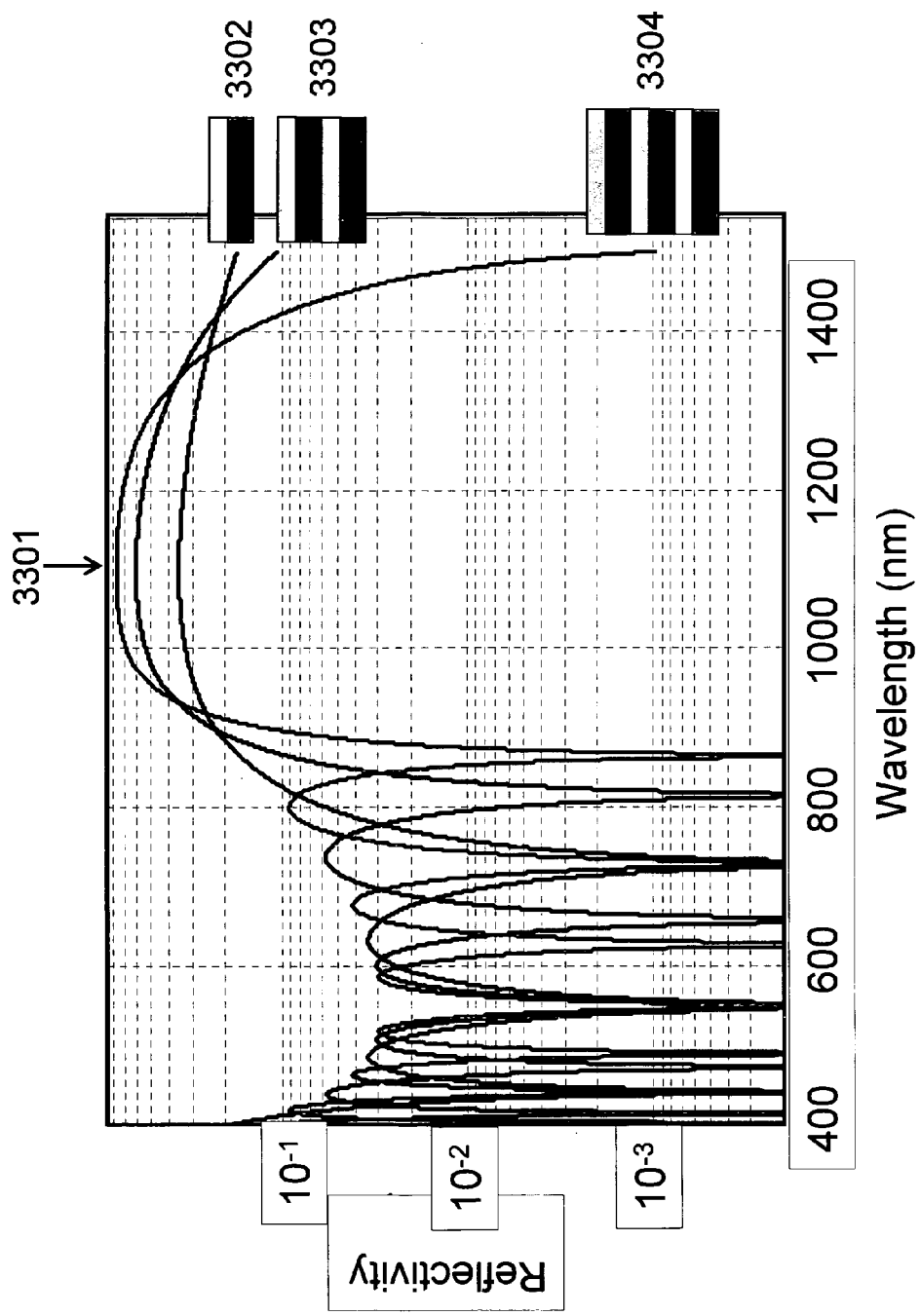
FIG. 25 is a graph of reflectivity as a function of wavelength for three different dielectric layer stacks with 2, 4, and 6 dielectric layers, respectively.

In some embodiments, these transparent deposited glass layers and $Si_3N_4$ layers provide refractive index contrasts that are used to form quarter wave reflector layers and/or distributed Bragg reflectors (DBR). Consider the general structure of FIG. 24, wherein layers 2902 and 2901 are composed of $SiO_2$ and $Si_3N_4$. FIG. 25 shows the effect of the number of bi-period pairs of $SiO_2$ and $Si_3N_4$ layers on the reflectivity of the resulting layer stack as a function of wavelength, where the thickness L of each dielectric layer is $L=\lambda/4n$. The curves 3302, 3303, and 3304 are for 1, 2, and 3 periods of $SiO_2/Si_3N_4$ quarter wave stacks, respectively. The design wavelength was chosen to be 1100 nm to coincide with the indirect band edge of Si.

Figure 26:
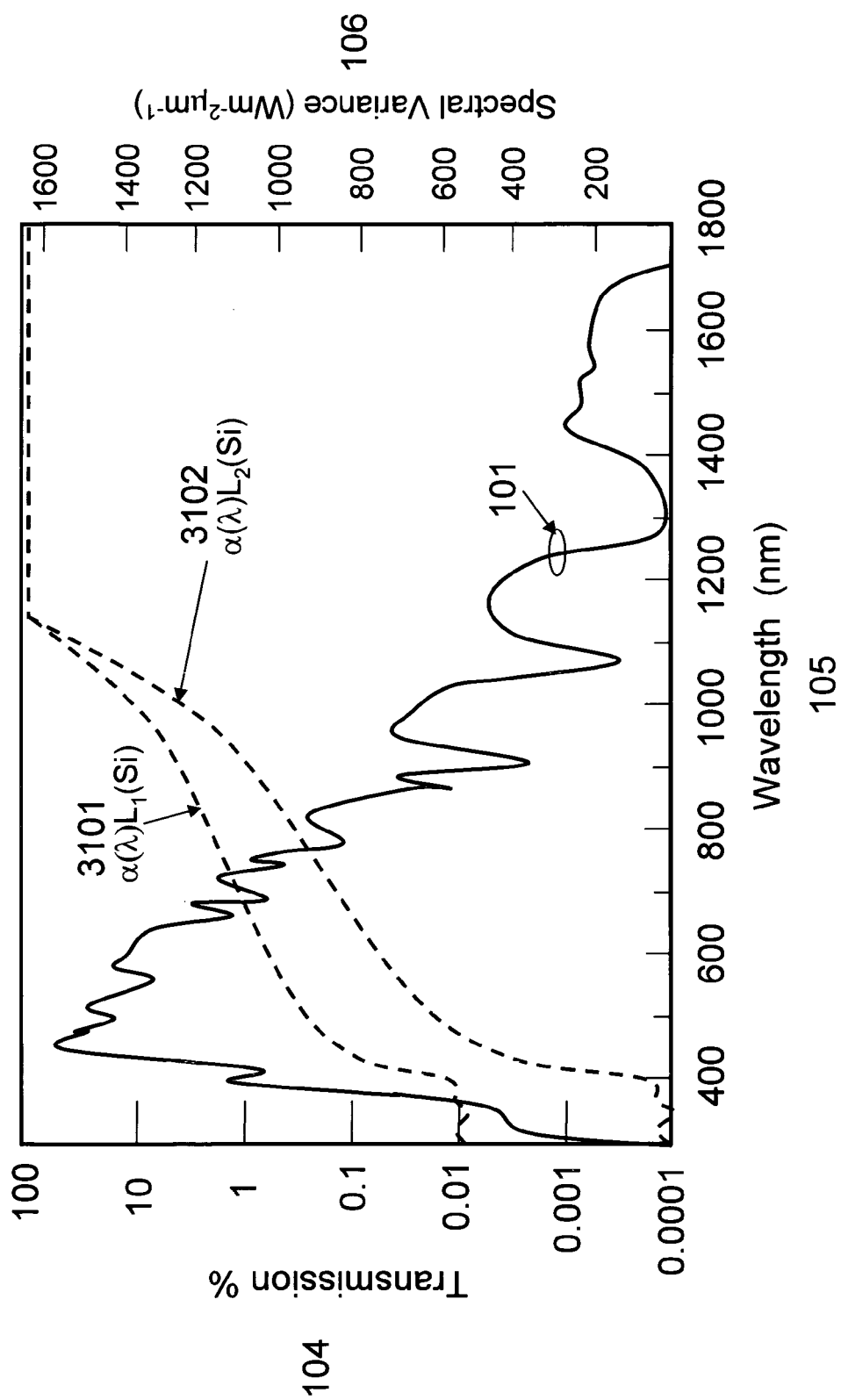
FIG. 26 is a graph illustrating the overlap of the sea-level solar spectrum with the transmission spectra of two thin films of silicon with thicknesses of 1 µm and 100 nm.

FIG. 26 shows the overlap of the solar spectrum 101 with the transmission spectra of two thin films of Si with thicknesses of $L_2=1$ μm (transmission spectrum 3102) and $L_1=100$ nm (transmission spectrum 3101). The relative transmission of radiation as a function of wavelength is substantially reduced for the thick film case; however, both suffer large transmission losses near the indirect band edge. High energy photons are efficiently absorbed even for 100 nm thick Si films, and thus light trapping of indirect band edge photons is highly desirable.

The lateral junction PV structures described herein enable high efficiency PV cell operation while simultaneously and dramatically reducing the physical thickness of semiconductor material required. Additionally, the constraints on the quality of the semiconductor can be relaxed because, for a given conversion efficiency, the diffusion lengths of minority carriers can be reduced proportionally to the degree of light intensity enhancement. Furthermore, by exploiting the non-linear absorption of silicon, the lateral swept intrinsic p-i-n device structures described herein utilize a majority of the broadband photon energy of the solar spectrum. This efficiency can be further increased by use of efficient light trapping.

The portion of incident intensity that is transmitted through a thin film of silicon depends on the wavelength dependent absorption within the film. Total internal reflection results in two or more passes of the light rays within the active region of the device and produces an effective intensity enhancement, thereby increasing the photocurrent generated by the device. The ideal efficiency of a silicon solar cell would make use of perfect light trapping, corresponding to an infinite degree of enhancement.

As described above, one- and two-dimensional gratings are capable of efficiently diffracting incident radiation by large angles, as shown in FIGS. 23 and 27. In practice, grating couplers configured for light trapping generally achieve at least one additional absorption pass before the unabsorbed portion is diffracted out of the substrate. However, the structures described above, wherein a thin typically high refractive index and absorbing semiconductor layer is disposed between an upper interconnect fabric and a low refractive index substrate, are well suited to cavity effects. When these structures are configured as optical cavities, photons can make as many as 25 or more passes through the semiconductor layer, greatly increasing the likelihood of absorption.

Figure 28:
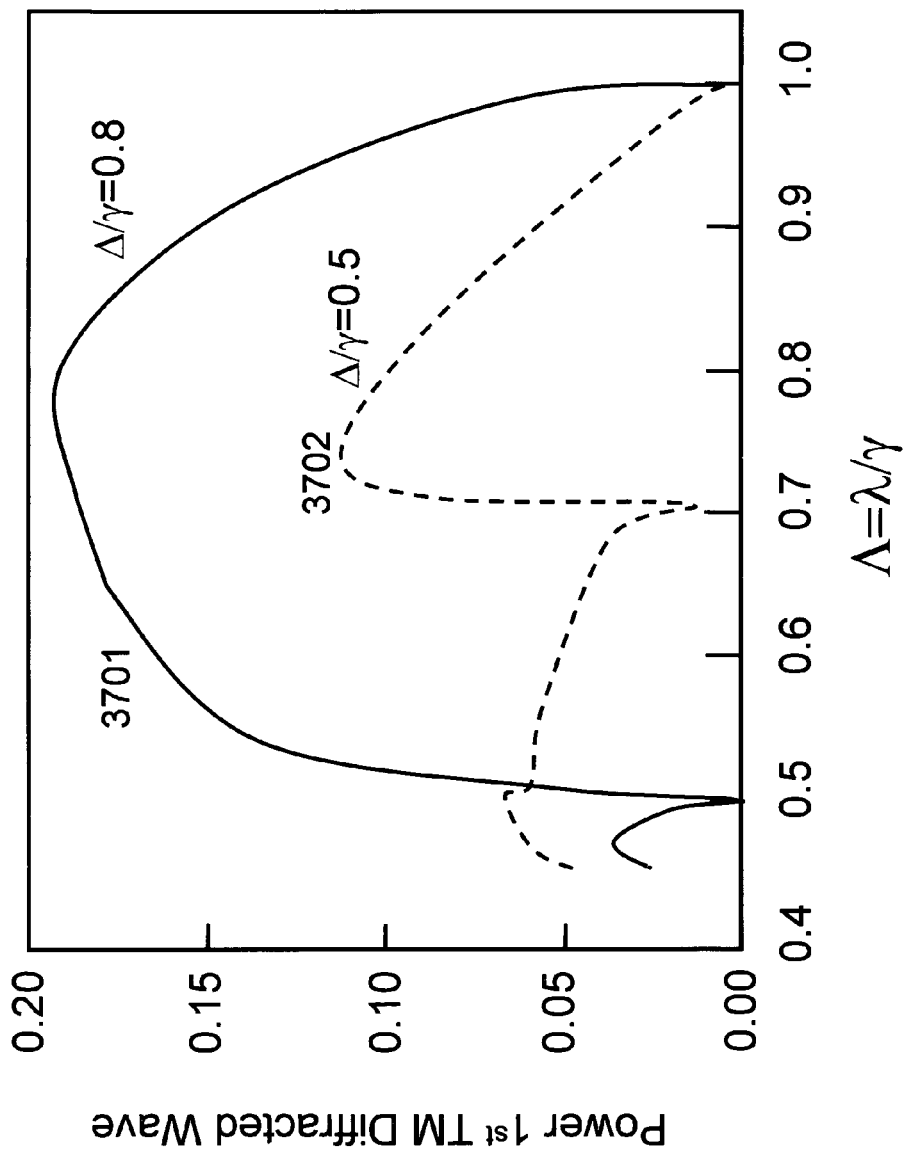
FIG. 28 is a graph of the first order TM diffracted wave as a function of reduced wavelength $\lambda/\gamma$, for the structure shown in FIGS. 27A and 27B.

FIGS. 27A and 27B are plan and cross-sectional side views, respectively, of an embodiment of a planar 2-D grating array 3601 formed by square metallic and/or different refractive index regions that diffract incident solar radiation 3610 at substantially normal incidence 3610 to the underlying substrate 3620 into large angle diffracted $1^{st}$ order 3606 and $2^{nd}$ order 3607 beams. In some embodiments, the optional dielectric coating 3630 is also deposited with a thickness of $\lambda/4n$ to aid in the light trapping properties of the structure. For a simple square 2-D array, the power diffracted into the $1^{st}$ order TM wave is given by the graph shown in FIG. 28.

The first order diffracted TM wave is governed by the equation $\cos \Pi_{pq2} = \lambda/\gamma$, and the second order by $\cos \Pi_{pq2} = \sqrt{2} \cdot (\lambda/\gamma)$, where $\Pi_{pq2}$ is the angle enclosed by the electric field vector of the diffracted waves at the grating normal. The dependence of the diffracted mode on the grating period $\gamma$ and the width $\Delta$ of the square reflectors 3606 are represented in terms of the reduced wavelength $\Lambda = \lambda/\gamma$ and normalized grating width $\Delta/\gamma$.

Figure 29:
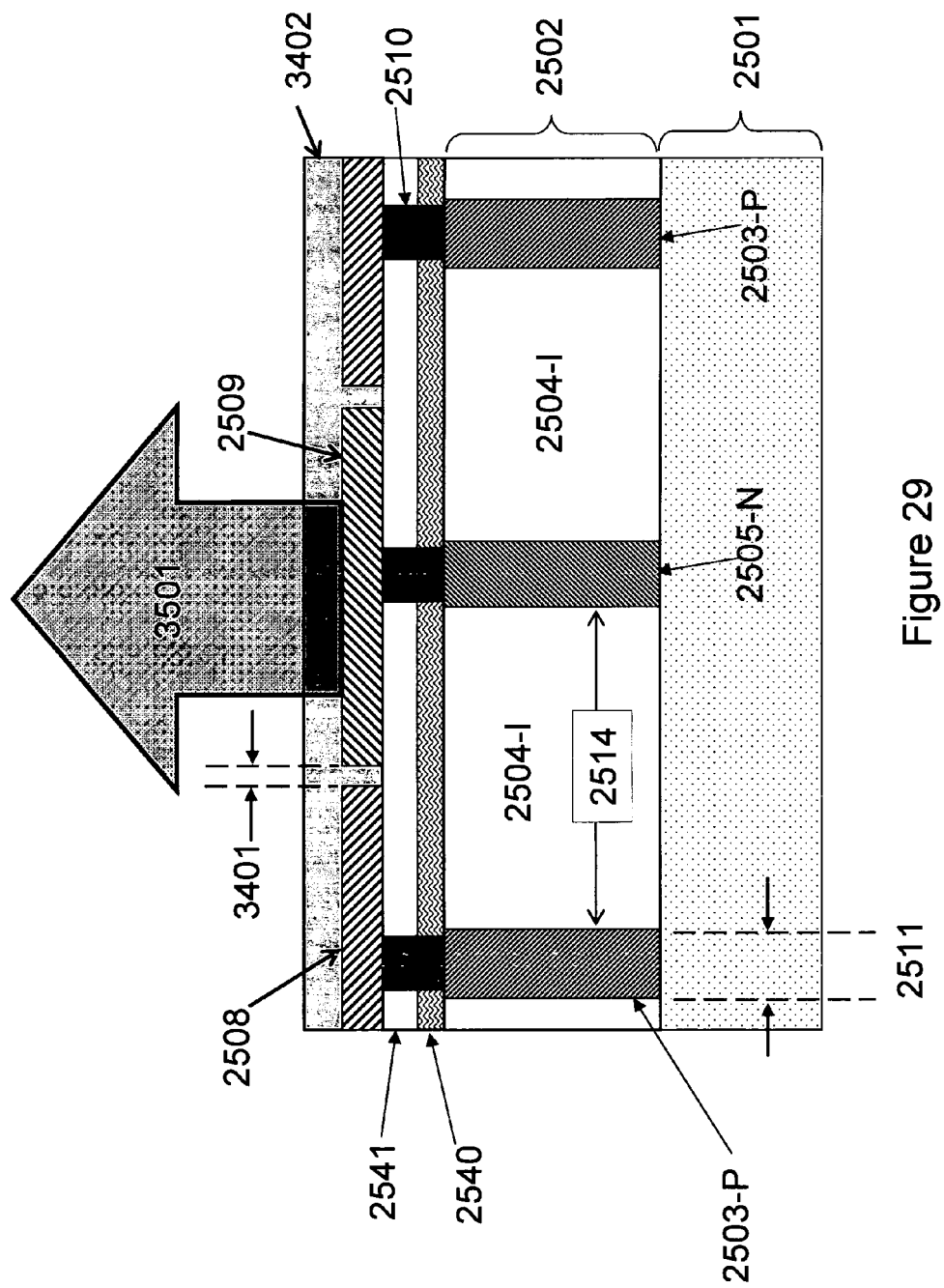
FIG. 29 is a schematic cross-sectional side view of one embodiment of a lateral junction SOS device in which increased metal electrode coverage is used to create a sub-wavelength 2-D optical grating that also acts as a heat sink.

As the metal coverage increases, (i.e., as $\Delta/\gamma$ increases), the diffracted power increases for a larger band of wavelengths (compare the curve 3701 for $\Delta/\gamma=0.8$ with curve 3702 for $\Delta/\gamma=0.5$). Consequently, increasing the metal electrode coverage 2508 & 2509 as shown in FIG. 29 allows the creation of sub-wavelength 2-D gratings. An added advantage of increasing the width of the metal interconnect lines of a lateral interdigitated p-i-n cell is that the effective series resistance is reduced, thereby increasing the $V_{OC}$ of the cell. Furthermore, the heat extraction efficiency is increased as the metal conductors extract thermal energy 3501 from the system. Diamond films can also be used for efficient thermal energy extraction and as an environmental encapsulant.

The degree of intensity enhancement $\Phi$ due to light trapping via total internal reflection is $\Phi = 2n^2$, where n=the refractive index of the light trapping medium. For silicon, $\Phi=24.5$, indicating that a light ray in Si can make ~25 passes on average before escaping. Furthermore, the effective photon path length increases by a factor of 2 when averaged over all diffraction angles, producing an enhancement factor of $\Phi=4n^2$ (relative to the case of single pass, normally incident rays).

Figure 30:
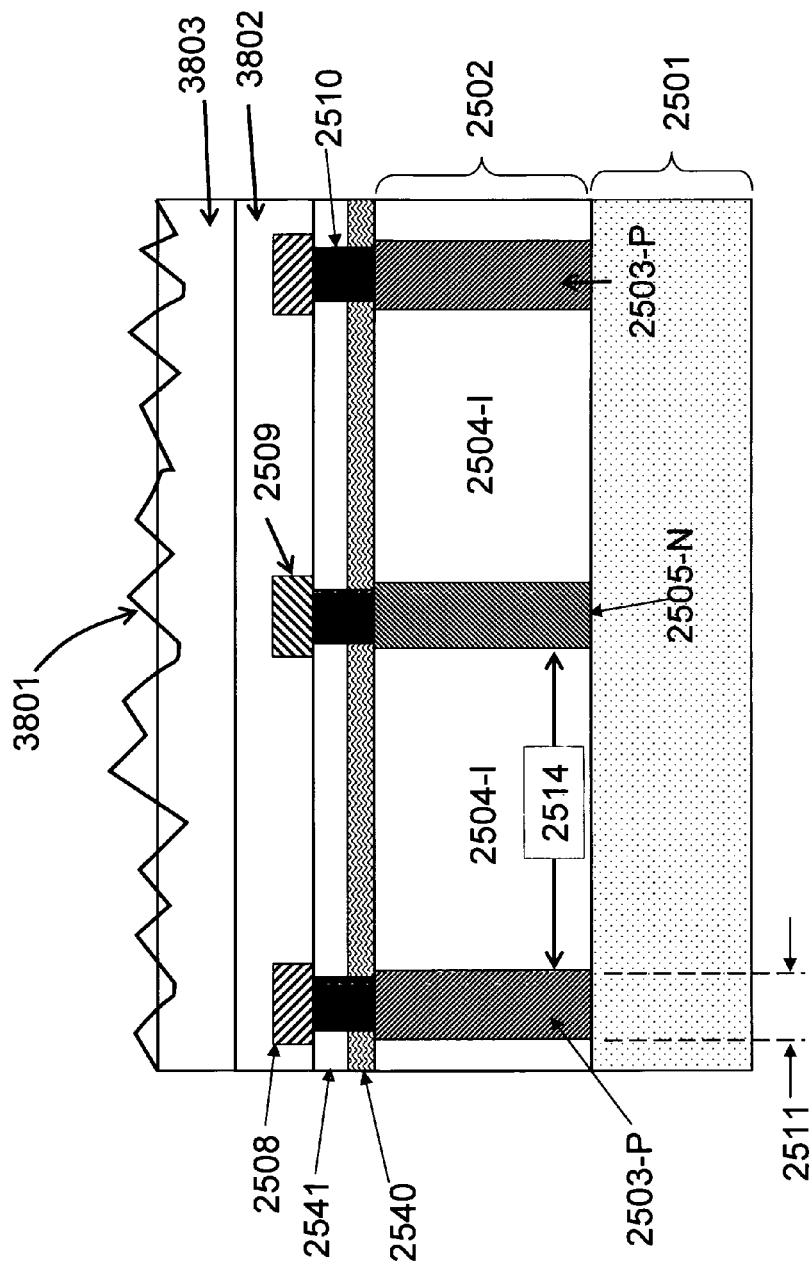
FIG. 30 is a schematic cross-sectional side-view of a lateral junction SOS device having a rear textured surface to scatter light passing through the device back into the silicon layer.
Figure 31:
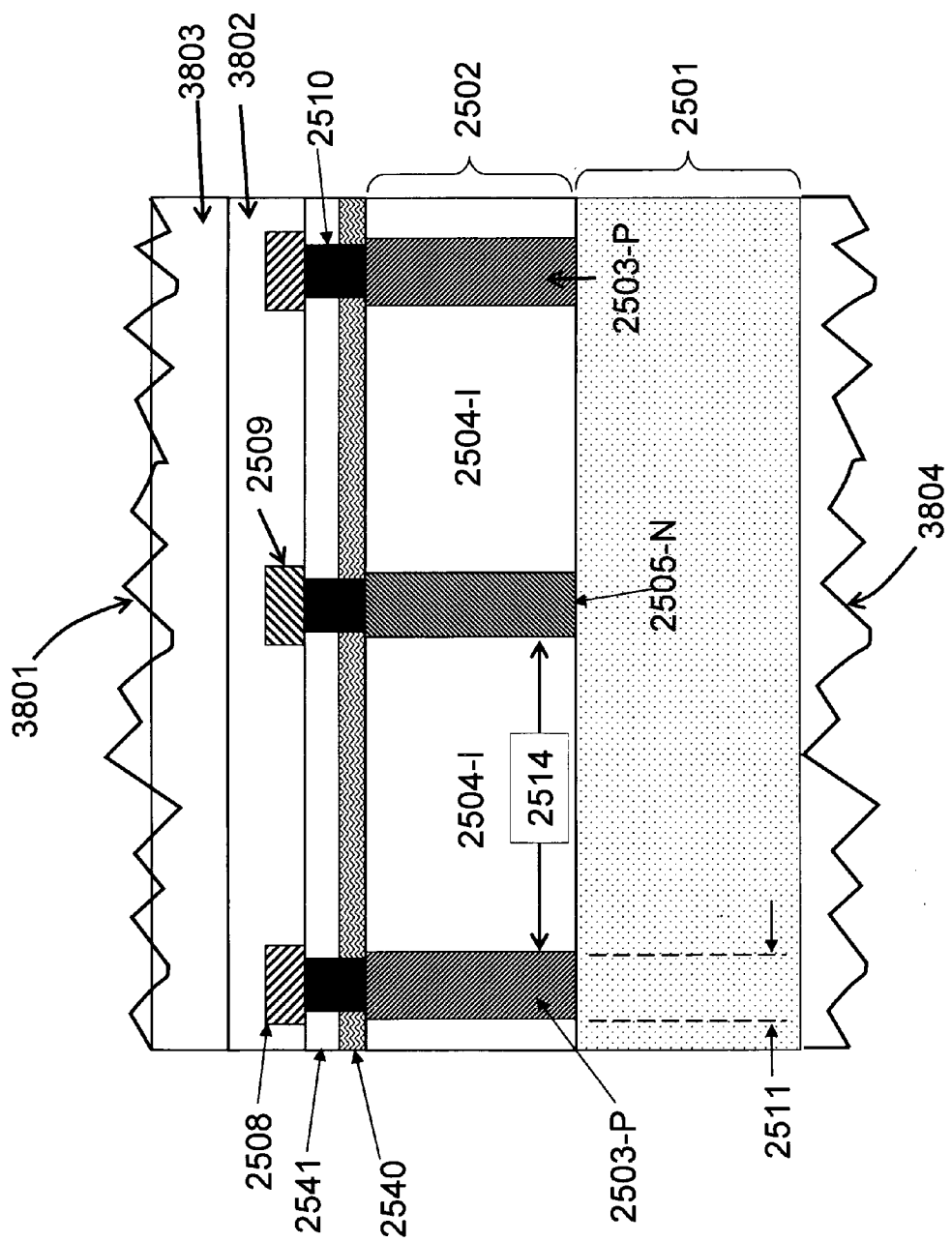
FIG. 31 is a schematic cross-sectional side-view of a lateral junction SOS device having both front and back surface texturing to further improve light trapping.
Figure 32:
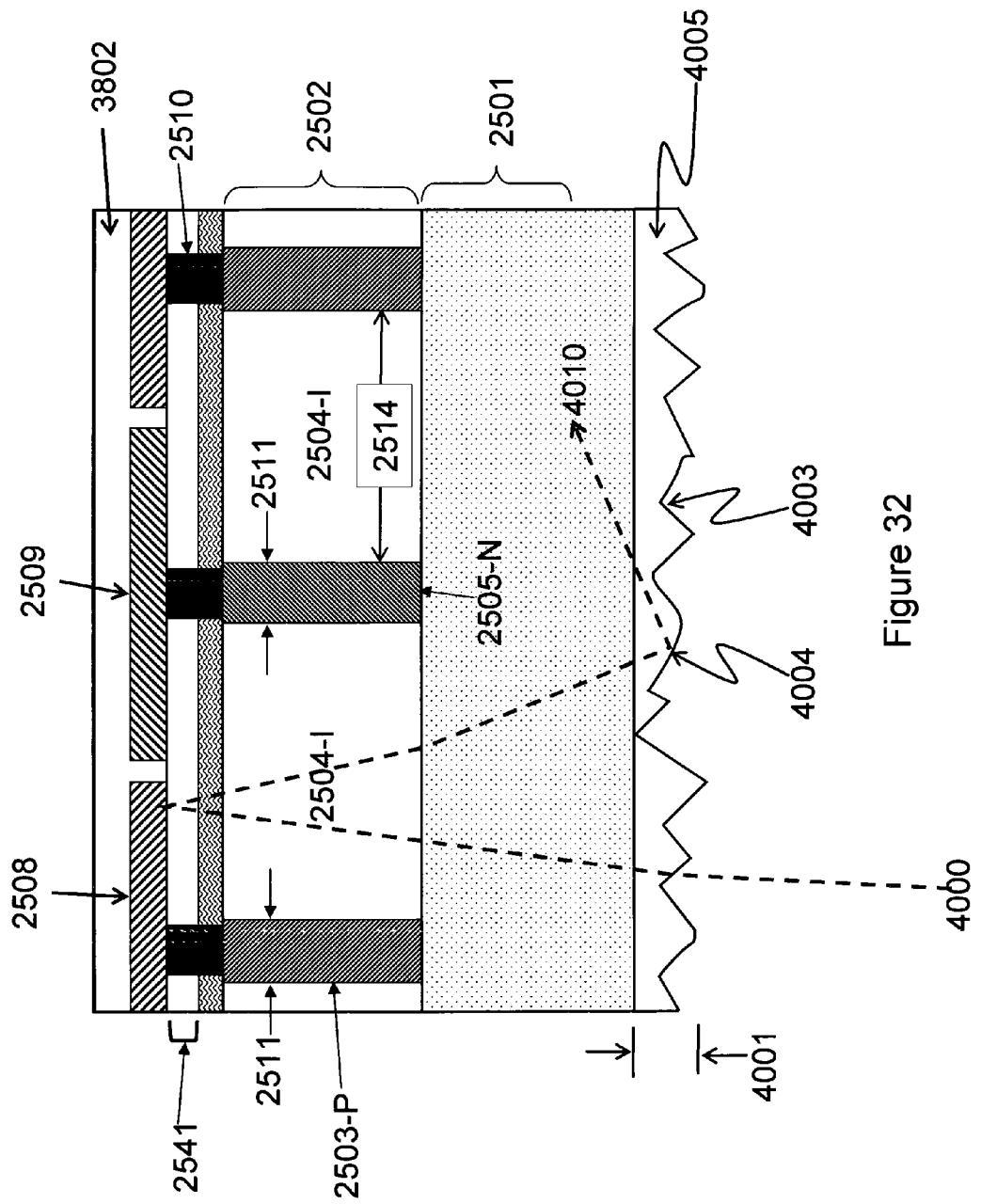
FIG. 32 is a schematic cross-sectional side-view of a lateral junction SOS device in which a front-side textured surface is combined with wide electrodes at the rear surface to trap light within the active silicon layer to increase the probability of absorption.

Increasing the number of passes of the optical radiation through the active layer can be achieved with at least one randomly roughened reflecting surface, as shown in FIGS. 30, 31 and 32. Most of the incident radiation can thus be trapped inside the active layer 2502, except for a small escape fraction that is within the critical reflection cone angle, given by $\sin \theta_c = 1/n$. An optimal random scattering reflector would enable maximum destructive interference of the reflected radiation, thereby minimizing low angle back reflected power. This requires the phase of the reflected optical electric field to be fully randomized.

Random texturing of the front and/or rear surfaces is shown in FIGS. 30, 31 and 32.

FIG. 30 shows an embodiment of a lateral PV device having a rear textured surface 3801, enabling light that was not absorbed during the first pass through the active semiconductor layer 2502 to be scattered back into the active region 2502. The relatively narrow (e.g., about 1-3 µm) electrodes 2508 & 2509 contacting the lateral p-i-n device allow substantial gain to be provided by such rear surface light trapping.

As shown in FIG. 31, some embodiments combine front and back surface texturing to provide further improvement in the efficiency of light trapping in these devices. A front-side textured surface 3804 can be formed by patterning the transparent substrate itself or by depositing a coating or attaching an already textured layer on the transparent substrate.

As shown in FIG. 32, for embodiments where wide electrodes 2508 & 2509 are used to contact a lateral p-i-n interdigitated PV cell, a textured front surface is used to provide effective light trapping. An incident optical beam 4000 traverses the active region 2502, wherein the portion that is not absorbed within the active layer 2502 is reflected from a rear electrode 2508 back toward the active region. Any second pass portion of light that is not absorbed is reflected 4004 from the textured surface 4003, whereby it continues to scatter until completely absorbed or scattered into an angle below the critical angle.

FIGS. 33 to 37 illustrate how photolithography and planar patterning can be used to produce a pseudo-random scattering surface. Using conventional CMOS processing steps, random phase reflectors can be fabricated, as determined by the vertical layer dimensions and planar geometry. A major advantage of utilizing photolithographically defined pseudo-random patterns compared to a fully randomized random process is the ability to control the local and global feature sizes and thereby deterministically provide an identical pseudo-random pattern to every device disposed on the substrate.

FIG. 33A shows an example plan view of a unit element of a pseudo-random pattern generator. At least three regions are provided to produce spatially varying optical path lengths, as shown in the cross-sectional side view of FIG. 33B. Region 4102 is chosen to produce a quarter-wave optical path length $\lambda/4n$, where $\lambda$ is the incident optical wavelength. Region 4103 is chosen to produce $\lambda/2n$, and region 4101 is chosen to be incident on a metal surface with zero phase difference upon reflection. Regions 4103 and 4102 need not be composed of the same refractive index material. The incident optical beams 4130, 4131 and 4132 are reflected with respective different phase differences.

Figure 34:
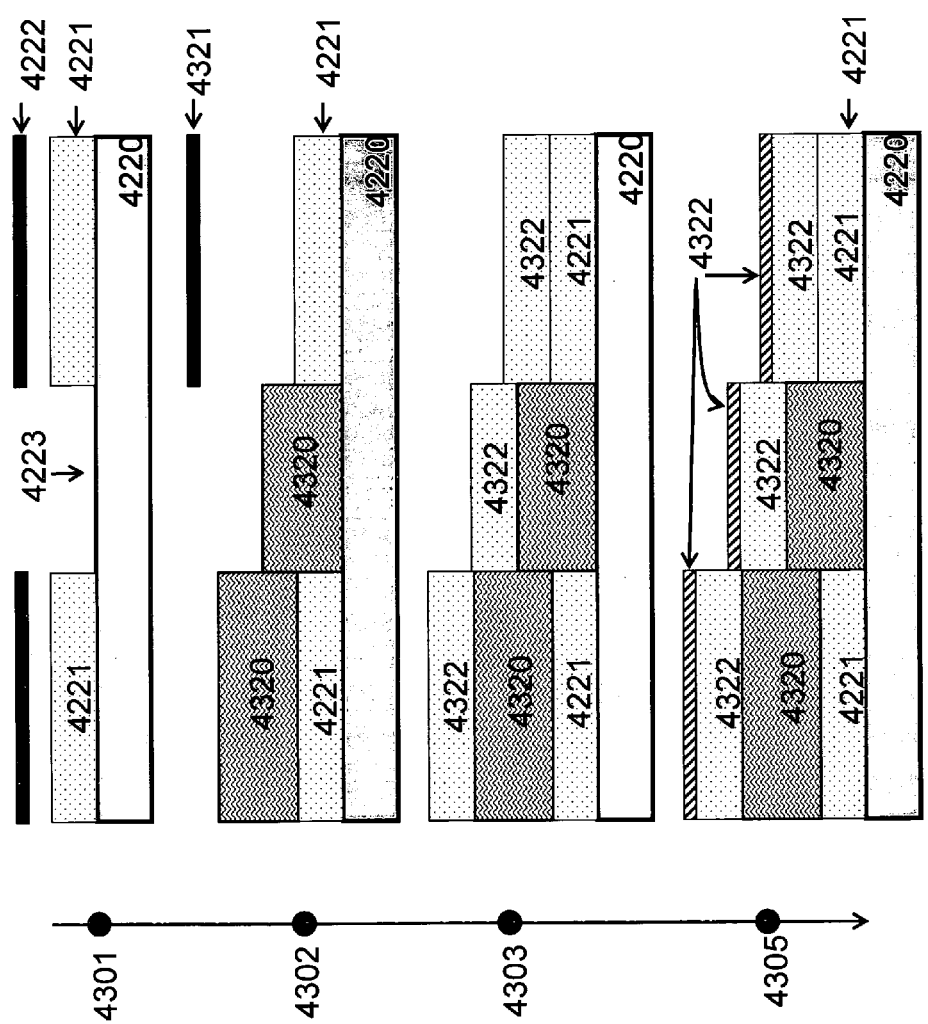
FIG. 34 is a set of schematic side-views illustrating another process for forming a three region unit element of a pseudo-random light scattering structure.
Figure 35:
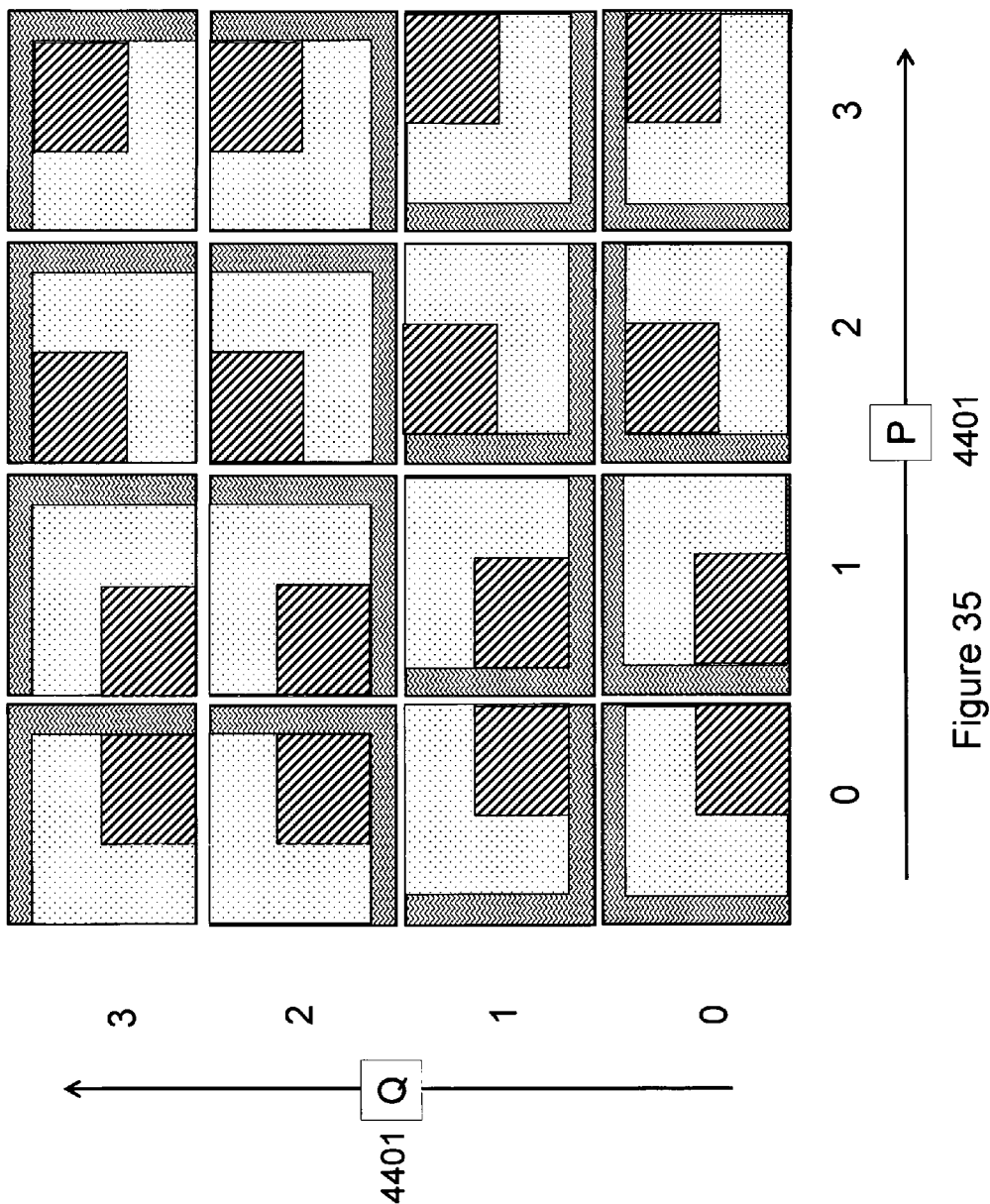
FIG. 35 is a schematic plan-view illustrating how different configurations of unit elements such as those shown in FIGS. 33 to 34 can be combined to produce a unit cell of a pseudo-random scattering structure for a design wavelength $\lambda$.
Figure 36:
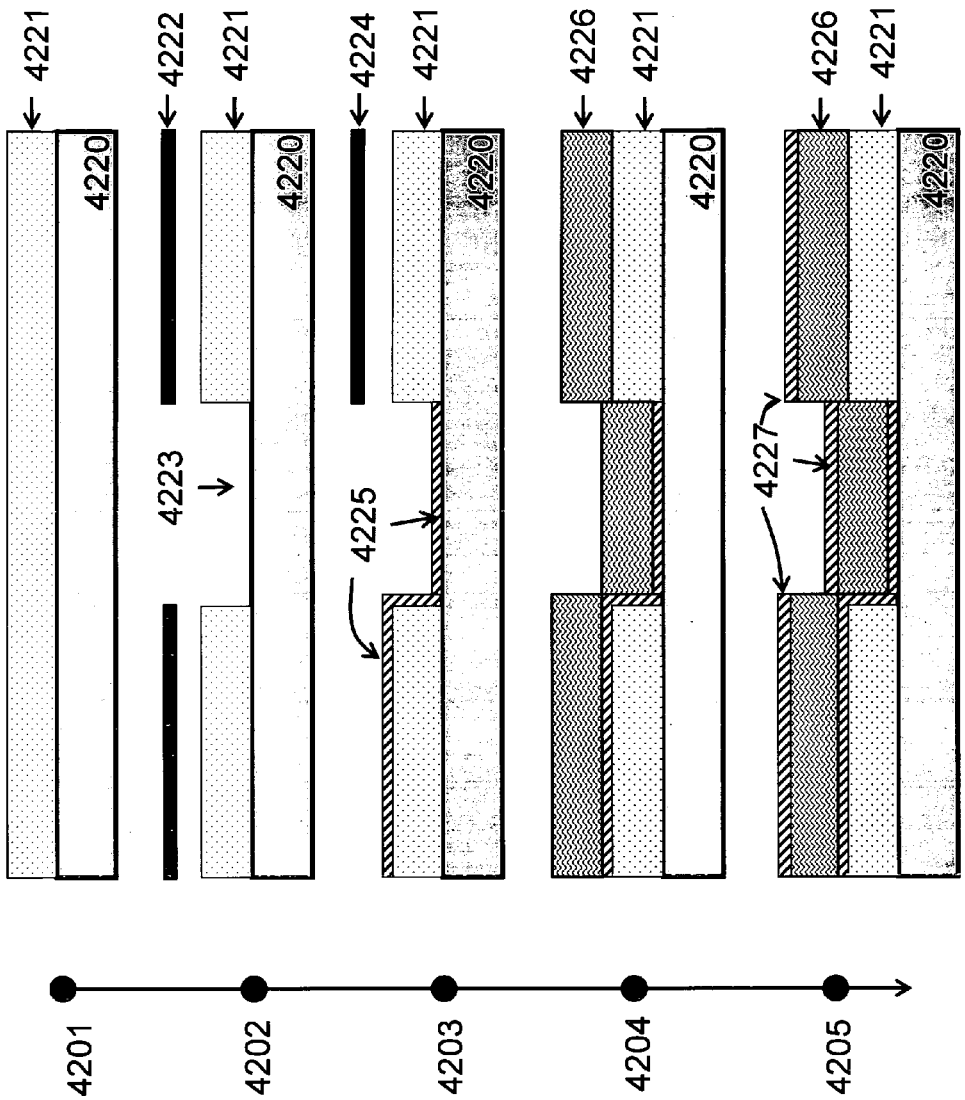
FIG. 36 is a set of schematic side-views illustrating processes for producing unit elements of a pseudo-random scattering structure.

Example structures are shown in cross-sectional side view and plan view, respectively, in FIGS. 34 and 35 for a design wavelength $\lambda$. FIG. 36 shows a cross-sectional side view of a thin film semiconductor or substrate 4220 uniformly coated with a layer 4221 of refractive index $n_1$ and thickness $\lambda/4n_1$. At step 4202, a mask 4222 is used to etch a region 4223 such that a metallic film 4225 can selectively form a back reflector to selected regions exposed by a second mask 4224. At step 4204, a second dielectric material 4226 of refractive index $n_2$ is deposited with thickness $\lambda/4n_2$ upon the entire structure, followed (at step 4205) by another metal reflector layer 4227, again over the entire structure. This produces a structure similar to the one shown in FIG. 33 for illumination entering from the transparent underlying substrate 4220.

Alternatively, as shown in FIG. 34, the regions 4322 and 4221 can have refractive index $n_1$ and thicknesses of $\lambda_1/4n_1$ and $\lambda_3/4n_3$, respectively. At step 4302, regions 4320 of refraction index $n_2$ are deposited with a thickness of $\lambda/4n_2$. At step 4303, regions 4322 with refractive index $n_3$ are deposited with a thickness of $\lambda/4n_3$. At step 4305, the final structure is overcoated with a metallic reflector. This structure requires only one metal layer.

Figure 37:
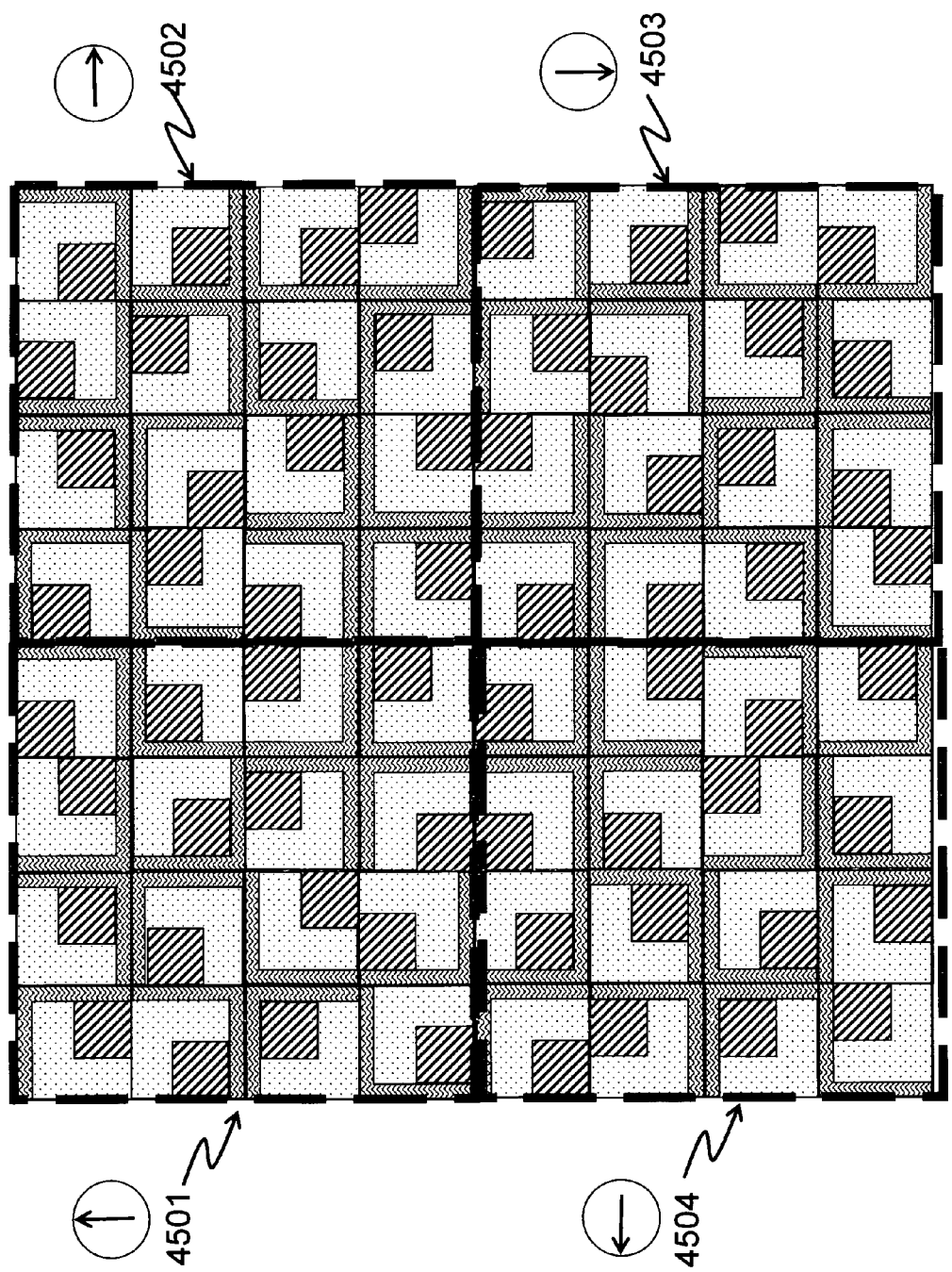
FIG. 37 is a schematic plan-view illustrating how the unit cells of FIG. 36 can be further combined in different arrangements to form macrocells of a pseudo-random scattering structure.

FIG. 35 depicts the 16 possible permutations provided by sequentially changing the location of regions 4102 and 4101 within the primary area 4103. The elements (P,Q) each produce distinct spatial phase differences. As shown in FIG. 37, the (P,Q) elements of FIG. 35 can be randomized to form macrocells 4501, 4502, 4503 and 4504. The macrocell 4502 is derived by rotating macrocell 4501 by 90°, and so on. The pseudo-random pattern of FIG. 37 is sufficient to produce efficient light trapping suitable for the devices described herein. It will be apparent to those skilled in the art that a wide variety of other configurations and shapes are possible, based on those described herein.

In some embodiments, $TiO_2$ and/or $Al_2O_3$ are used as optical coatings for the devices described herein.

Figure 38:
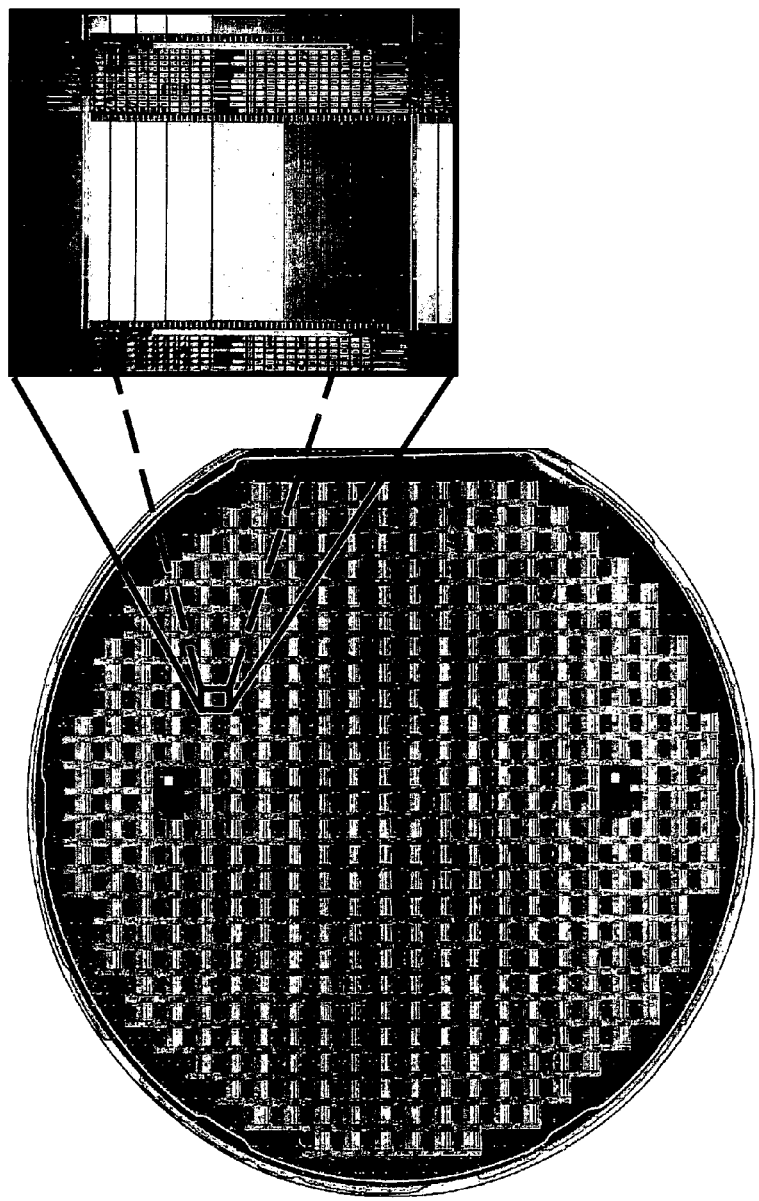
FIG. 38 is an optical micrograph of a silicon-on-sapphire wafer in which fully-depleted silicon-on-sapphire lateral junction p-i-n photovoltaic devices with interdigitated doped regions have been fabricated, the inset showing a magnified view of a single die from the wafer.

Finally, FIG. 38 is an optical microscope image of a Si on sapphire wafer stack incorporating the described lateral p-i-n PV devices implemented in an epitaxially grown Si film on an R-plane sapphire substrate.

Figure 39:
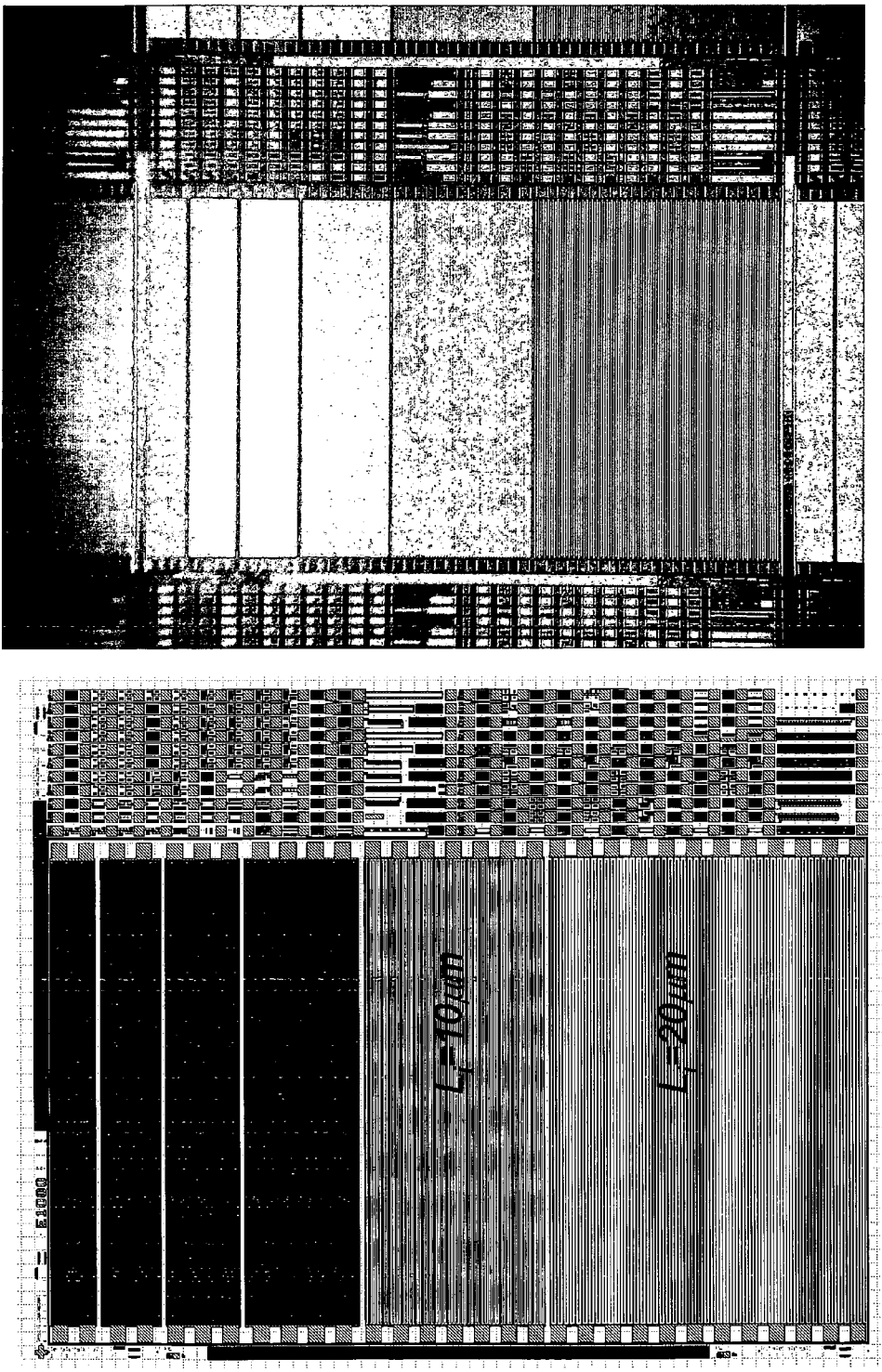
FIG. 39 shows the optical mask (left hand side) used to produce each die, together with an optical micrograph (right hand side) of the actual die.

The 100 nm single crystal Si film was patterned into the various interdigitated p-i-n PV devices described above, forming ~182×1 cm² solar cells. FIG. 39 shows detail of one mask design (left-hand side) and the corresponding die (right-hand side) fabricated using the mask.

As an alternative to the interdigitated arrangements of doped regions described above, in other embodiments, as shown in FIGS. 40 to 42, n-type and p-type doped regions of a lateral junction p-i-n device are formed as vertical columns of doped semiconductor in a semiconductor layer that is nominally intrinsic or at least has a low doping concentration relative to the n-type and p-type doped regions. As with many of the embodiments described above, the semiconductor layer can be a thin layer formed on an electrically insulating substrate. In one embodiment, the substrate is a glass. In another embodiment, the semiconductor layer is a single-crystal thin film epitaxially grown on a crystalline insulating substrate. The thin film may be silicon. The substrate may be sapphire. The thin film and substrate in combination may be silicon-on-sapphire (SOS).

Figure 40:
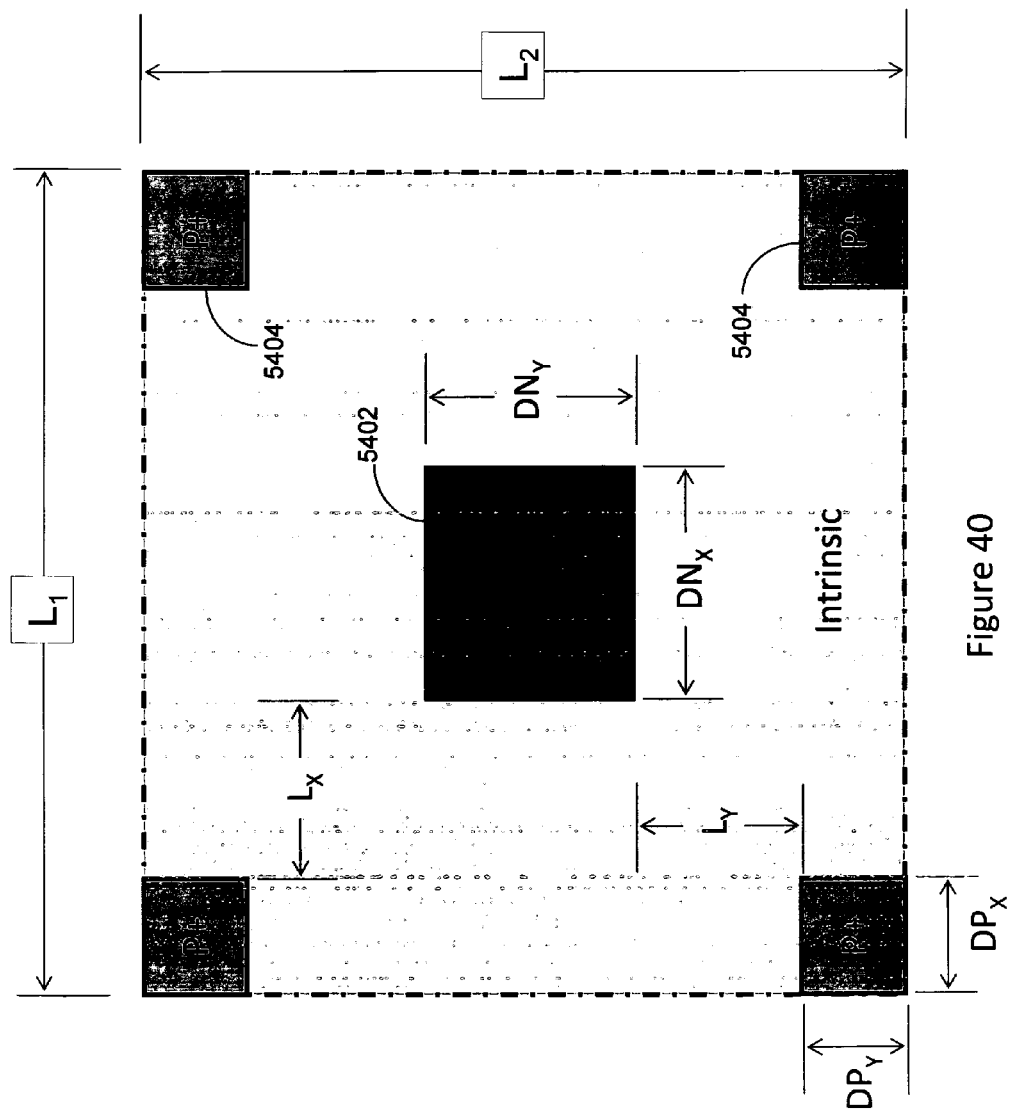
FIG. 40 is a plan view of a unit cell of a pattern of doped regions formed in a semiconductor layer in accordance with one embodiment of the present invention.
Figure 41:
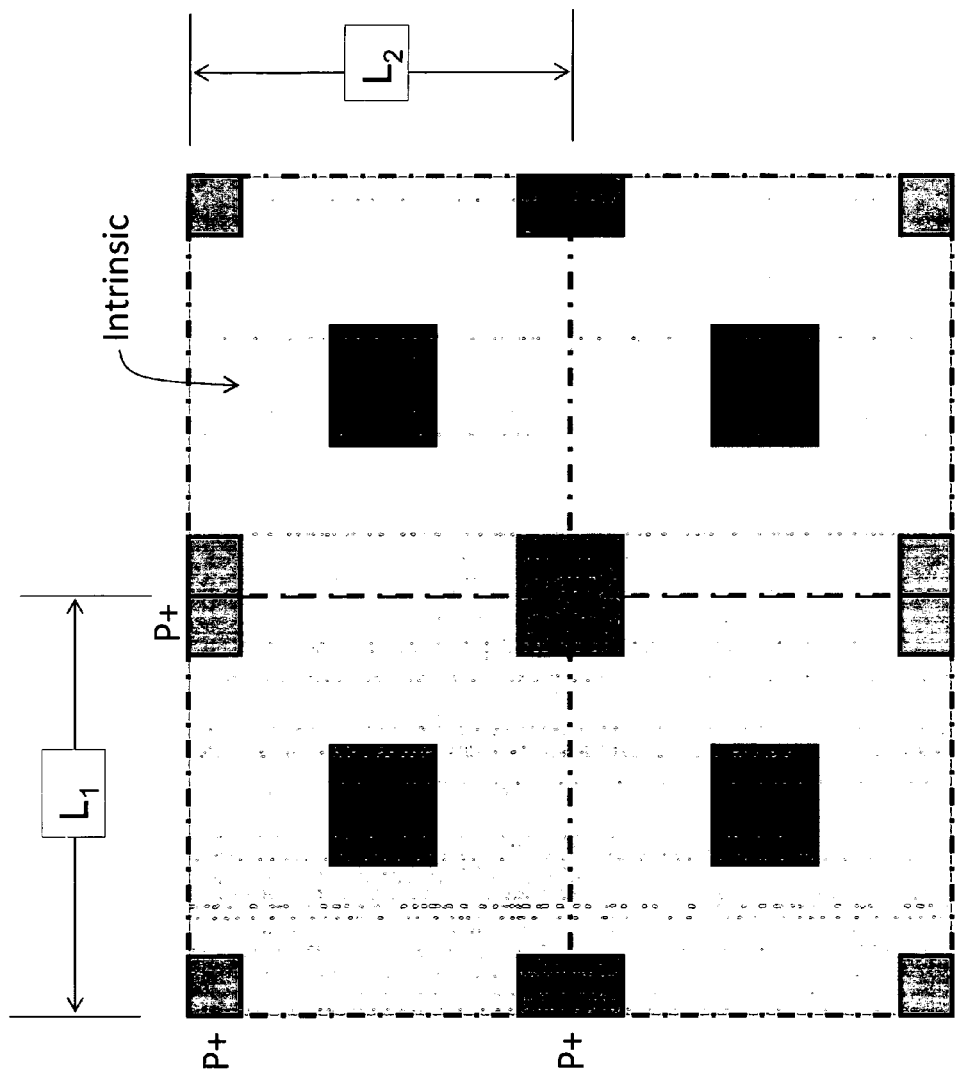
FIG. 41 is a plan view of a 2×2 array of the unit cell of FIG. 40, illustrating how a step-and-repeat application of the unit cell can be used to produce two-dimensional arrays of localised square doped regions of opposite doping polarities.
Figure 42:
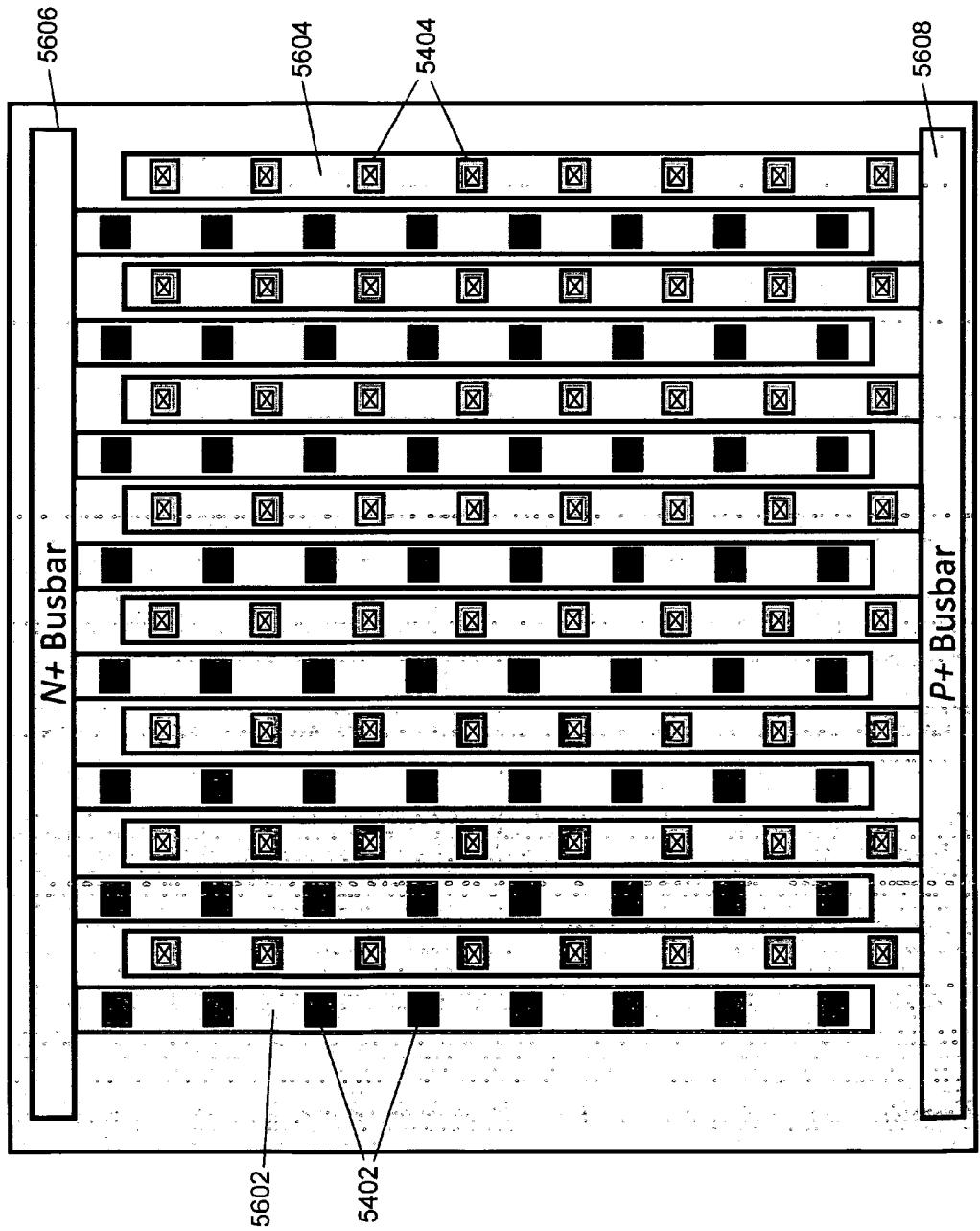
FIG. 42 is a plan view of an interdigitated contact structure used to provide electrical contacts to a larger array of the unit cell of FIG. 40.

As with other embodiments described above, the doped regions can be similarly formed by selected-area ion implantation of dopant species, which can be achieved, for example, by use of masking layers (e.g., photoresist) having openings defined by corresponding lithographic masks, as will be apparent to those skilled in the art. However, unlike the embodiments described above where extended (in plan view)

doped regions are formed as interdigitated fingers, the doped regions are localized (in plan view) and formed in a pattern defined by two overlapping rectangular arrays as shown in FIGS. 40 to 42. The pattern or arrangement of doped regions in plan view can be generally described as being that of a single plane incorporating faces of a face-centered cubic lattice structure, where doped regions of one polarity type are located at the center of the faces, and the doped regions of the opposite polarity type are located at the corners of the cubic lattice structure. Alternatively, the arrangement of doped regions can be described as being two intersecting two-dimensional arrays, grids, or meshes having identical spacings, but being offset relative to one another by half of the distance between adjacent nodes (i.e., points of intersection) of the grid/array.

The arrangement of doped regions can be generated by repetition (e.g., step and repeat) of a two-dimensional unit cell with side dimensions $L_1$ and $L_2$. In some embodiments, the doped regions have a square shape in plan view, with $L_1=L_2$, as shown in FIG. 40. The unit cell has a central doped region of dimensions $DN_X=DN_Y$, being a highly doped n-type region in this example. Highly doped regions of the opposite doping polarity (in this example, p-type regions) are located in the corners of the unit cell, and having dimensions $DP_X$ and $DP_Y$, with $DN_X=2\times DP_X$ and $DN_Y=2\times DP_Y$.

In the particular embodiment shown, a highly doped n-type doped region 5402 with dimensions $DN_X=DN_Y$ is located at the center of the unit cell, with highly doped p-type doped regions 5404 of dimensions $DP_X=DP_Y$ located at the corners of the unit cell. The p-type doped regions 5404 are spaced from the central n-type doped region 5402 in the x and y directions by $L_X$ and $L_Y$, as shown. Although the plan view of FIG. 40 shows the doped regions as being precisely square in shape and having sharp corners, it will be appreciated by those skilled in the art that in reality the dimensions of the doped regions are likely to be rounded, depending on the precise shape(s) and lateral dimensions of the corresponding openings in the mask used to restrict the implanted dopant species to those regions 5402, 5404, the implantation parameters, and diffusion of the implanted species during subsequent processing. In any case, the dimensions are such that the doped regions 5402, 5404 are mutually spaced and may occupy a relatively small proportion of the total surface area available for receiving incident light.

As shown in FIG. 41, the overall arrangement of doped regions 5402, 5404 can be thought of as being generated by translating (in the general case, by $L_1$ and $L_2$, respectively) and repeating the unit cell in the x and y dimensions to form a continuous two-dimensional array of mutually spaced doped regions 5402, 5404. In the particular embodiment shown in the Figures, the regions at the corners of the unit cell join to form contiguous regions having identical dimensions to the region formed in the center of the unit cell (i.e., $DN_X=2\times DP_X$ and $DN_Y=2\times DP_Y$), although it will be appreciated by those skilled in the art that this need not be the case. It will also be apparent that it is immaterial whether the central doped region 5402 and peripheral doped regions 5404 are n-type and p-type, respectively, as shown, or whether the polarity types are exchanged. Although FIG. 41 only shows a 2×2 array of the unit cell for illustrative purposes, it will be apparent that in practice much larger arrays would be produced.

Due to the offset nature of this arrangement, the doped regions of either polarity can be contacted by a set of parallel linear contacts 5602, 5604, as shown in FIG. 42, with the set of electrically conductive contacts 5602, 5604 for each polarity being electrically connected to a corresponding busbar 5606, 5608. Each busbar 5606, 5608 can itself be linear and orthogonal to the sets of contacts, as shown, so that the set of parallel contacts to doped regions of one polarity (e.g., the n-type contacts 5602) extend to one busbar 5606 located to one side of the array of doped regions, and the set of parallel contacts to doped regions of the opposite polarity (e.g., the contacts 5604 to the p-type regions 5404) extend to a second busbar 5608 located at the opposite side of the array, as shown in FIG. 42. Although the two resulting contact structures 5602 to 5608 are in the form of interdigitated fingers, it should be noted that in these embodiments it is only the electrical contacts 5602 to 5608 that are in this form, with the underlying doped regions 5402, 5404 being localized (in plan view) at the nodes of the two offset arrays.

Relative to the configurations described above and shown, for example, in FIGS. 18C to 18E, where the doped regions themselves are in the form of interdigitated fingers, the relatively simple offset configuration of localized doped regions 5402, 5404 in this embodiment increases the intrinsic absorber area and volume relative to the contact area and volume, and reduces the area and volume of the p+ and n+ regions, which, being highly doped, are less likely to contribute to the final photocurrent provided by the device. Indeed, the lateral dimensions of the doped regions 5402, 5404 ($DN_X=DN_Y$ being typically about 1-2 µm) can be such that the regions are effectively point contact diodes. Moreover, the reduction in the dimensions of the doped regions 5402, 5404 allows the use of a semiconductor material with shorter carrier lifetimes. These effects, together with a reduced sensitivity to parallel shunts, results in the overall performance of these devices being limited primarily by electron-hole recombination.

Figure 43:
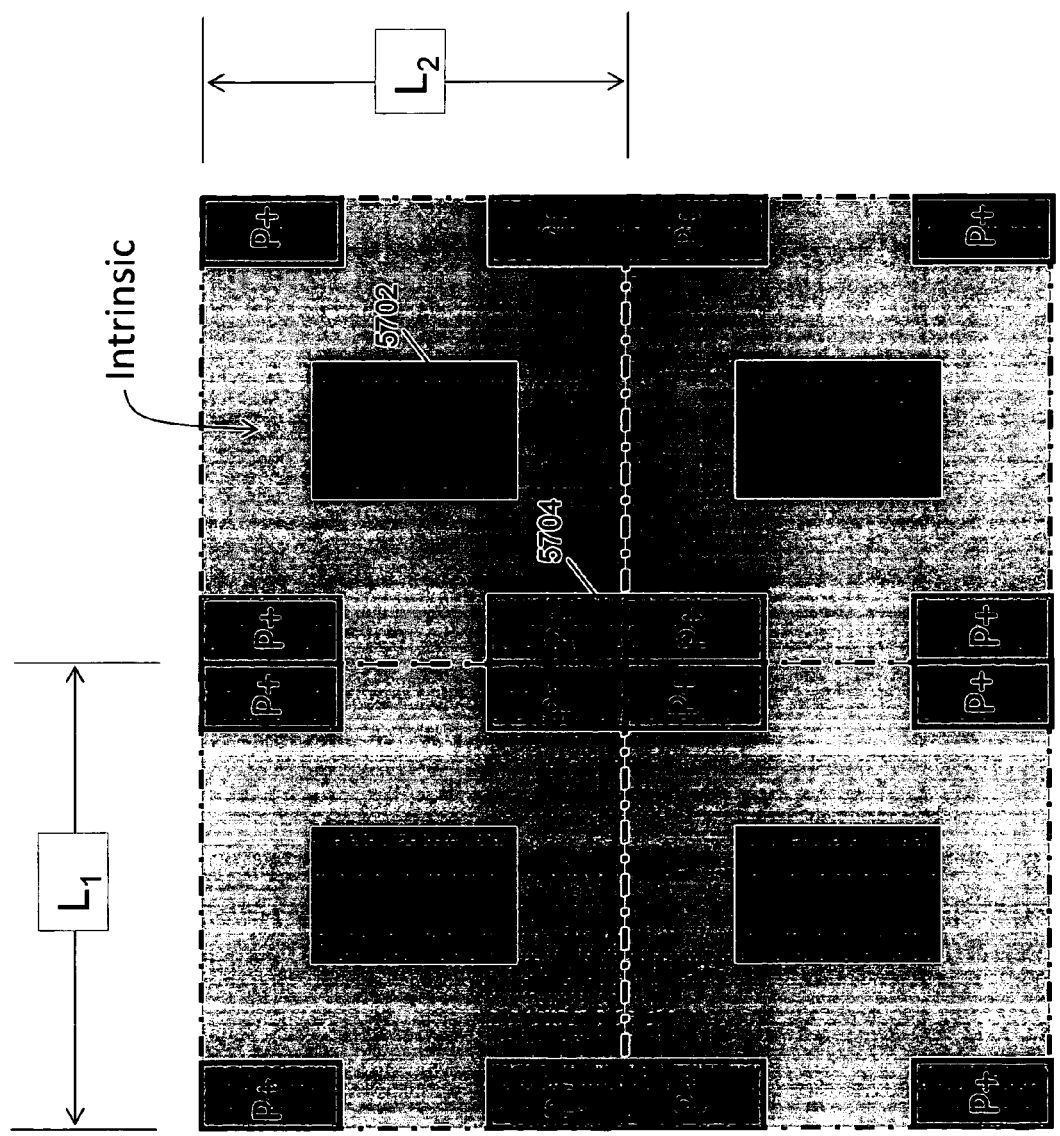
FIG. 43 is a plan view of a 2×2 array of a different form of unit cell, illustrating how a step-and-repeat application of the unit cell can be used to produce two-dimensional arrays of localised rectangular doped regions of opposite doping polarities.

Although the doped regions 5402, 5404 in the embodiment shown in FIGS. 40 to 42 are square, other shapes can be alternatively used. For example, the doped regions can be rectangular in shape, as shown in FIG. 43. In this embodiment, although the unit cell remains square (i.e., $L_1=L_2$), the doped regions 5702, 5704 are rectangular, with $DN_X<DN_Y$. As with the embodiment described above, $DN_X=2\times DP_X$ and $DN_Y=2\times DP_Y$, so that the n-type regions 5702 and the contiguous p-type regions 5704 formed by adjacent unit cells have the same dimensions.

Figure 44:
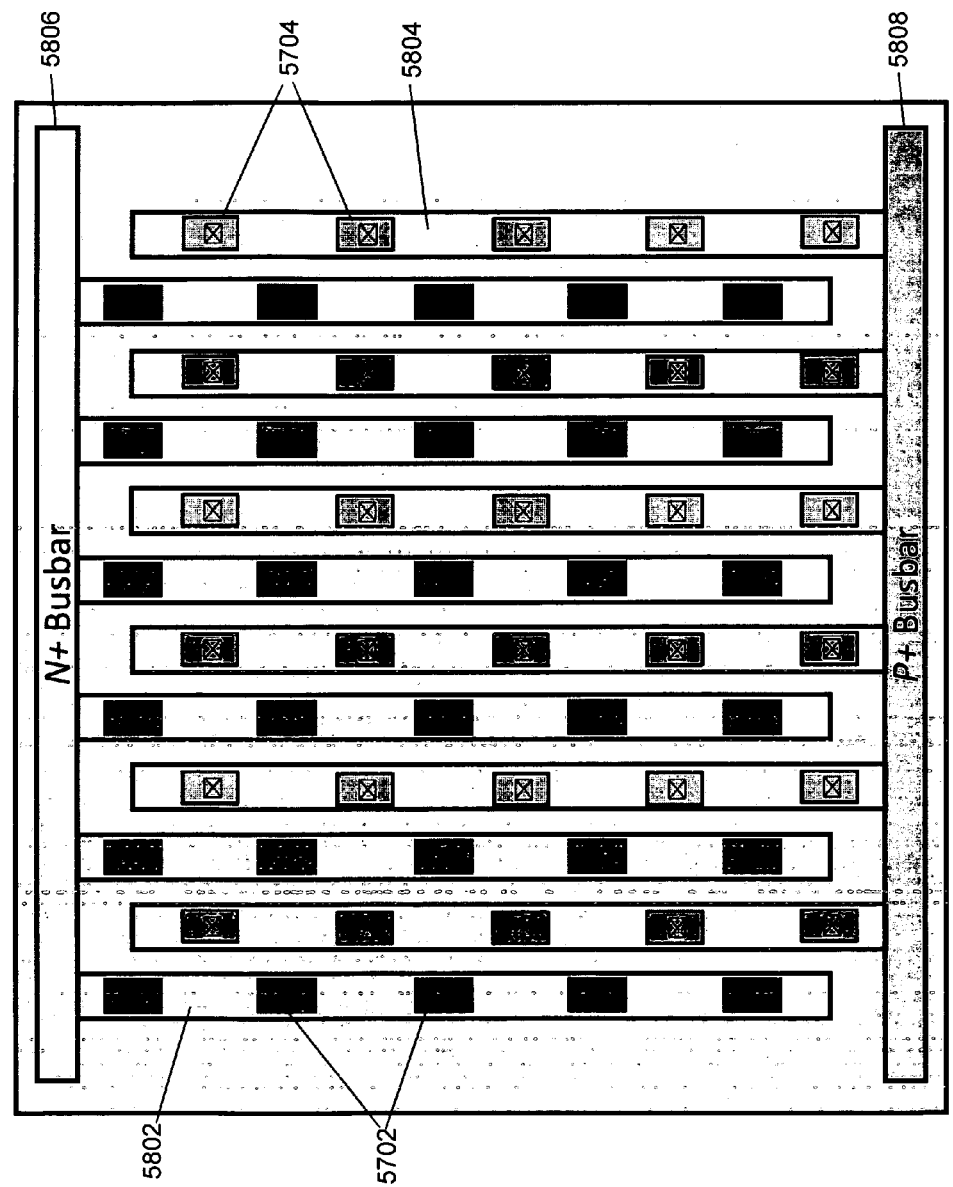
FIG. 44 is a plan view of an interdigitated contact structure used to provide electrical contacts to a larger array of the unit cell shown in FIG. 43, providing a larger contact area than the embodiment of FIG. 42.

As shown in FIG. 44, interdigitated contact structures formed by interleaved sets of parallel elongate contacts 5802, 5804 and corresponding busbars 5806, 5808 interconnect the resulting junctions to conduct away the photo-generated electrical current. The elongate contacts 5802, 5804 are aligned with the rectangular doped regions 5702, 5704 so that the longer dimension $DN_Y$ of each doped region 5702, 5704 is parallel to the longitudinal axis of the corresponding elongate contact 5802, 5804. Relative to the embodiment described above with square doped regions 5402, 5404, the increased contact area between the doped regions 5702, 5704 and the contacts 5602, 5604 reduces the resistance of each electrical contact and hence the overall series resistance of the device. By having the shorter dimension $DN_X$ of each doped region 5702, 5704 transverse to the longitudinal axes of the elongate contacts 5802, 5804, the elongate contacts 5802, 5804 can remain closely spaced.

Figure 45:
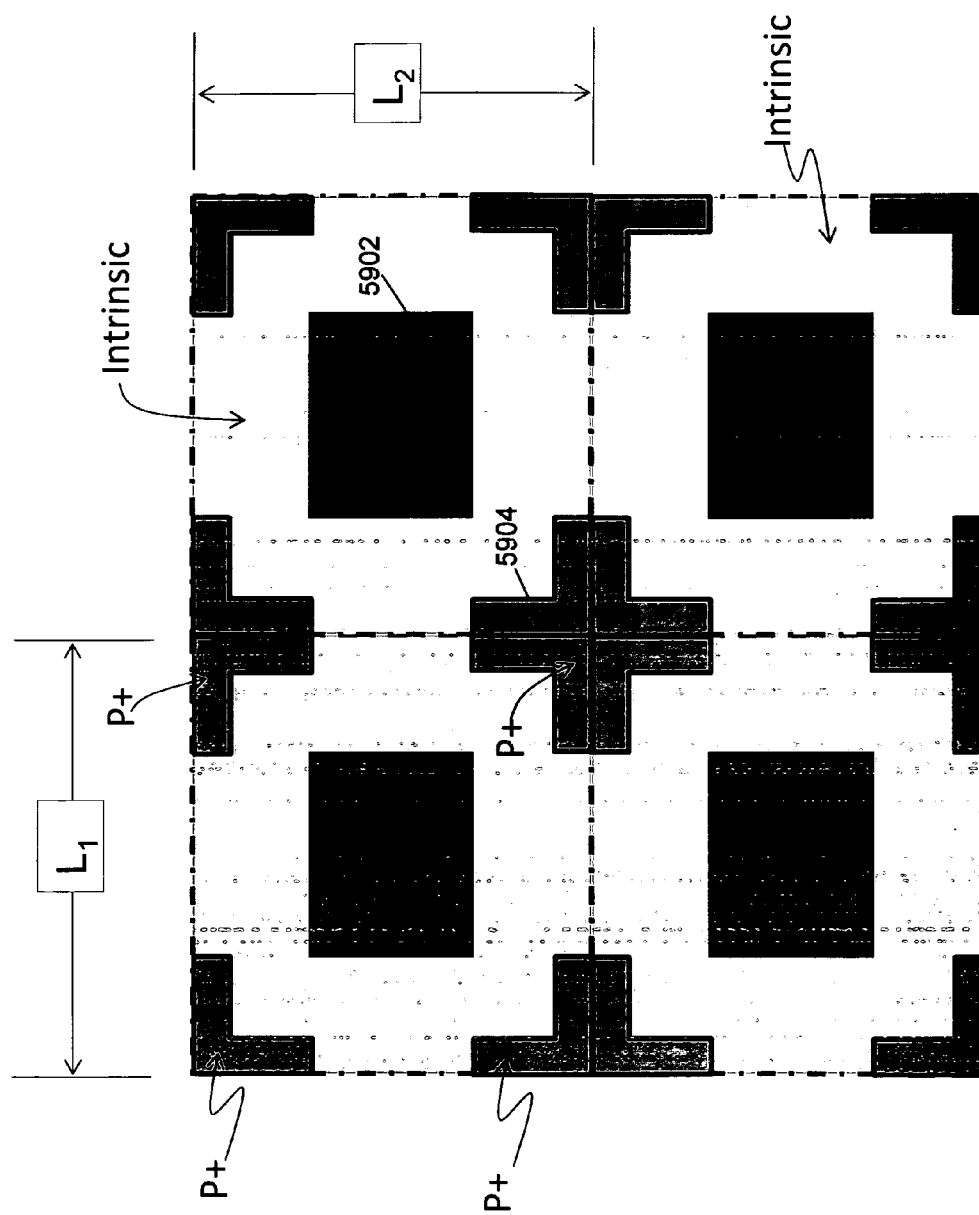
FIG. 45 is a plan view of a 2×2 array of yet another form of unit cell, illustrating how a step-and-repeat application of the unit cell can be used to produce two-dimensional arrays of localised rectangular and cross-shaped regions of opposite doping polarities.
Figure 46:
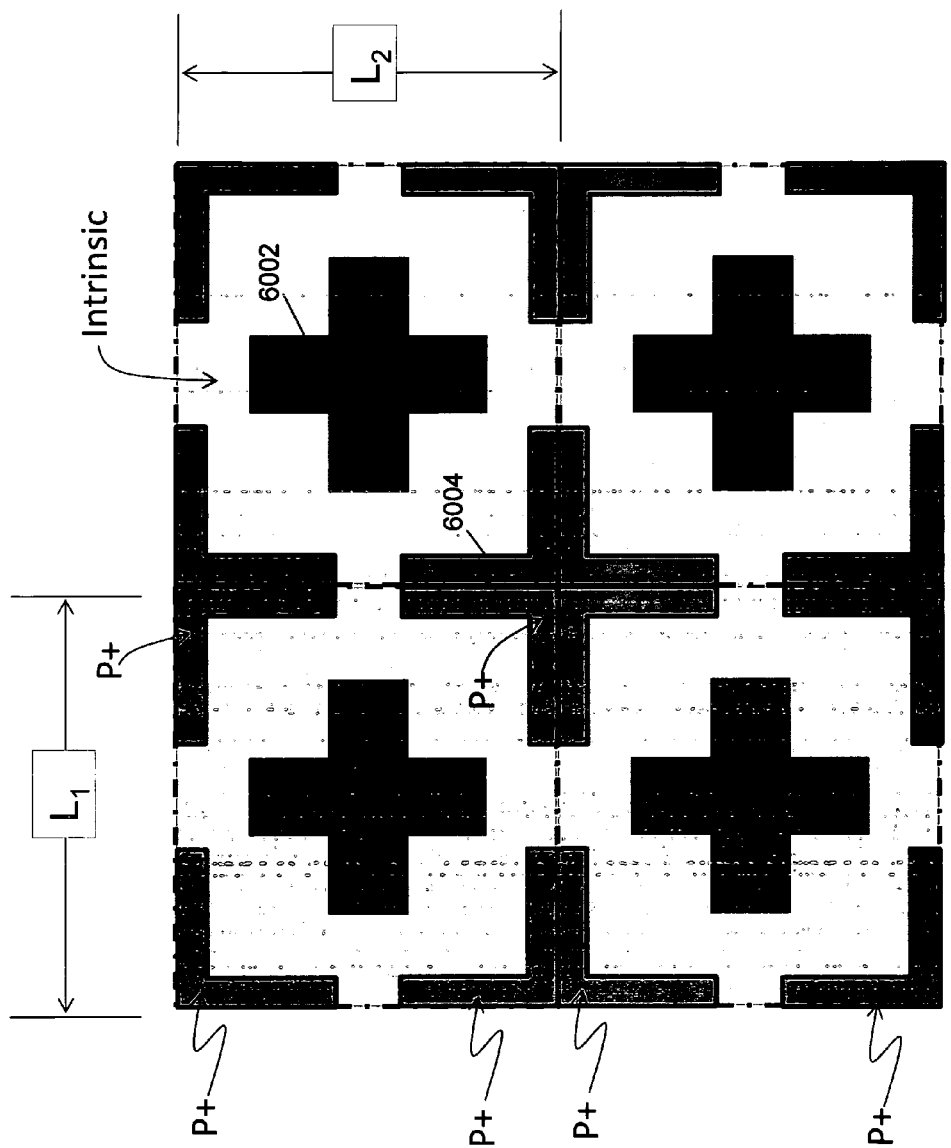
FIG. 46 is a plan view of a 2×2 array of still yet another form of unit cell, illustrating how a step-and-repeat application of the unit cell can be used to produce two-dimensional arrays of localised cross-shaped regions of opposite doping polarities.
Figure 47:
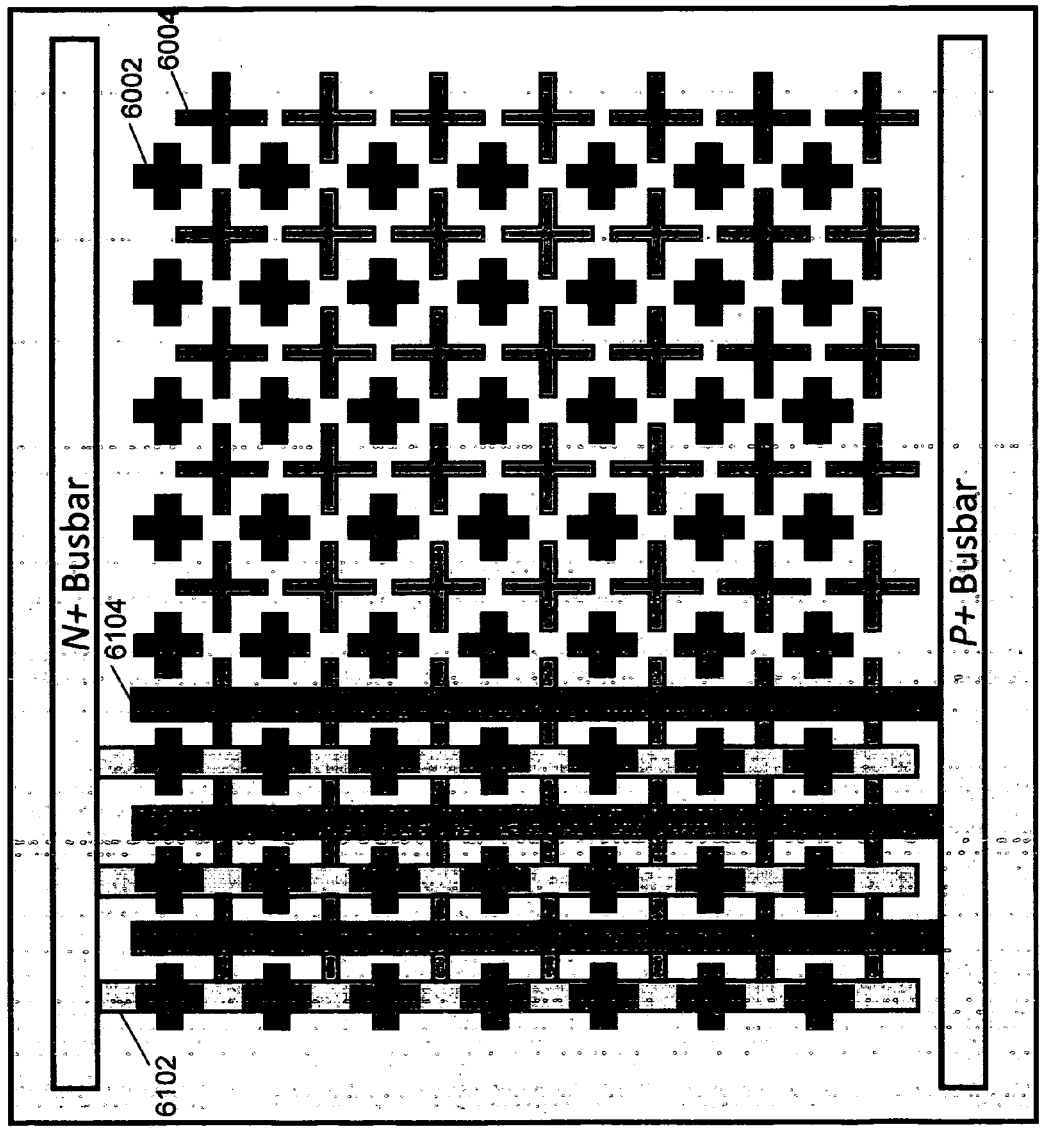
FIG. 47 is a plan view of an interdigitated contact structure used to provide electrical contacts to a larger array of the unit cell shown in FIG. 46.

Many other configurations are also possible in other embodiments. For example, FIG. 45 is a plan view of a 2×2 array of unit cells forming an overlay of a two-dimensional array of rectangular doped regions 5902 with a two-dimensional array of cross-shaped doped regions 5904 of opposite polarity. FIG. 46 is similar to FIG. 45, but for an embodiment in which all of the doped regions 6002, 6004 are cross-shaped, although the dimensions of the crosses may differ with doping polarity. Once again these and similar embodiments can be contacted using interdigitated contact structures of the same form as described above, as shown in FIG. 47, in which some of the interleaved parallel contacts 6102, 6104 have been omitted for the purposes of illustration.

The device structures and methods described herein are particularly well suited to concentrator photovoltaic applications with concentration ratios up to 1000×. They also operate as very high efficiency photodiodes or photodetectors, particularly at UV wavelengths. Two-dimensional arrays of the lateral device structures described herein can also be used as imaging sensors, such as those used by digital cameras.

Many modifications will be apparent to those skilled in the art without departing from the scope of the present invention.

The invention claimed is:

1. An optoelectronic device, including a semiconductor body having a surface to receive photons and a plurality of doped regions of opposite doping polarities, the doped regions extending substantially from the surface of the semiconductor body and into the semiconductor body, and being arranged in one or more pairs of opposite doping polarities such that each pair of doped regions forms a corresponding space charge region having a corresponding electric field therein and regions of relatively high resistivity are disposed between respective pairs of said doped regions, the space charge regions including the regions of relatively high resistivity and the high resistivity regions of the semiconductor body include regions of respective different phases of the semiconductor body having respective different bandgaps, the space charge region extending substantially from the surface of the semiconductor body and into the semiconductor body such that photons entering the semiconductor body through the surface and travelling along paths within the space charge region generate electron-hole pairs in the space charge region that are separated in opposing directions substantially orthogonal to the photon paths by the electric field and collected by the corresponding pair of doped regions, thereby providing an electrical current to be conducted from the device.

2. The device of claim 1, wherein each space charge region extends substantially from the surface of the semiconductor body such that electron-hole pairs created substantially at the surface of the semiconductor body by said photons are collected by the doped regions, thereby providing an electrical current to be conducted from the device.

3. The device of claim 1, wherein each space charge region extends deep into the semiconductor body such that a majority of electron-hole pairs generated in the semiconductor body by said photons are collected by the doped regions, thereby providing an electrical current to be conducted from the device.

4. The device of claim 1, wherein each space charge region extends through the semiconductor body so that substantially all of the electron-hole pairs generated in the semiconductor body by said photons are collected by the doped regions.

5. The device of claim 1, wherein the doped regions are arranged in a plurality of pairs of alternating doping polarities.

6. The device of claim 1, wherein each doped region has a lateral dimension parallel to a corresponding electric field of the doped region, the lateral dimension being such that minority carriers of electron-hole pairs generated anywhere in the doped region by photons can diffuse to a corresponding space charge region of the doped region to be collected and thereby contribute to the electrical current conducted from the device.

7. The device of claim 6, wherein the lateral dimension of each doped region is less than a diffusion length of the corresponding minority carrier.

8. The device of claim 7, wherein at least one lateral dimension of each doped region is such that a majority of the minority carriers of electron-hole pairs generated anywhere in the doped region by photons can diffuse to a corresponding space charge region of the doped region to be collected and thereby contribute to the electrical current to be conducted from the device.

9. The device of claim 6, wherein said doped regions are configured such that a majority of electron-hole pairs generated throughout the semiconductor body by photons can be collected and thereby provide an electrical current to be conducted from the device.

10. The device of claim 9, wherein said doped regions are configured such that substantially all of the electron-hole pairs generated throughout the semiconductor body by photons can be collected and thereby provide an electrical current to be conducted from the device.

11. The device of claim 1, wherein the electrical current is conducted from the doped regions through electrical contacts disposed on one or more surfaces of the semiconductor body other than the photon receiving surface.

12. The device of claim 1, including one or more optical components to redirect photons passing through the semiconductor body without being absorbed back into the semiconductor body to be absorbed therein.

13. The device of claim 12, wherein the one or more optical components include an electrically conductive interconnect configured to reflect and/or diffract photons passing through the semiconductor body back into the semiconductor body.

14. The device of claim 12, wherein the one or more optical components include at least three regions configured to reflect photons with respective phase differences.

15. The device of claim 12, wherein at least one of the one or more optically active components is configured to redirect photons passing through the semiconductor body back into the semiconductor body at an angle that provides a substantially longer path through the semiconductor body to thereby improve the likelihood of absorption therein.

16. The device of claim 1, wherein each space charge region is formed by substantially abutting p-type and n-type doped regions.

17. The device of claim 1, wherein regions having respective different bandgaps are arranged so that unabsorbed photons passing through one of the regions having a first bandgap enters another of the regions having a second bandgap to be absorbed therein.

18. The device of claim 1, wherein the semiconductor body is in the form of a thin film or wafer, the direction along which the doped regions extend into the semiconductor body being substantially orthogonal to the plane of the thin film or wafer.

19. The device of claim 18, wherein the semiconductor body is in the form of a thin film attached to an optically transparent and electrically insulating substrate and configured so that the photons pass through the substrate to enter the thin film through the photon receiving surface.

20. The device of claim 19, wherein the substrate is a sapphire substrate.

21. The device of claim 20, wherein the semiconductor body is a silicon layer epitaxially grown on the sapphire substrate and having a defective region extending from the interface between the silicon layer and the sapphire substrate due to lattice mismatch between the silicon and the sapphire, the silicon layer including a conductive layer beneath the regions in which the space charge regions are formed.

22. The device of claim 1, wherein the doped regions are formed as interdigitated fingers with regions of relatively high resistivity disposed between the doped fingers to provide the space charge regions.

23. The device of claim 1, wherein the doped regions are localised in plan view at the nodes of two two-dimensional arrays offset relative to one another so that the localised doped regions of one polarity can be contacted with a first set of linear parallel contacts and the localised doped regions of the opposite polarity can be contacted with a second set of linear parallel contacts, wherein the contacts of the first set are interleaved between the contacts of the second set.

24. The device of claim 1, wherein the doped regions are arranged in plan view as a two-dimensional array of mutually spaced doped regions of opposite doping polarities, wherein the doped regions of the array along each row or column of the array are of a corresponding doping polarity, consecutive rows or columns of the array are of alternating doping polarities, and the doped regions of the array along each diagonal of the array are of alternating doping polarities.

25. The device of claim 1, including a contact structure including interdigitated elongate contacts providing electrical contacts to the doped regions, the elongate interdigitated contacts including a first set of interconnected parallel elongate contacts providing electrical contacts to the doped regions of a first doping polarity, and a second set of interconnected parallel elongate contacts providing electrical contacts to the doped regions of a second doping polarity.

26. The device of claim 1, wherein each of the doped regions of at least one of the doping polarities is substantially rectangular in plan view, the longitudinal axis of each rectangular doped region being parallel with the longitudinal axis of a corresponding elongate electrical contact connected to the rectangular doped region to provide a larger contact area and thereby a lower series resistance, whilst allowing close spacing of the parallel elongate contacts.

27. The device of claim 1, wherein the semiconductor is silicon.

28. The device of claim 1, wherein the device is a photodiode or photovoltaic device.

29. An optoelectronic device manufacturing process, including:
forming a plurality of doped regions of opposite doping polarities in a semiconductor body, the doped regions extending substantially from a surface of the semiconductor body and into the semiconductor body, and being arranged in one or more pairs of opposite doping polarities such that each pair of doped regions forms a corresponding space charge region having a corresponding electric field therein, the space charge region extending substantially from the surface of the semiconductor body and into the semiconductor body such that photons entering the semiconductor body through the surface and travelling along paths within the space charge region generate electron-hole pairs in the space charge region that are separated in opposing directions substantially orthogonal to the photon paths by the electric field and collected by the corresponding pair of doped regions, thereby providing an electrical current to be conducted from the device, epitaxially growing the semiconductor body as a layer of single-crystal semiconductor on a single-crystal optically transparent substrate, the epitaxial growth producing structural defects in a region near the interface between the substrate and the semiconductor layer, the structural defects being of a type that would degrade the performance of optoelectronic devices formed in the semiconductor layer; and implanting ions into the semiconductor layer to modify a buried portion of the semiconductor layer into a buried conductive layer above or including the region containing the structural defects to substantially isolate the structural defects from the space charge regions formed above the modified portion.

30. The process of claim 29, including:
cleaning a single-crystal optically transparent substrate;
epitaxially growing the semiconductor body as a layer of semiconductor on the single-crystal optically transparent substrate to form a thin film of substantially single-crystal semiconductor;
processing the grown layer of semiconductor to reduce the defect density near the interface between the semiconductor and the single-crystal optically transparent substrate; and
forming one or more optoelectronic devices in the thin film of substantially single-crystal semiconductor.

31. The process of claim 30, wherein the processing includes cleaning the single-crystal optically transparent substrate prior to the epitaxial growth by exposing the sapphire to an oxygen plasma.

* * * * *